US011844224B2

United States Patent
Chien et al.

(10) Patent No.: US 11,844,224 B2
(45) Date of Patent: Dec. 12, 2023

(54) MEMORY STRUCTURE AND METHOD OF FORMING THE SAME

(71) Applicant: Taiwan Semiconductor Manufacturing Company, Ltd., Hsinchu (TW)

(72) Inventors: Shih-Hsuan Chien, Hsinchu (TW); Meng-Han Lin, Hsinchu (TW); Han-Wei Wu, Tainan (TW); Feng-Cheng Yang, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 144 days.

(21) Appl. No.: 17/241,035

(22) Filed: Apr. 26, 2021

(65) Prior Publication Data

US 2022/0223622 A1 Jul. 14, 2022

Related U.S. Application Data

(60) Provisional application No. 63/136,646, filed on Jan. 13, 2021.

(51) Int. Cl.
*H10B 51/20* (2023.01)
*H01L 23/528* (2006.01)
(Continued)

(52) U.S. Cl.
CPC .......... *H10B 51/20* (2023.02); *G11C 11/2255* (2013.01); *G11C 11/2257* (2013.01);
(Continued)

(58) Field of Classification Search
CPC ........ H10B 51/10; H10B 51/20; H10B 51/30; G11C 11/2255; G11C 11/2257; H01L 23/5226; H01L 23/5283
See application file for complete search history.

(56) References Cited

U.S. PATENT DOCUMENTS 10,734,400 B1 * 8/2020 Fukuo et al. ..... H01L 27/11575
11,069,410 B1 * 7/2021 Cui ........................ G11C 11/005
(Continued)

FOREIGN PATENT DOCUMENTS

CN 109314116 B * 10/2019 ....... H01L 21/76802
CN 115136309 A * 9/2022 ......... G11C 16/0483

*Primary Examiner* — Matthew E Warren
(74) *Attorney, Agent, or Firm* — JCIPRNET

(57) ABSTRACT

A method of forming a memory structure includes the following steps. A CMOS circuitry is formed over a semiconductor substrate. A bit line array is formed to be electrically connected to the CMOS circuitry. A memory array is formed over the bit line array. The memory array is formed by forming a word line stack, and forming first and second sets of stacked memory cells. The word line stack is formed on the bit line array and has a first side surface and a second side surface. The first sets of stacked memory cells are formed along the first side surface. The second sets of stacked memory cells are formed along the second side surface, wherein the second sets of stacked memory cells are staggered from the first sets of stacked memory cells. A source line array is formed over the memory array and electrically connected to the CMOS circuitry.

20 Claims, 64 Drawing Sheets

(51) Int. Cl.
  *G11C 11/22* (2006.01)
  *H01L 23/522* (2006.01)
  *H10B 51/10* (2023.01)

(52) U.S. Cl.
  CPC ...... *H01L 23/5226* (2013.01); *H01L 23/5283* (2013.01); *H10B 51/10* (2023.02)

(56) References Cited

U.S. PATENT DOCUMENTS

| | | | |
|---|---|---|---|
| 2019/0273090 A1* | 9/2019 | Fukuzumi | H01L 25/18 |
| 2021/0398897 A1* | 12/2021 | Parekh | H01L 23/5226 |
| 2022/0157719 A1* | 5/2022 | Luo | H01L 21/31144 |
| 2022/0216094 A1* | 7/2022 | Clampitt | H01L 21/76805 |
| 2022/0216224 A1* | 7/2022 | Luo | H10B 43/27 |

* cited by examiner

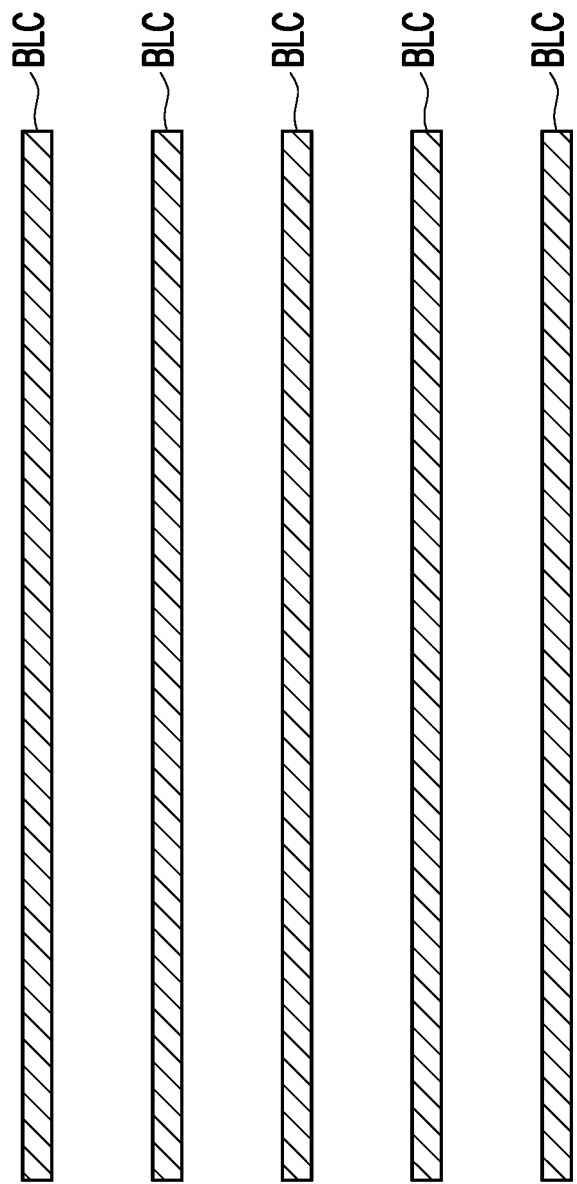

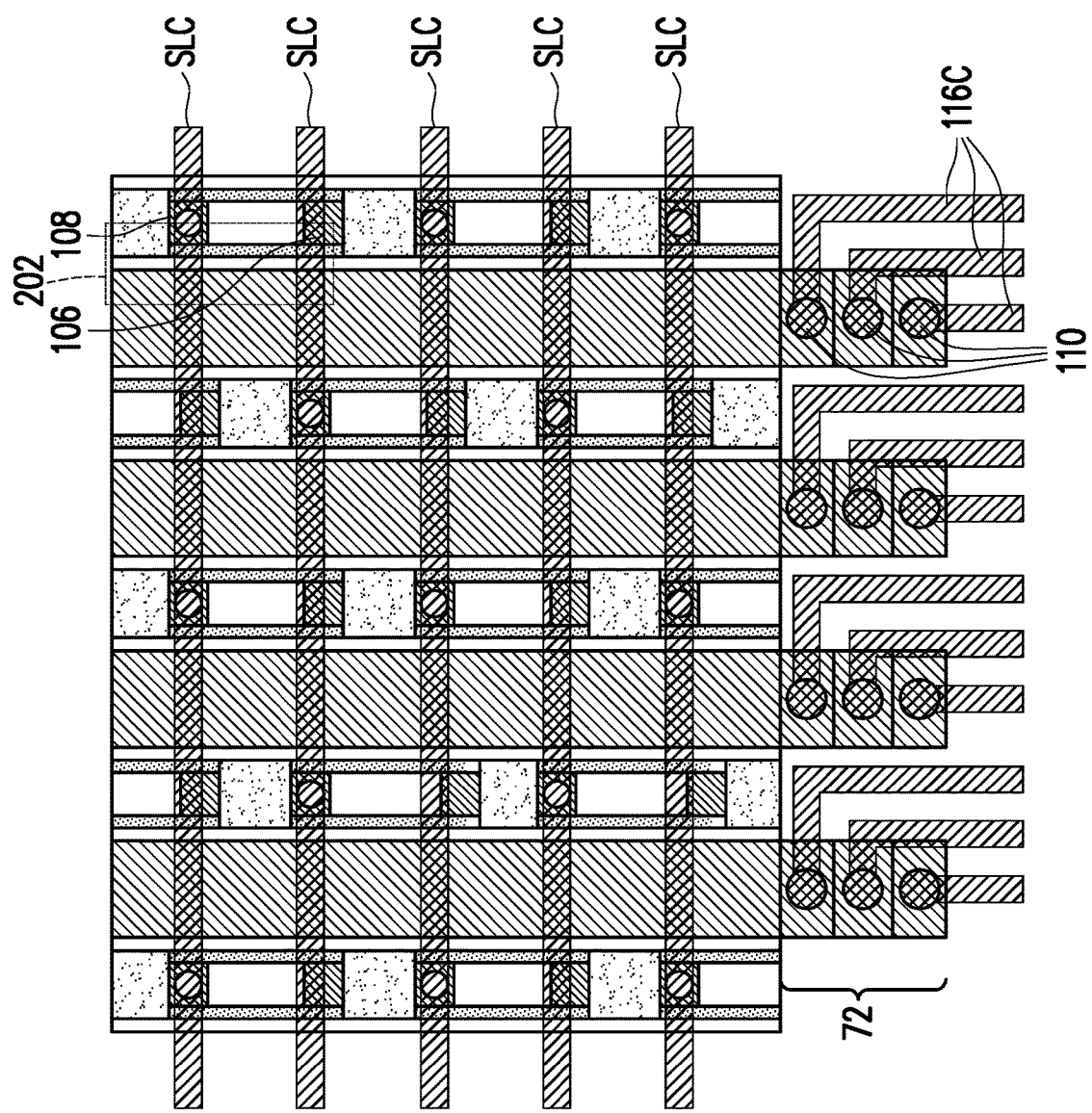

MEMORY STRUCTURE AND METHOD OF FORMING THE SAME

CROSS-REFERENCE TO RELATED APPLICATION

This application claims the priority benefit of U.S. provisional application Ser. No. 63/136,646, filed on Jan. 13, 2021. The entirety of the above-mentioned patent application is hereby incorporated by reference herein and made a part of this specification.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography and etching techniques to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
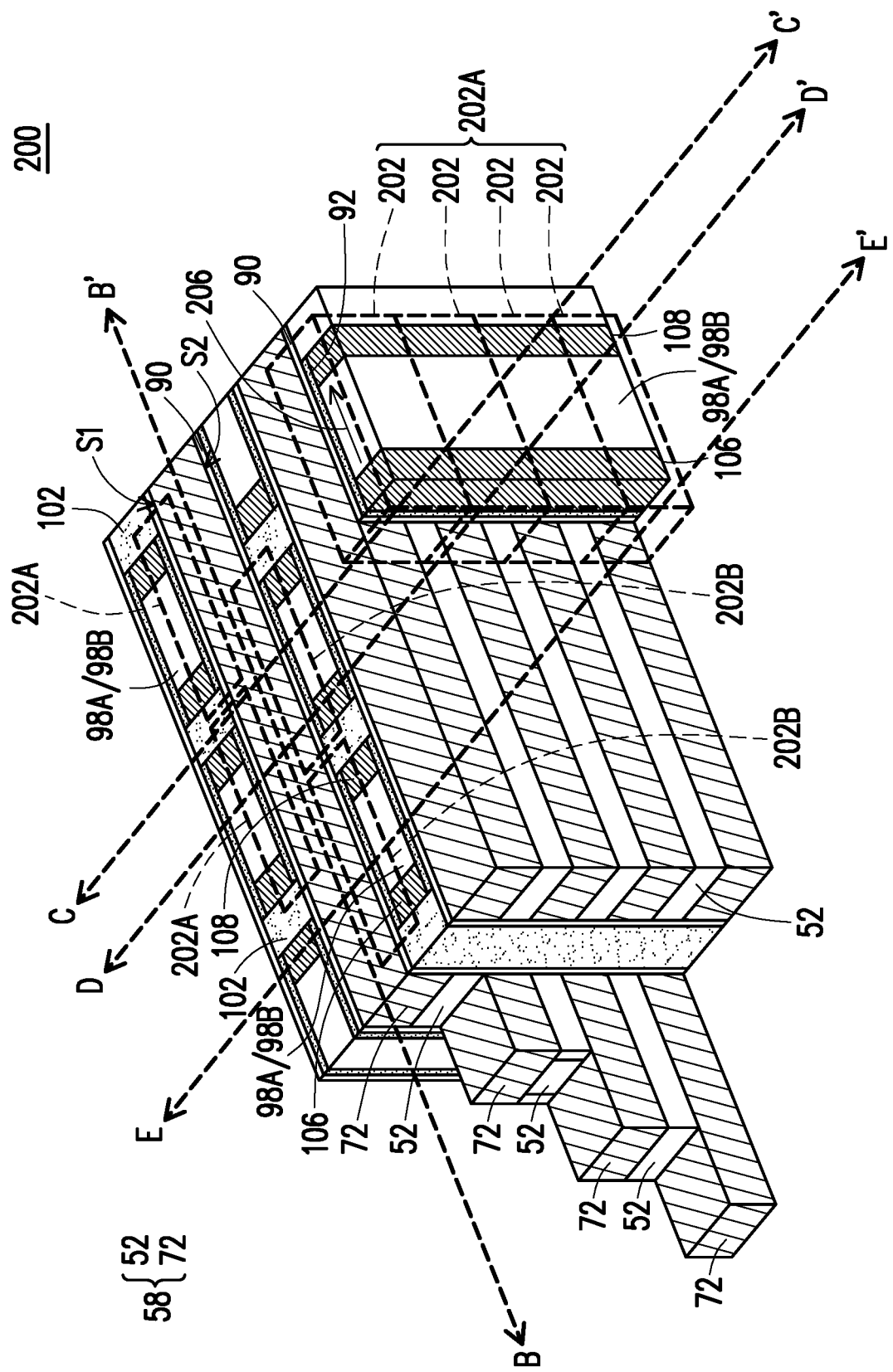
FIG. 1A to FIG. 1C illustrate a simplified perspective view, a circuit diagram, and a top down view of a memory structure in accordance with some embodiments of the disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a semiconductor structure such as a 3D memory structure. In some embodiments, the 3D memory structure is a field effect transistor (FET) memory circuit including a plurality of vertically stacked memory cells. In some embodiments, each memory cell of the 3D memory structure is regarded as a FET that includes a word line region acting as a gate electrode, a bit line region acting as a first source/drain electrode, and a source line region acting as a second source/drain electrode, a gate dielectric, and an oxide semiconductor (OS) as a channel region. In some embodiments, each memory cell is regarded as a thin film transistor (TFT).

Conventionally, a plurality of pairs of source and drain regions of TFT in one column is aligned with another plurality of pairs of source and drain regions of TFT in an adjacent column in the active array of the 3D memory structure. With such aligned (or non-staggered) layout, the source line array and the bit line array connected above are usually formed with a plurality of metal layers, whereby its fabrication would involve complicated process flows and extra photomasks. In some embodiments of the present disclosure, the arrangement of memory cells in the active array and the routing/connections of the source line array and the bit line array are adjusted to simplify the process flow, and to reduce fabrication costs.

Figure 1B:
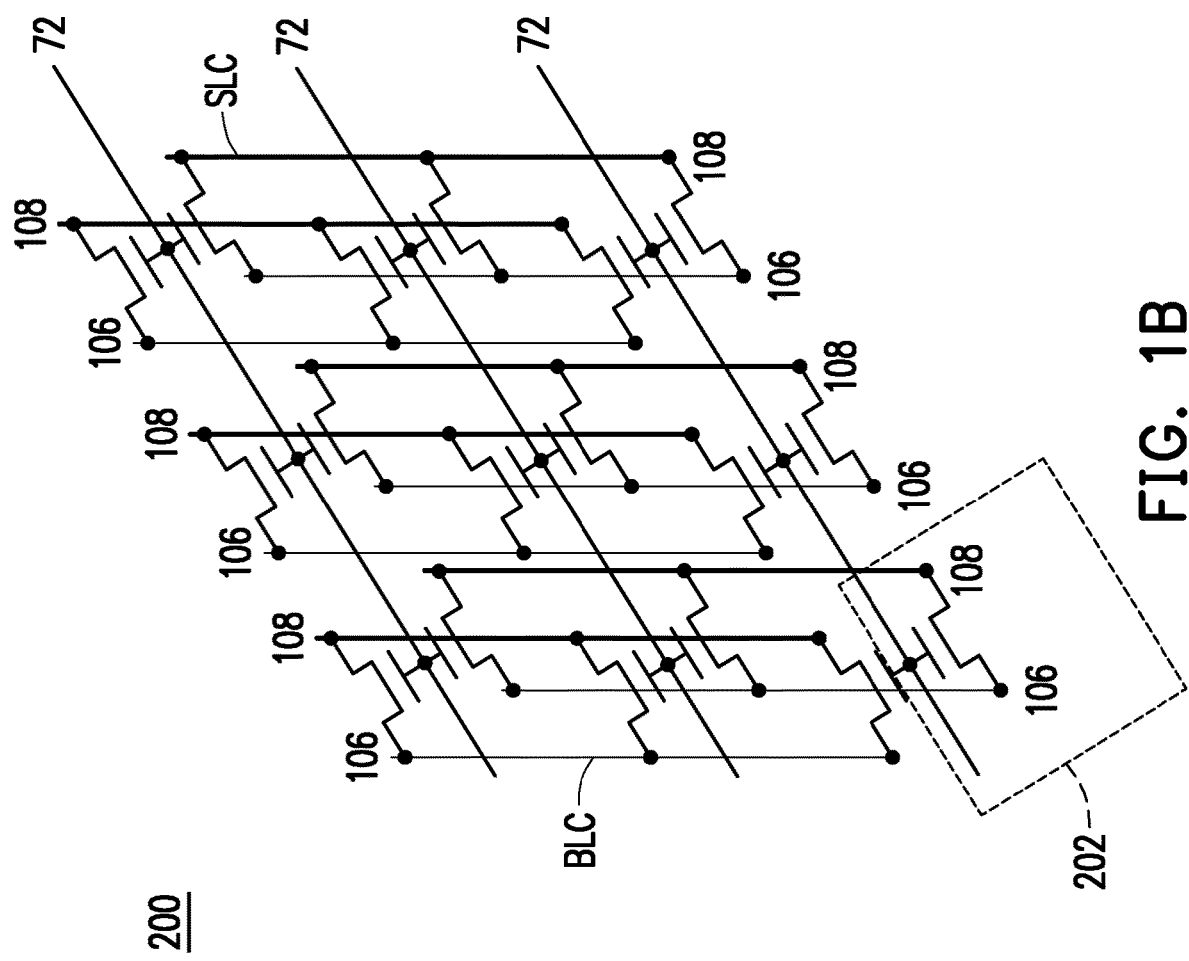
Figure 1C:
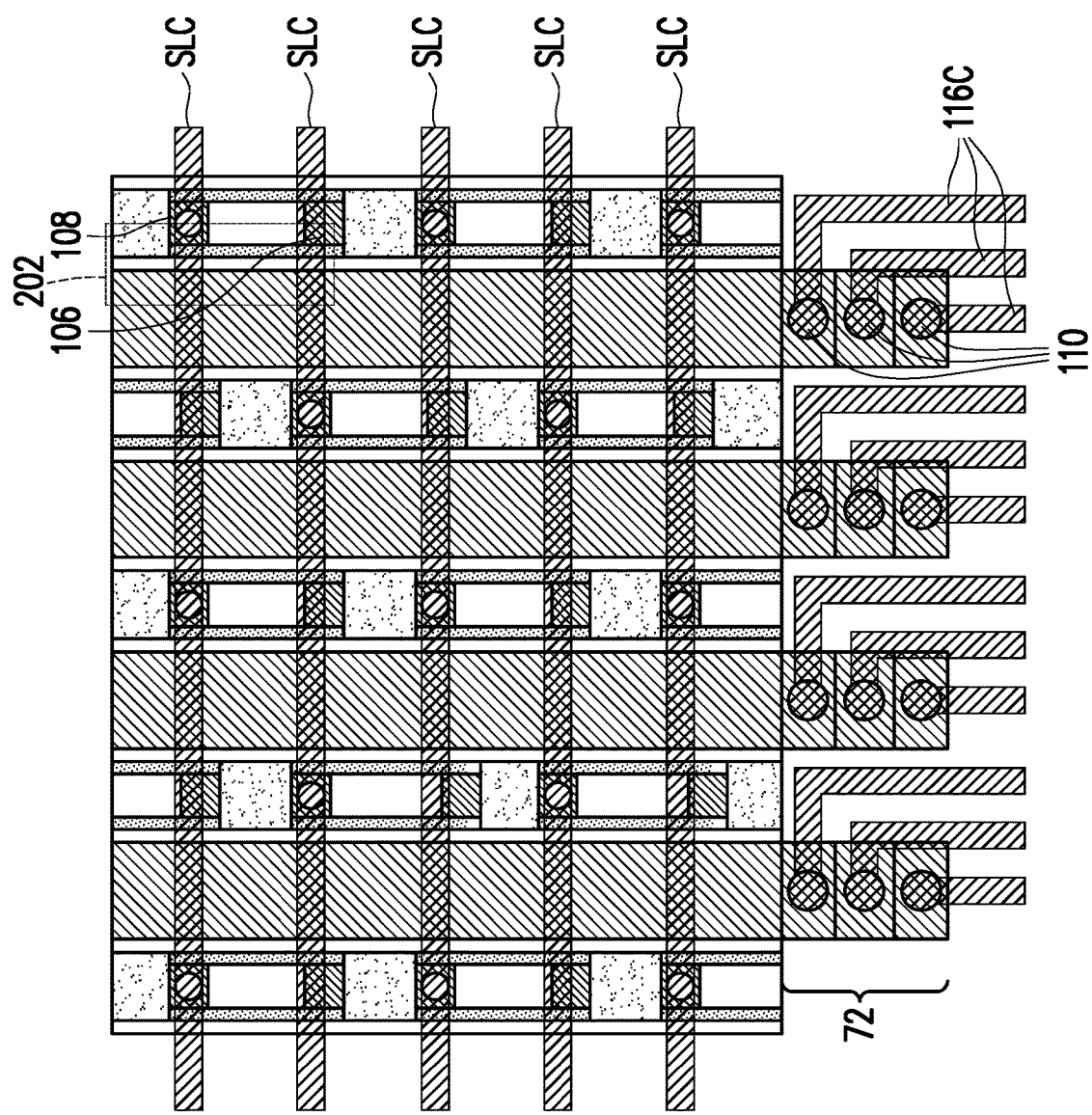

FIGS. 1A, 1B, and 1C illustrate examples of a memory structure (or memory array) according to some embodiments of the present disclosure. FIG. 1A illustrates an example of a portion of a simplified memory structure 200 in a partial three-dimensional view; FIG. 1B illustrates a circuit diagram of the memory structure 200; and FIG. 1C illustrates a top down view of the memory structure 200 in accordance with some embodiments. The memory structure 200 includes a plurality of memory cells 202, which may be arranged in a grid of rows and columns. The memory cells 202 may be further stacked vertically to provide a three-dimensional memory device, thereby increasing device density. For example, in some embodiments, the memory cells 202 are vertically stacked to form first sets of stacked memory cells 202A arranged in one column, and are vertically stacked to form second sets of stacked memory cells 202B arranged in another column. The first sets of stacked memory cells 202A and second sets of stacked memory cells 202B are arranged to be staggered from one another. Furthermore, the memory structure 200 may be disposed in the back end of line (BEOL) of a semiconductor die. For example, the memory device may be disposed in the interconnect layers of the semiconductor die, such as, above one or more active devices (e.g., transistors) formed on a semiconductor substrate.

Referring to FIGS. 1A to 1C, in some embodiments, the memory structure 200 is a flash memory device, such as a NOR flash memory device, or the like. In some other embodiments, the memory structure 200 is another type of non-volatile memory array, such as a magnetoresistive random-access memory (MRAM) array, a resistive random-access memory (RRAM) array, or the like. In some embodiments, a gate of each memory cell 202 is electrically coupled to a respective word line (e.g., conductive line 72 (or conductive layer)), a first source/drain region of each memory cell 202 is electrically coupled to a respective bit line (e.g., bit line conductive layer BLC), and a second source/drain region of each memory cell 202 is electrically coupled to a respective source line (e.g., source line conductive layer SLC), which electrically couples the second source/drain region to ground. The memory cells 202 in a same horizontal row of the memory structure 200 may share a common word line while the memory cells 202 in a same vertical column of the memory structure 200 may share a common source line and a common bit line.

The memory structure 200 includes a plurality of vertically stacked conductive lines 72 (e.g., word lines) with dielectric layers 52 disposed between adjacent ones of the conductive lines 72. The conductive lines 72 extend in a direction parallel to a major surface of an underlying substrate (not explicitly illustrated in FIGS. 1A and 1B). The alternately stacked conductive lines 72 (word line) and dielectric layers 52 may constitute a word line stack 58 of the memory structure. In some embodiments, the conductive lines 72 have a staircase configuration such that lower conductive lines 72 are longer than and extend laterally past endpoints of upper conductive lines 72. For example, in FIG. 1A, multiple, stacked layers of conductive lines 72 are illustrated with topmost conductive lines 72 being the shortest and bottommost conductive lines 72 being the longest. Respective lengths of the conductive lines 72 may increase in a direction towards the underlying substrate. In this manner, a portion of each of the conductive lines 72 may be accessible from above the memory structure 200, and conductive contacts may be made to exposed portions of the conductive lines 72, respectively.

The memory structure 200 further includes conductive pillars 106 (first semiconductor regions) electrically connected to bit lines, and conductive pillars 108 (second semiconductor regions) electrically connected to source lines, whereby the conductive pillars 106 and 108 are arranged alternately in the same column. The conductive pillars 106 and 108 (or electrode layers) may each extend in a direction perpendicular to the conductive lines 72. A dielectric material 98A/98B is disposed between and isolates adjacent ones of the conductive pillars 106 and the conductive pillars 108. Pairs of the conductive pillars 106 and 108 along with an intersecting conductive line 72 define boundaries of each memory cell 202, and an isolation pillar 102 is disposed between and isolates adjacent pairs of the conductive pillars 106 and 108. In some embodiments, the conductive pillars 108 are electrically coupled to ground.

The memory structure 200 may also include an oxide semiconductor (OS) material as a channel material layer 92. The channel material layer 92 (or oxide semiconductor layer) may provide channel regions for the memory cells 202. For example, when an appropriate voltage (e.g., higher than a respective threshold voltage (Vth) of a corresponding memory cell 202) is applied through a corresponding conductive line 72, a region of the channel material layer 92 that intersects the conductive line 72 may allow current to flow from the conductive pillars 106 to the conductive pillars 108 (e.g., in the direction indicated by arrow 206).

In some embodiments, a dielectric layer 90 (or ferroelectric layer 90) is disposed between the channel material layer 92 and each of the conductive lines 72 and the dielectric layers 52, and the dielectric layer 90 may serve as a gate dielectric for each memory cell 202. In some embodiments, the dielectric layer 90 includes a ferroelectric material, such as a hafnium oxide, hafnium zirconium oxide, silicon-doped hafnium oxide, or the like. In some embodiments, the dielectric layer 90 includes a layer of SiNx between two SiOx layers (e.g., an ONO structure).

In some embodiments, when the dielectric layer 90 includes a ferroelectric material, the dielectric layer 90 may be polarized in one of two different directions, and the polarization direction may be changed by applying an appropriate voltage differential across the dielectric layer 90 and generating an appropriate electric field. The polarization may be relatively localized (e.g., generally contained within each boundaries of the memory cells 202), and a continuous region of the dielectric layer 90 may extend across a plurality of memory cells 202. Depending on a polarization direction of a particular region of the dielectric layer 90 (or ferroelectric layer 90), a threshold voltage of a corresponding memory cell 202 varies, and a digital value (e.g., 0 or 1) can be stored. For example, when a region of the dielectric layer 90 (or ferroelectric layer 90) has a first electrical polarization direction, the corresponding memory cell 202 may have a relatively low threshold voltage, and when the region of the dielectric layer 90 has a second electrical polarization direction, the corresponding memory cell 202 may have a relatively high threshold voltage. The difference between the two threshold voltages may be referred to as the threshold voltage shift. A larger threshold voltage shift makes it easier (e.g., less error prone) to read the digital value stored in the corresponding memory cell 202.

To perform a write operation on a memory cell 202, a write voltage is applied across a portion of the dielectric layer 90 (or ferroelectric layer 90) corresponding to the memory cell 202. In some embodiments, the write voltage is applied, for example, by applying appropriate voltages to a corresponding conductive line 72 (e.g., the word line) and the corresponding conductive pillars 106/108 (e.g., the first semiconductor region/the second semiconductor region). By applying the write voltage across the portion of the dielectric layer 90, a polarization direction of the region of the dielectric layer 90 can be changed. As a result, the corresponding threshold voltage of the corresponding memory cell 202 can also be switched from a low threshold voltage to a high threshold voltage or vice versa, and a digital value can be stored in the memory cell 202. Because the conductive lines 72 intersect the conductive pillars 106 and 108, individual memory cells 202 may be selected for the write operation.

To perform a read operation on the memory cell 202 in such embodiments, a read voltage (a voltage between the low and high threshold voltages) is applied to the corresponding conductive line 72 (e.g., the world line). Depending on the polarization direction of the corresponding region of the dielectric layer 90 (or ferroelectric layer 90), the memory cell 202 may or may not be turned on. As a result, the conductive pillar 106 may or may not be discharged through the conductive pillar 108 (e.g., a source line that is coupled to ground), and the digital value stored in the memory cell 202 can be determined. As the conductive lines 72 intersect the conductive pillars 106 and 108, individual memory cells 202 may be selected for the read operation.

FIG. 1A further illustrates reference cross-sections of the memory structure 200 that are used in later figures. Cross-section B-B' is along a longitudinal axis of conductive lines 72 and in a direction, for example, parallel to the direction of current flow of the memory cells 202. Cross-section C-C' is perpendicular to cross-section B-B' and extends through the dielectric materials 98A/98B and the isolation pillars 102. Cross-section D-D' is perpendicular to cross-section B-B' and extends through the dielectric materials 98A/98B and the conductive pillars 106. Cross-section E-E' is perpendicular to cross-section B-B' and extends through the dielectric materials 98A/98B and the conductive pillars 108. Subsequent figures refer to these reference cross-sections for clarity.

Figure 2:
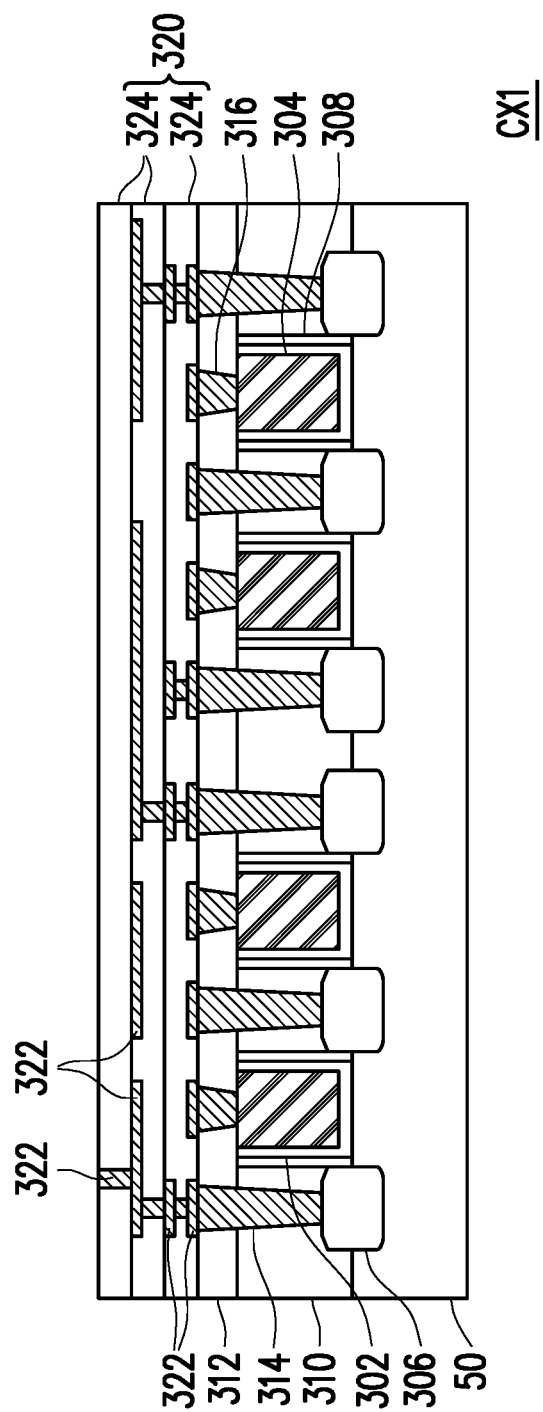
FIG. 2 to FIG. 40 illustrate various views of intermediate stages of manufacturing a memory structure in accordance with some embodiments of the disclosure.

FIG. 2 to FIG. 40 illustrate various views of intermediate stages of manufacturing a memory structure in accordance with some embodiments of the disclosure. Referring to FIG. 2, the fabrication of a CMOS (complementary metal oxide semiconductor) circuitry CX1 is described. As illustrated in FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be an integrated circuit die, such as a logic die, a memory die, an ASIC die, or the like. The substrate 50 may be a complementary metal oxide semiconductor (CMOS) die and may be referred to as a CMOS under array (CUA). The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

FIG. 2 further illustrates circuits (part of the CMOS circuitry CX1) that may be formed over the substrate 50. The circuits include transistors at a top surface of the substrate 50. The transistors may include gate dielectric layers 302 over top surfaces of the substrate 50 and gate electrodes 304 over the gate dielectric layers 302. Source/drain regions 306 are disposed in the substrate 50 on opposite sides of the gate dielectric layers 302 and the gate electrodes 304. Gate spacers 308 are formed along sidewalls of the gate dielectric layers 302 and separate the source/drain regions 306 from the gate electrodes 304 by appropriate lateral distances. The transistors may include fin field effect transistors (FinFETs), nanostructure (e.g., nanosheet, nanowire, gate-all-around, or the like) FETS (nano-FETs), planar FETs, the like, or combinations thereof, and may be formed by gate-first processes or gate-last processes.

A first inter-layer dielectric (ILD) 310 surrounds and isolates the source/drain regions 306, the gate dielectric layers 302, and the gate electrodes 304 and a second ILD 312 is located over the first ILD 310. Source/drain contacts 314 extend through the second ILD 312 and the first ILD 310 and are electrically coupled to the source/drain regions 306. Gate contacts 316 extend through the second ILD 312 and are electrically coupled to the gate electrodes 304. An interconnect structure 320 is formed over the second ILD 312, the source/drain contacts 314, and the gate contacts 316. The interconnect structure 320 includes one or more stacked dielectric layers 324 and conductive features 322 formed in the one or more dielectric layers 324, for example. The interconnect structure 320 may be electrically connected to the gate contacts 316 and the source/drain contacts 314 to form functional circuits. In some embodiments, the functional circuits formed by the interconnect structure 320 may include logic circuits, memory circuits, sense amplifiers, controllers, input/output circuits, image sensor circuits, the like, or combinations thereof. Although FIG. 2 discusses transistors formed over the substrate 50, other active devices (e.g., diodes or the like) and/or passive devices (e.g., capacitors, resistors, or the like) may also be formed as part of the functional circuits.

Figure 3A:
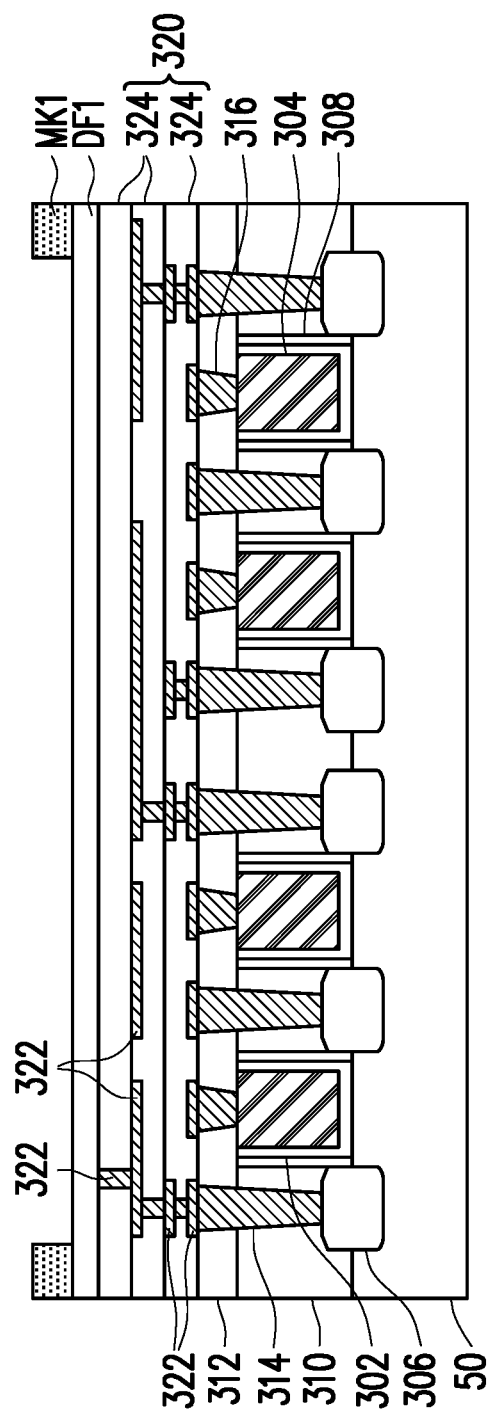
Figure 3B:
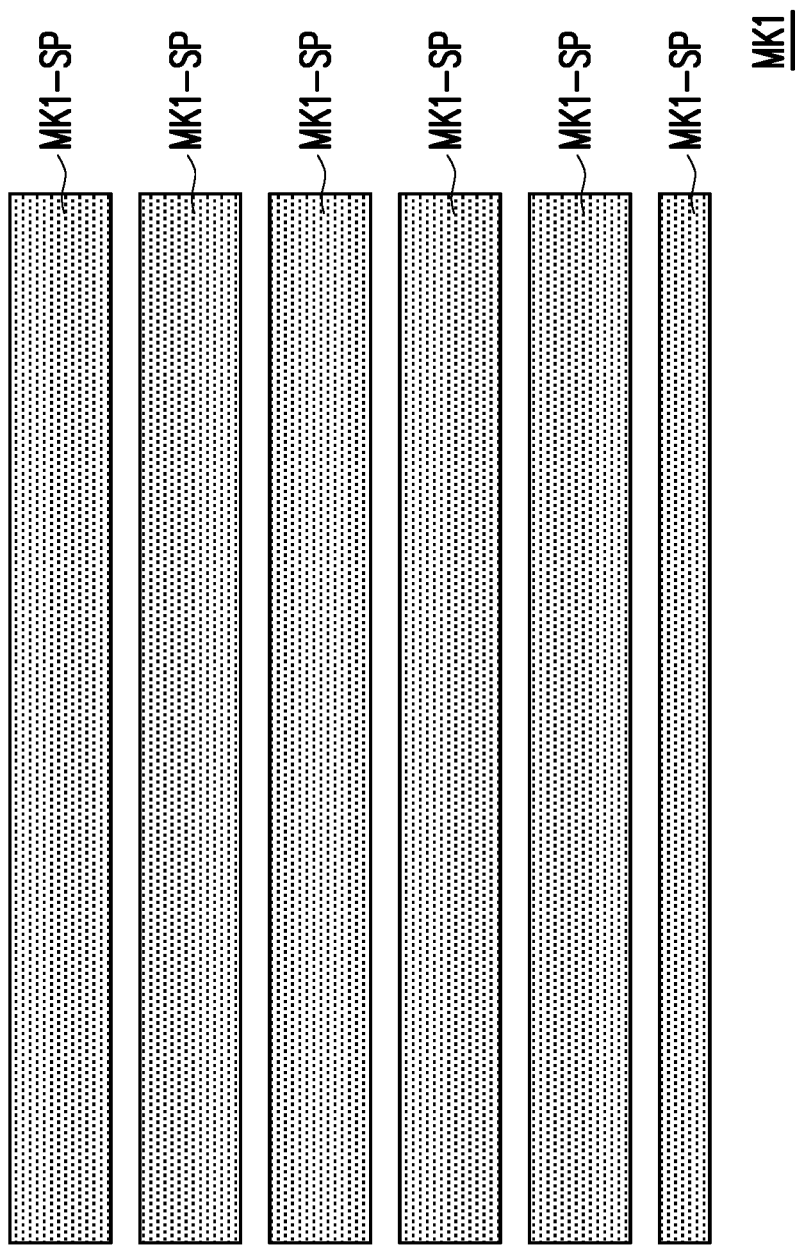

Referring to FIG. 3A to FIG. 8B, the fabrication processes of a bit line array AX1 (illustrated in FIG. 8A) over the CMOS circuitry CX1 is then described. As illustrated in FIG. 3A, a first dielectric film DF1 is formed over the substrate 50 and on the interconnect structure 320. The first dielectric film DF1 may be deposited by any suitable method, such as chemical vapor deposition (CVD), plasma-enhanced chemical vapor deposition (PEVCD), flowable CVD (FCVD), or the like. In some embodiments, the first dielectric film DF1 may be formed of materials such as phospho-silicate glass (PSG), boro-silicate glass (BSG), boron-doped phospho-silicate glass (BPSG), undoped silicate glass (USG), or the like. In some embodiments, the first dielectric film DF1 may include an oxide (e.g., silicon oxide or the like), a nitride (e.g., silicon nitride or the like), a combination thereof or the like. Other dielectric materials formed by any acceptable process may be used.

After forming the first dielectric film DF1, a first mask MK1 is formed thereon. For example, from a top view of the first mask MK1 illustrated in FIG. 3B, the first mask MK1 includes a plurality of stripe patterns MK1-SP spaced apart from one another. The stripe patterns MK1-SP are arranged on the first dielectric film DF1 so that a portion of the first dielectric film DF1 is revealed or exposed. In some alternative embodiments, the first mask MK1 include other patterns, which may be adjusted based on the routing designs of the bit line array AX1. In some embodiments, the first mask MK1 includes a positive photo-resist or a negative photo-resist.

Figure 4:
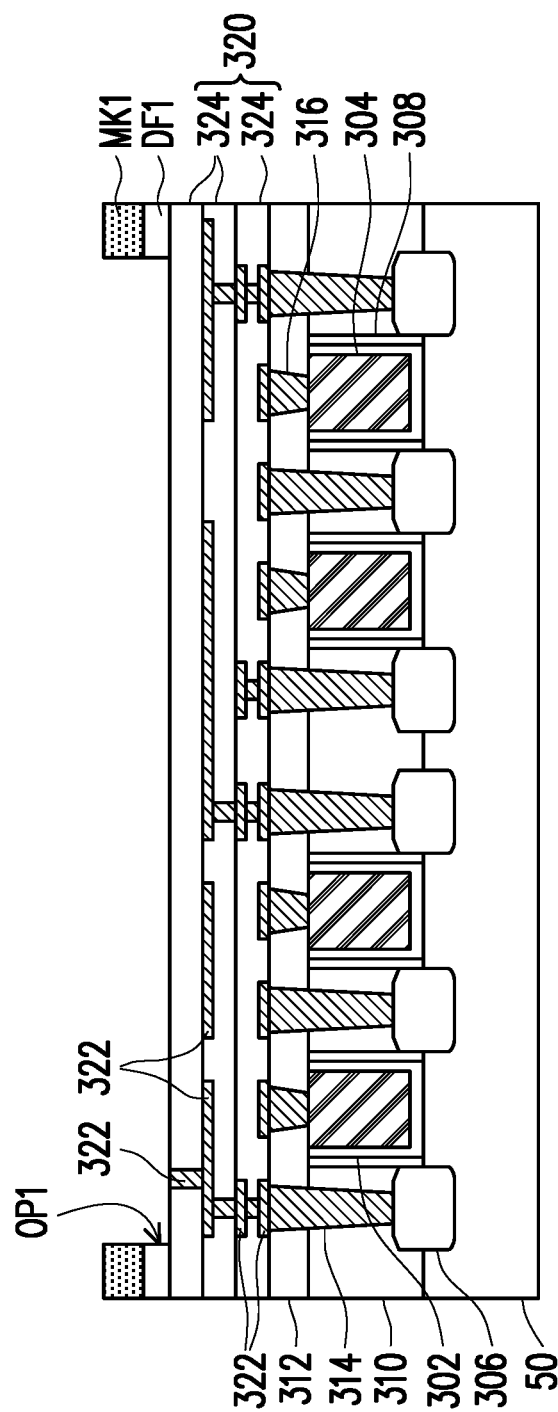
Figure 5A:
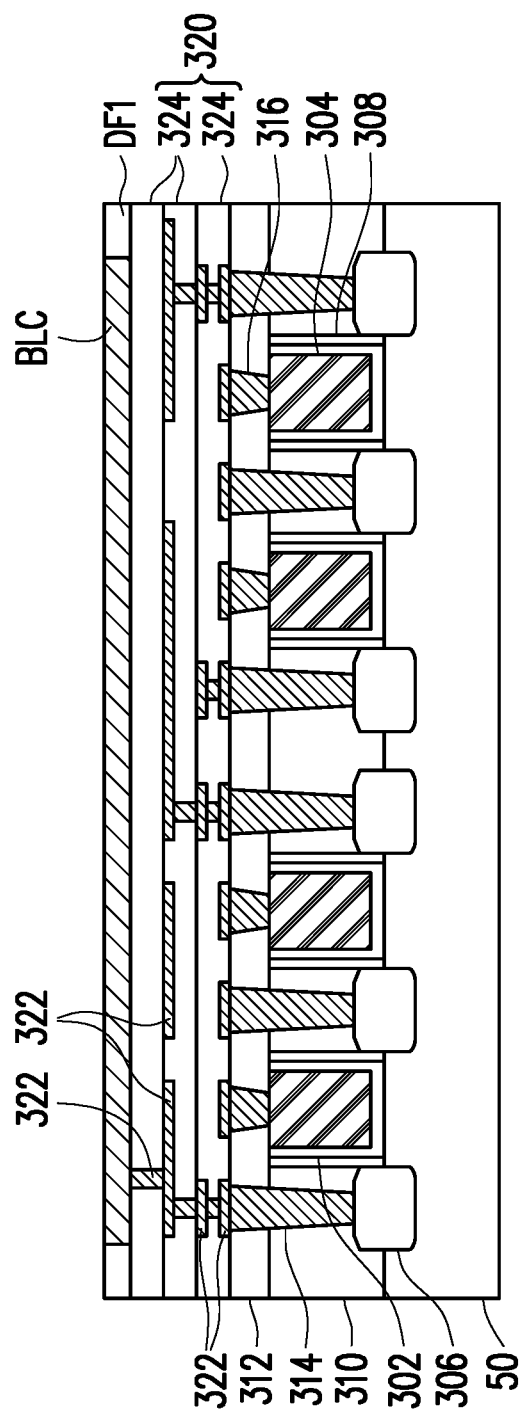

Referring to FIG. 4, in a subsequent step, the first dielectric film DF1 is patterned using the first mask MK1 to form first openings OP1 in the first dielectric film DF1. For example, portions of the first dielectric film DF1 not covered by the first mask MK1 are removed through an etching process. Thereafter, referring to FIG. 5A and FIG. 5B, a plurality of bit line conductive layers BLC is formed in the first openings OP1 to fill up the first openings OP1. For example, the bit line conductive layers BLC are formed to be parallel to one another (FIG. 5B), but the disclosure is not limited thereto. In some embodiments, the bit line conductive layers BLC are electrically connected to the CMOS circuitry CX1 below (e.g. connected to conductive features 322). In some embodiments, after the bit line conductive layers BLC are deposited, a planarization process, such as a chemical mechanical polish (CMP), an etch-back process, combinations thereof, or the like may be performed. The planarization process is performed so that top surfaces of the bit line conductive layers BLC are planar with a top surface of the first dielectric film DF1.

Figure 6A:
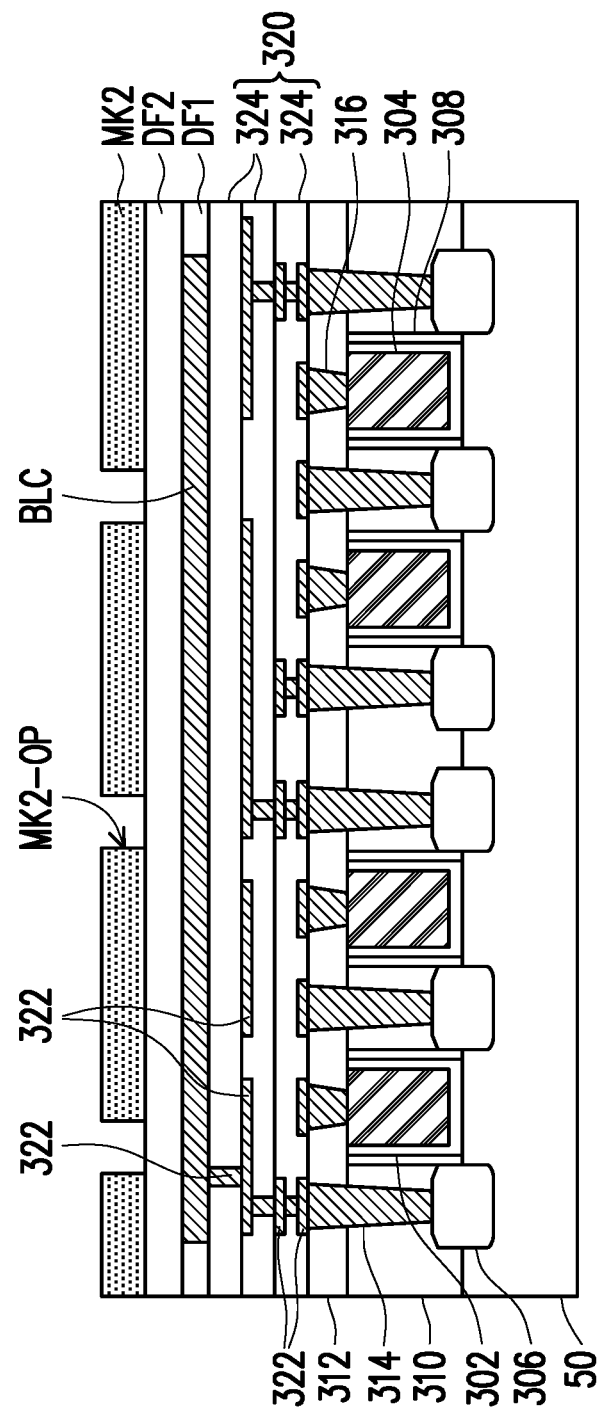
Figure 6B:
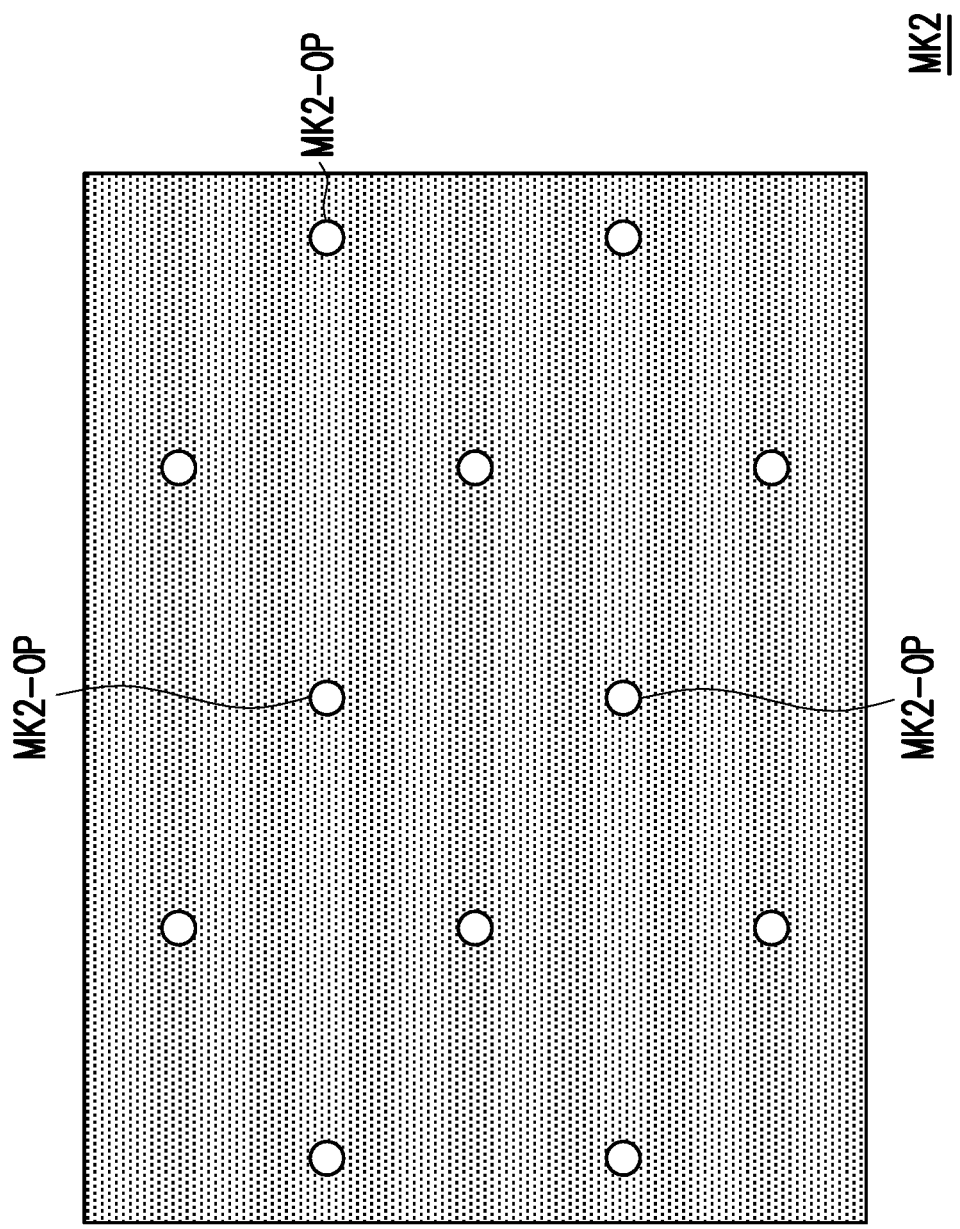

Referring to FIG. 6A, after forming the bit line conductive layers BLC, a second dielectric film DF2 is formed over the first dielectric film DF1 and over the bit line conductive layers BLC. The second dielectric film DF2 may be deposited by any suitable method, such as chemical vapor deposition (CVD), plasma-enhanced chemical vapor deposition (PEVCD), flowable CVD (FCVD), or the like. In some embodiments, the second dielectric film DF2 may be formed of materials such as phospho-silicate glass (PSG), borosilicate glass (BSG), boron-doped phospho-silicate glass (BPSG), undoped silicate glass (USG), or the like. In some embodiments, the second dielectric film DF2 may include an oxide (e.g., silicon oxide or the like), a nitride (e.g., silicon nitride or the like), a combination thereof or the like. Other dielectric materials formed by any acceptable process may be used. The second dielectric film DF2 and the first dielectric film DF1 may include the same or different materials.

After forming the second dielectric film DF3, a second mask MK2 is formed thereon. For example, from a top view of the second mask MK2 illustrated in FIG. 6B, the second mask MK2 includes a plurality of via openings MK2-OP. The second mask MK2 is arranged on the second dielectric film DF2 so that the via openings MK2-OP reveals a portion of the first dielectric film DF1. In some embodiments, the second mask MK2 includes a positive photo-resist or a negative photo-resist.

Figure 7:
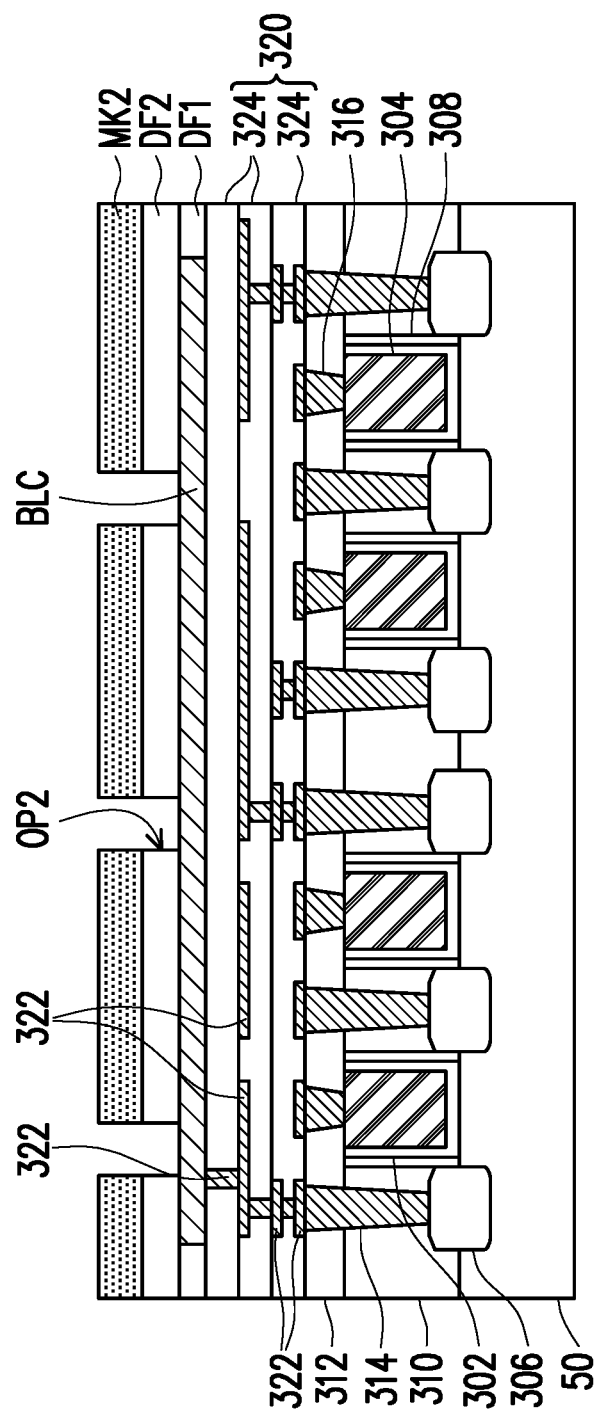

Referring to FIG. 7, in a subsequent step, the second dielectric film DF2 is patterned using the second mask MK2 to form second openings OP2 in the second dielectric film DF2. For example, portions of the second dielectric film DF2 not covered by the second mask MK2 are removed through acceptable etching process. Thereafter, referring to FIG. 8A and FIG. 8B, a first set of vias BLV1 and a second set of vias BLV2 (collectively referred as bit line vias) are formed in the second openings OP2 to fill up the second openings OP2.

Figure 8A:
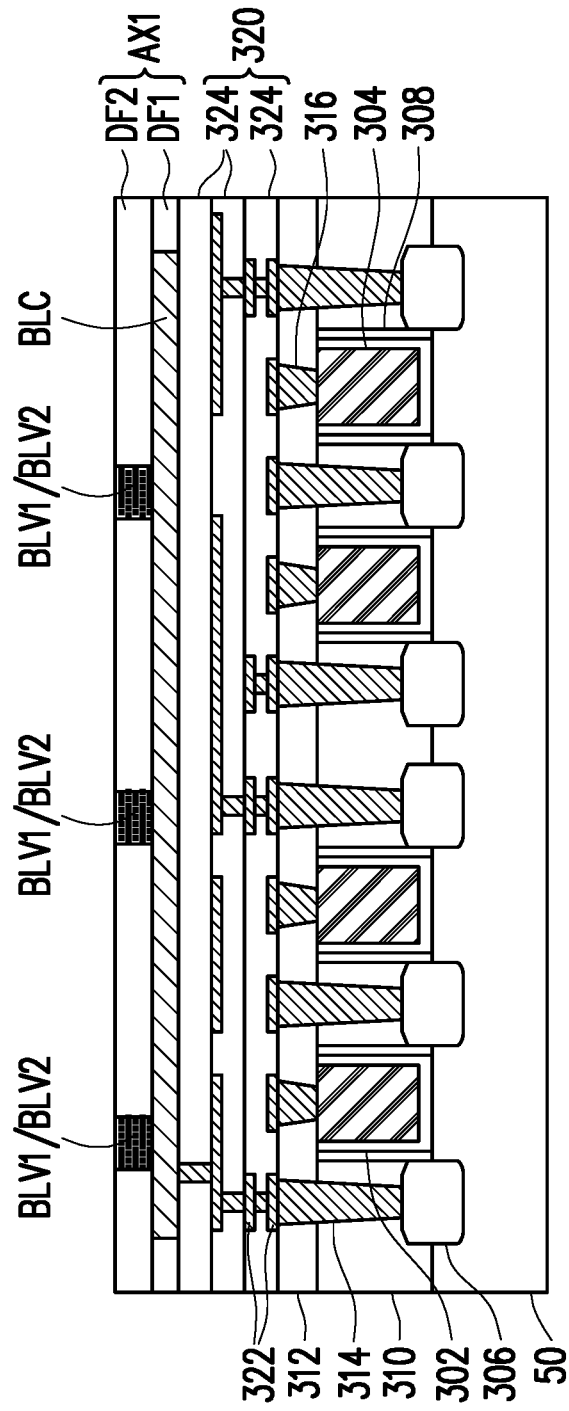
Figure 8B:
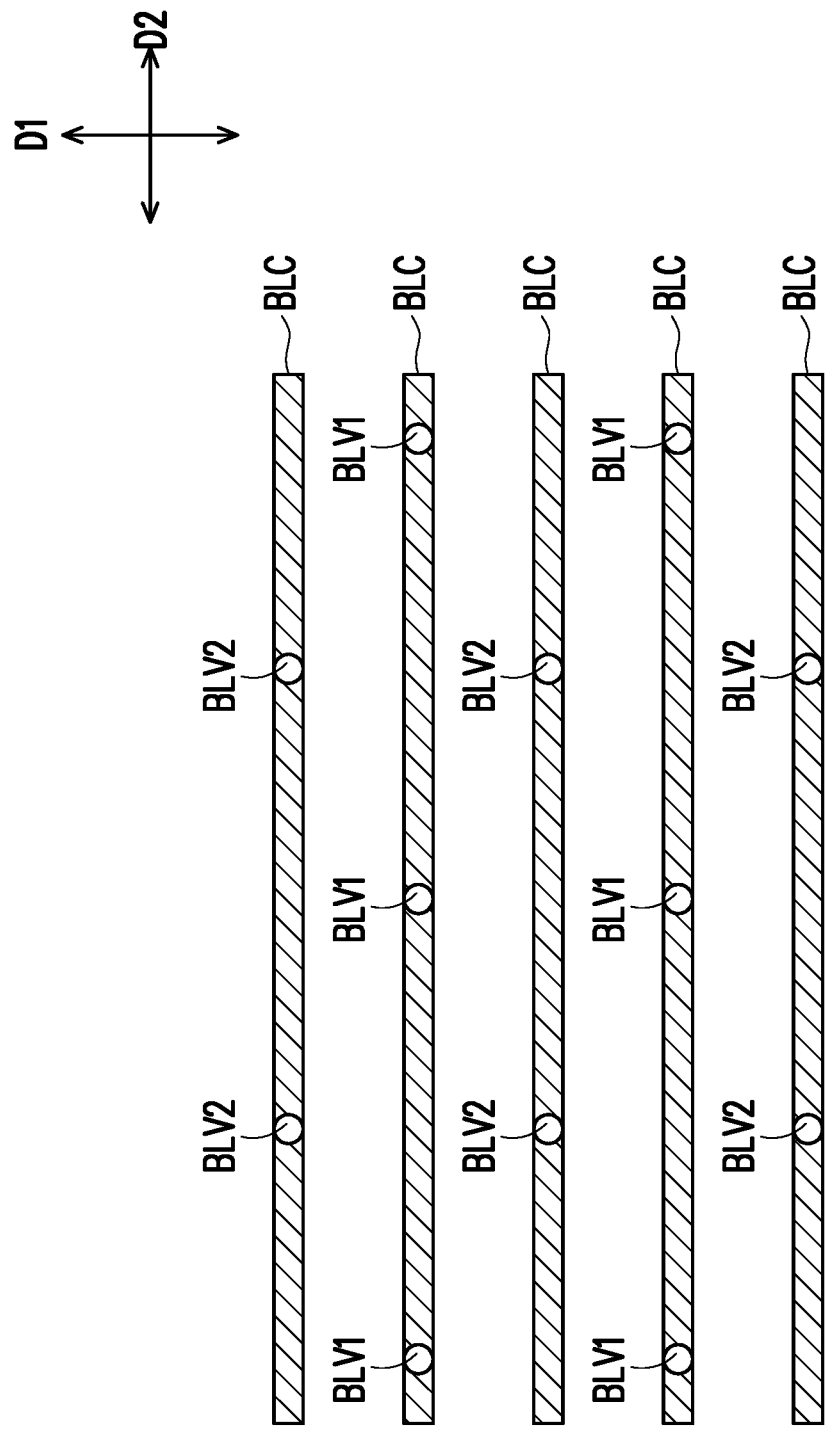

As illustrated in FIG. 8B, the first set of vias BLV1 are arranged on the bit line conductive layers BLC and spaced apart from one another along a second direction D2. Furthermore, the first set of vias BLV1 may be arranged in columns and spaced apart from one another along a first direction D1, wherein the first direction D1 is perpendicular to the second direction D2. In a similar way, the second set of vias BLV2 are arranged on the bit line conductive layers BLC and spaced apart from one another along the second direction D2. Furthermore, the second set of vias BLV2 may be arranged in columns and spaced apart from one another along the first direction D1. In the illustrated embodiment, the first set of vias BLV1 are staggered widthwise in the second direction DL2 from the second set of vias BLV2. In other words, the first set of vias BLV1 and the second set of vias BLV2 do not overlap one another in the second direction D2, or the first set of vias BLV1 are misaligned with the second set of vias BLV2. The first set of vias BLV1 and the second set of vias BLV2 may be electrically connected to the bit line conductive layers BLC located underneath. However, in some embodiments, the first set of vias BLV1 and the second set of vias BLV2 are not located on the same stripe of bit line conductive layers BLC. Up to here, a bit line array AX1 is formed over the CMOS circuitry CX1, and the bit line array AX1 is electrically connected to the interconnect structure 320.

Figure 9A:
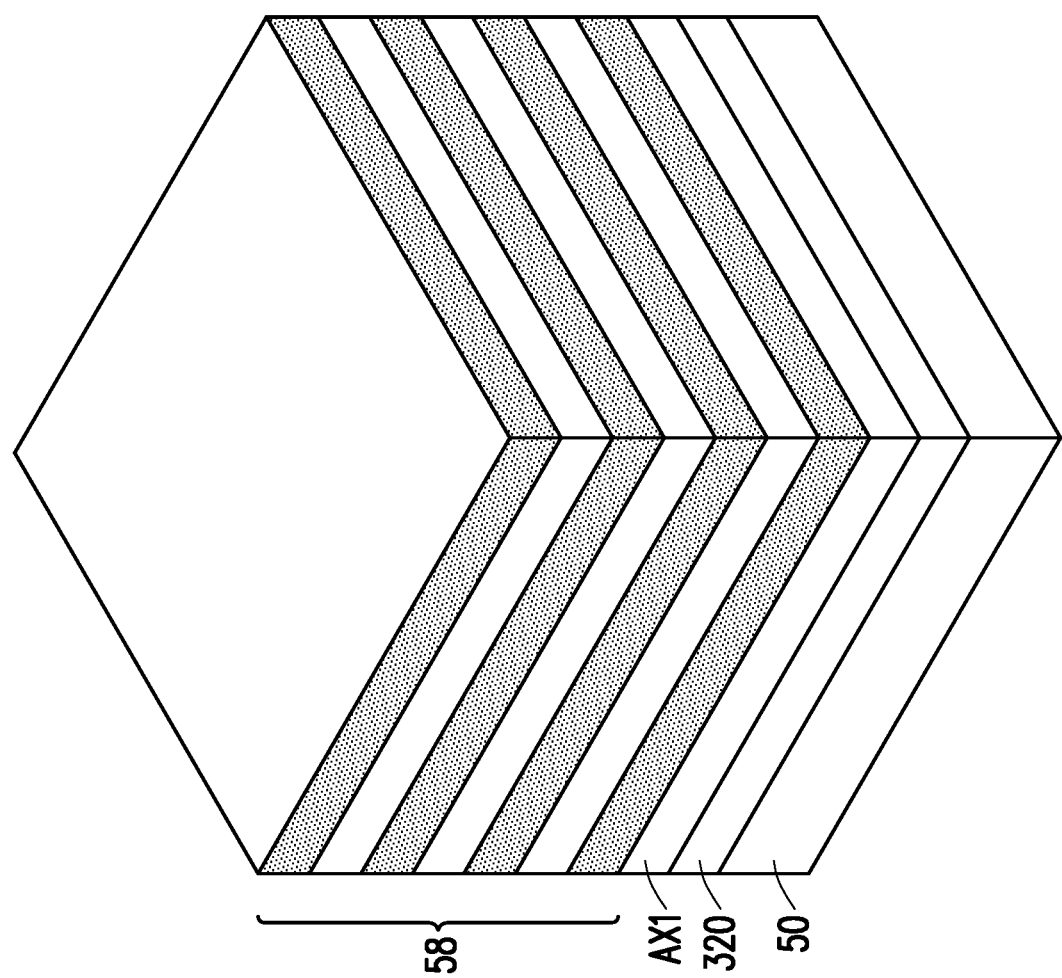
Figure 9B:
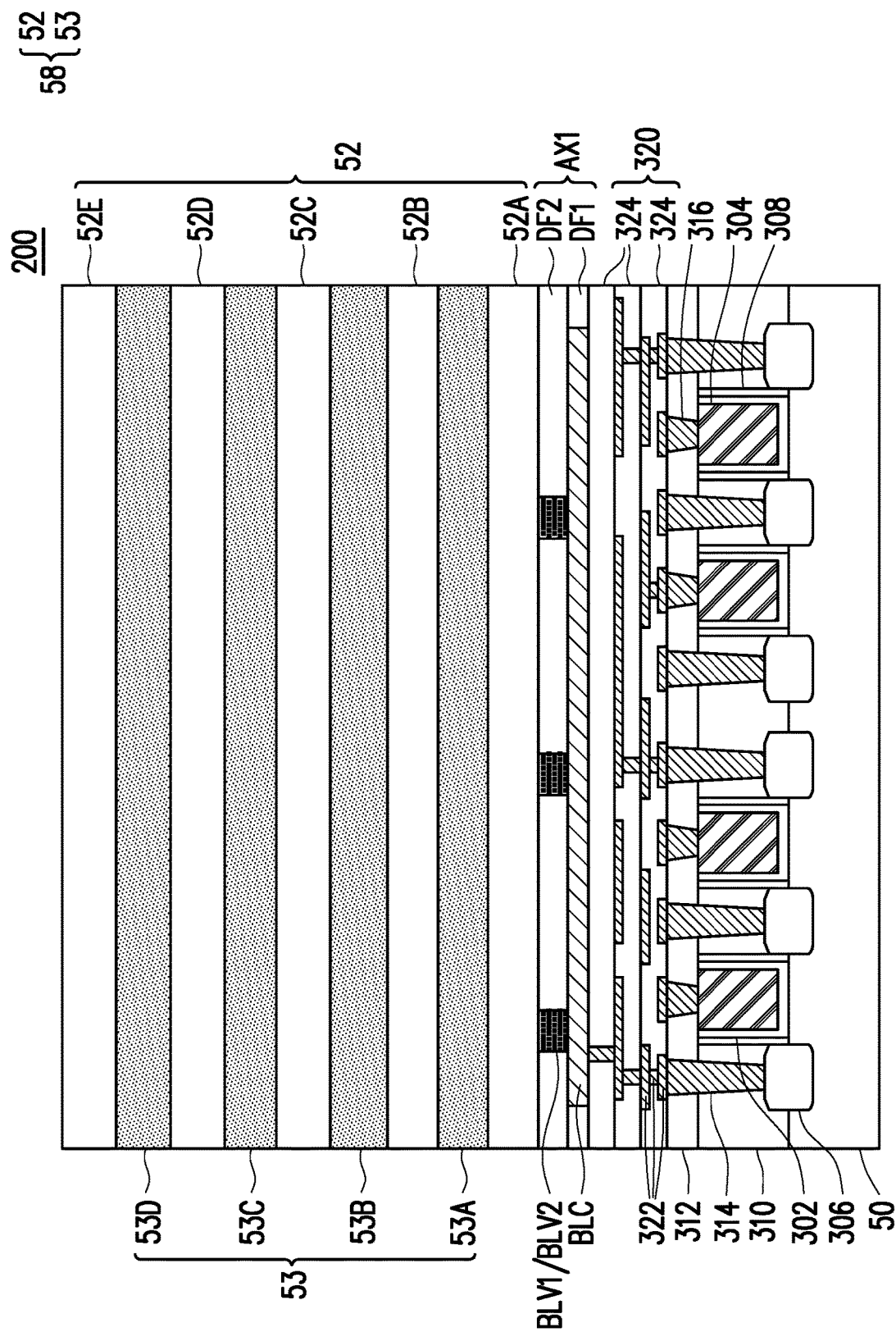

Referring to FIGS. 9A and 9B, a multi-layer stack 58 (or word line stack) is formed over the structure of FIG. 8A. The substrate 50, the transistors, the ILDs, the interconnect structure 320, and the bit line array AX1 may be omitted from subsequent drawings for the purposes of simplicity and clarity. Although the bit line array AX1 and the interconnect structure 320 are illustrated as being located in between the multi-layer stack 58 and the substrate 50 and contacting one another, it is noted that any number of intermediate layers may be further disposed between the substrate 50 and the multi-layer stack 58 (or word line stack). For example, one or more additional interconnect layers comprising conductive features in insulting layers (e.g., low-k dielectric layers) may be disposed between the substrate 50 and the multi-layer stack 58. In some embodiments, the conductive features may be patterned to provide power, ground, and/or signal lines for the active devices on the substrate 50 and/or the memory structure 200 (see FIGS. 1A and 1B). In some embodiments, one or more interconnect layers including conductive features in insulting layers (e.g., low-k dielectric layers) may be disposed over the multi-layer stack 58 (or word line stack).

As illustrated in FIGS. 9A and 9B, the multi-layer stack 58 (or word line stack) includes alternating layers of sacrificial layers 53A-53D (collectively referred to as sacrificial layers 53) and dielectric layers 52A-52E (collectively referred to as dielectric layers 52). The sacrificial layers 53 may be patterned and replaced in subsequent steps to define conductive lines 72 (e.g., the word lines). The sacrificial layers 53 may include dielectric materials, such as silicon oxide, silicon nitride, silicon oxynitride, combinations thereof, or the like. The dielectric layers 52 may include insulating materials, such as silicon oxide, silicon nitride, silicon oxynitride, combinations thereof, or the like. The sacrificial layers 53 and the dielectric layers 52 include different materials with different etching selectivities. In some embodiments, the sacrificial layers 53 include silicon nitride, and the dielectric layers 52 include silicon oxide. Each of the sacrificial layers 53 and the dielectric layers 52 may be formed using, for example, chemical vapor deposition (CVD), atomic layer deposition (ALD), physical vapor deposition (PVD), plasma enhanced CVD (PECVD), or the like.

Although FIGS. 9A and 9B illustrates a particular number of the sacrificial layers 53 and the dielectric layers 52, other embodiments may include different numbers of the sacrificial layers 53 and the dielectric layers 52. Besides, although the multi-layer stack 58 is illustrated as having dielectric layers as topmost and bottommost layers, the disclosure is not limited thereto. In some embodiments, at least one of the topmost and bottommost layers of the multi-layer stack 58 is a sacrificial layer.

FIG. 10 through FIG. 17 and FIG. 18B are various views of intermediate stages in the manufacturing a staircase structure of the memory structure 200, in accordance with some embodiments. FIGS. 10 through FIG. 17 and FIG. 18B are illustrated along reference cross-section B-B' illustrated in FIG. 1A. FIG. 18A is illustrated as a three-dimensional view of the structure shown in FIG. 18B.

Figure 10:
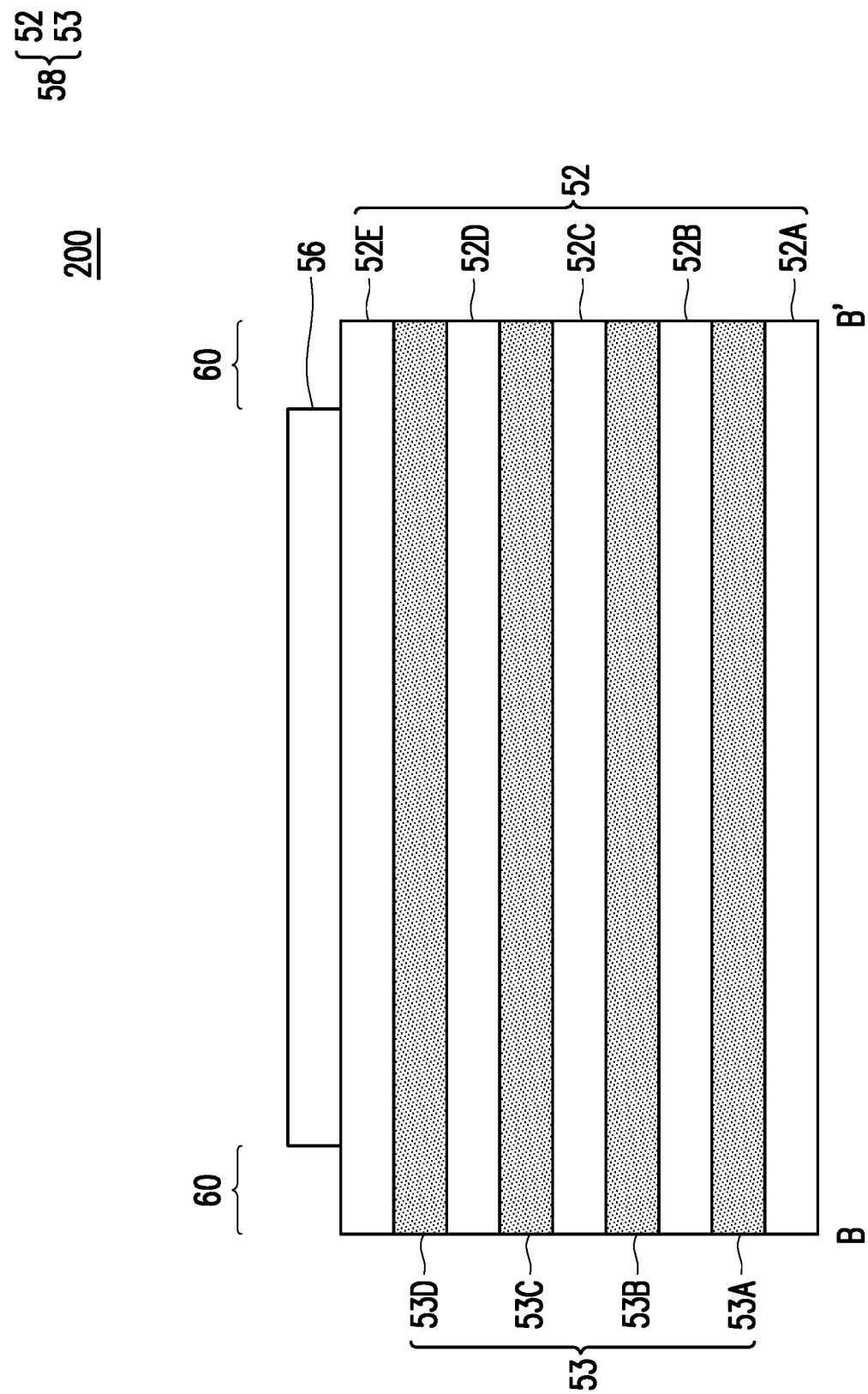

As illustrated in FIG. 10, a photoresist 56 is formed over the multi-layer stack 58. In some embodiments, the photoresist 56 is formed by a spin-on technique and patterned by an acceptable photolithography technique. Patterning the photoresist 56 may expose the multi-layer stack 58 in regions 60, while masking remaining portions of the multi-layer stack 58. For example, a topmost layer of the multi-layer stack 58 (e.g., the dielectric layer 52E) may be exposed in the regions 60.

Figure 11:
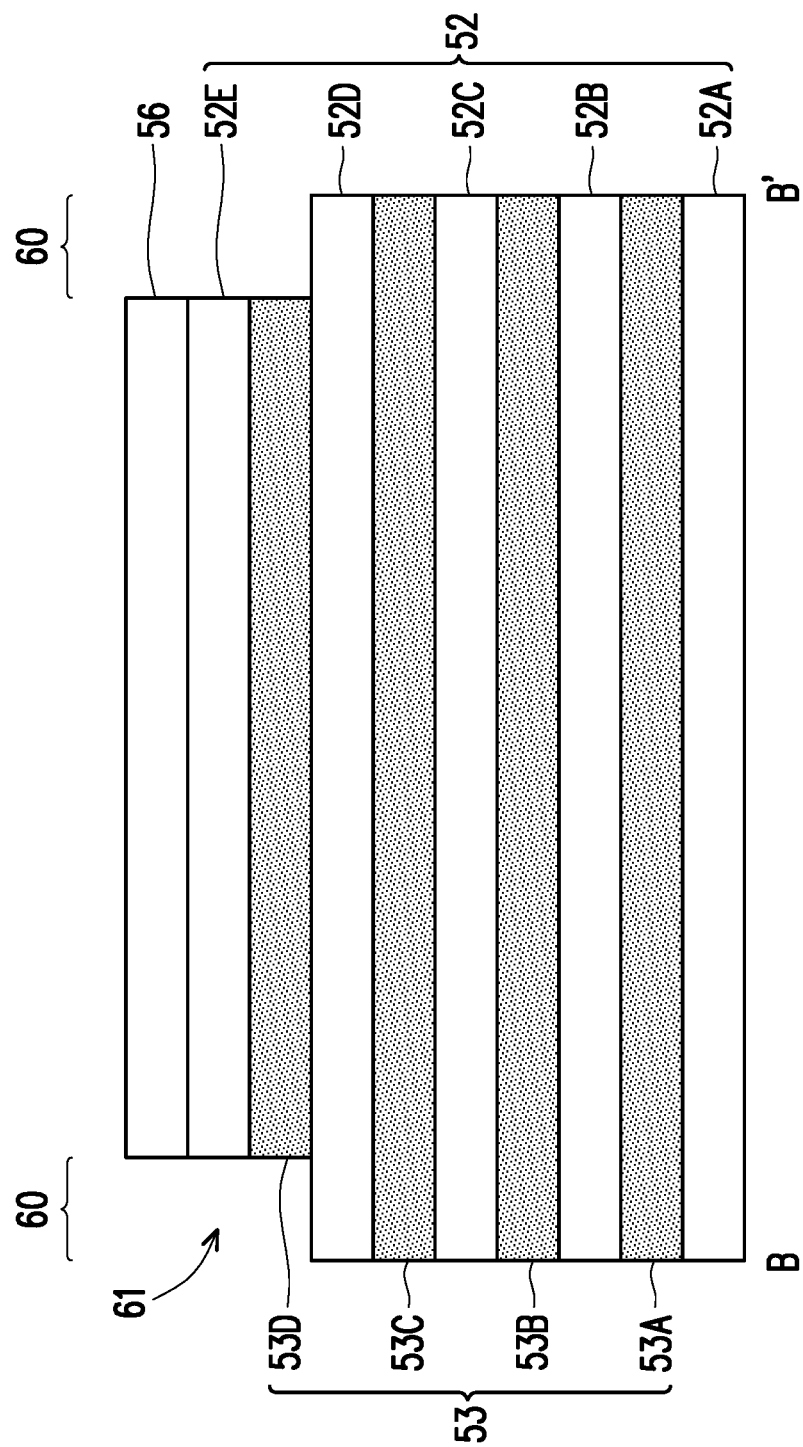

As illustrated in FIG. 11, the exposed portions of the multi-layer stack 58 in the regions 60 are etched using the photoresist 56 as a mask. The etching may be any acceptable etching process, such as a dry etch (e.g., a reactive ion etch (RIE), a neutral beam etch (NBE), the like), a wet etch, the like, or a combination thereof. The etching may be anisotropic. The etching may remove portions of the dielectric layer 52E and the sacrificial layer 53D in the regions 60 and define openings 61. Because the dielectric layer 52E and the sacrificial layer 53D have different material compositions, etchants used to remove exposed portions of these layers may be different. In some embodiments, the sacrificial layer 53D acts as an etch stop layer while etching the dielectric layer 52E, and the dielectric layer 52D acts as an etch stop layer while etching sacrificial layer 53D. As a result, the portions of the dielectric layer 52E and the sacrificial layer 53D may be selectively removed without removing remaining layers of the multi-layer stack 58, and the openings 61 may be extended to a desired depth. Alternatively, a time-mode etching process may be used to stop the etching of the openings 61 after the openings 61 reach a desired depth. In the resulting structure, the dielectric layer 52D is exposed in the regions 60.

Figure 12:
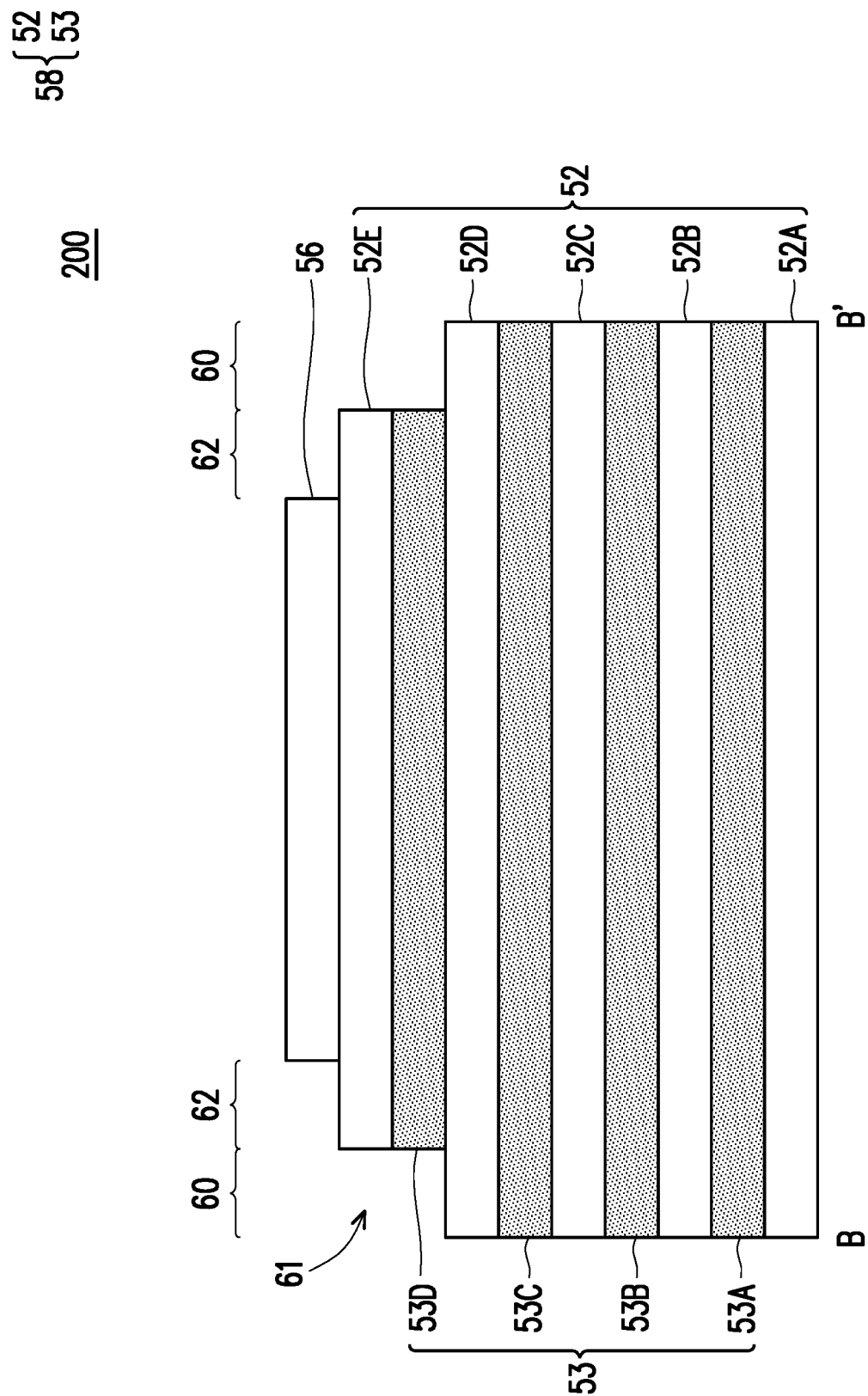

As illustrated in FIG. 12, the photoresist 56 is trimmed to expose additional portions of the multi-layer stack 58. In some embodiments, the photoresist 56 is trimmed by using an acceptable removing technique such as a lateral etching. As a result of the trimming, a width of the photoresist 56 is reduced and portions the multi-layer stack 58 in the regions 60 and regions 62 may be exposed. For example, top surfaces of the dielectric layer 52D may be exposed in the regions 60, and top surfaces of the dielectric layer 52E may be exposed in the regions 62.

Figure 13:
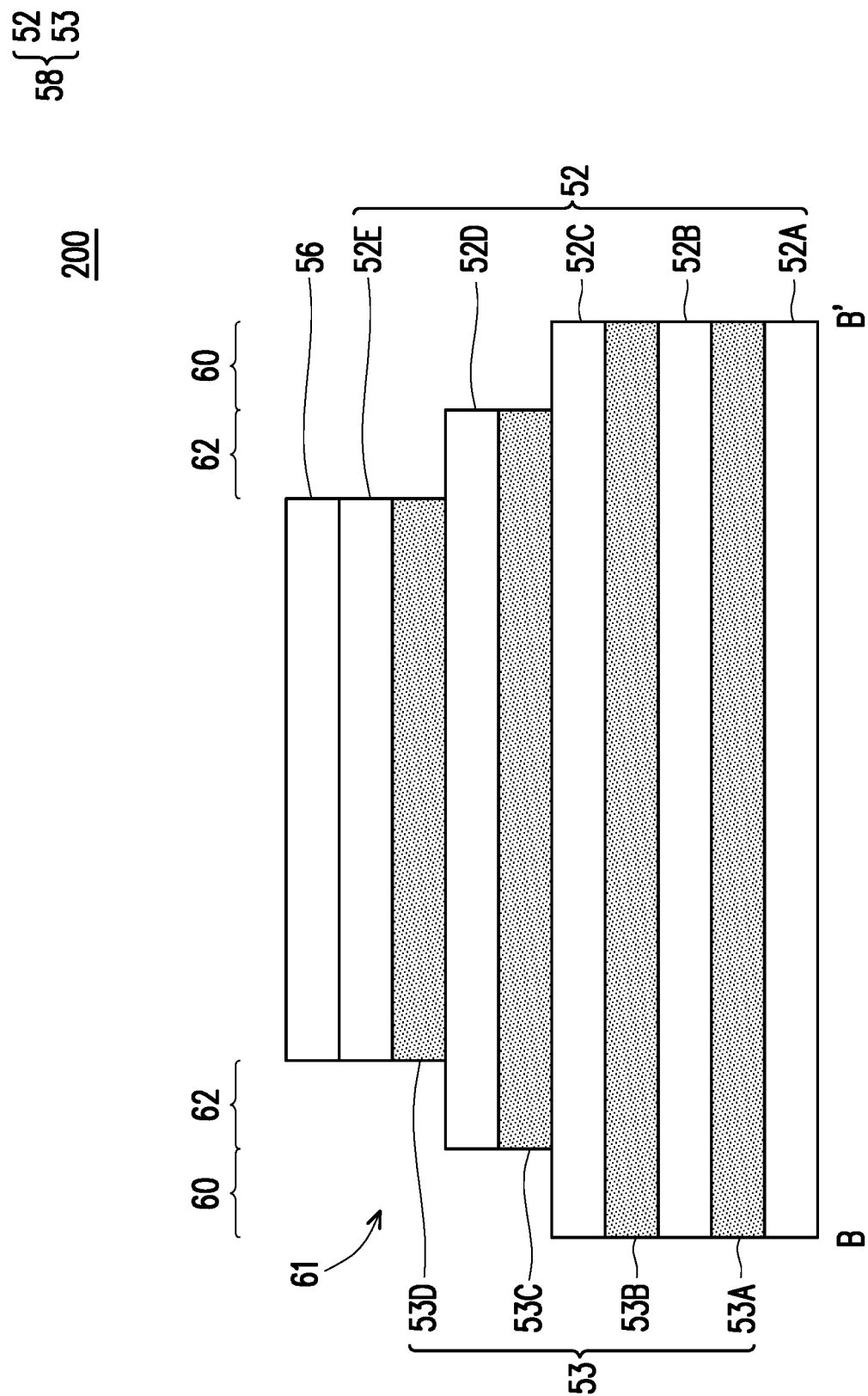

As illustrated in FIG. 13, portions of the dielectric layer 52E, the sacrificial layer 53D, the dielectric layer 52D, and the sacrificial layer 53C in the regions 60 and the regions 62 are removed by acceptable etching processes using the photoresist 56 as a mask. The etching may be any acceptable etching process, such as a dry etch (e.g., RIE, NBE, the like), a wet etch, the like, or a combination thereof. The etching may be anisotropic. The etching may extend the openings 61 further into the multi-layer stack 58. Because the sacrificial layers 53D and 53C and the dielectric layers 52E and 52D have different material compositions, etchants used to remove exposed portions of these layers may be different. In some embodiments, portions of the dielectric layers 52E and 52D in the regions 62 and 60 are removed by using the photoresist 56 as a mask and using the underlying sacrificial layers 53D and 53C as etch stop layers. Thereafter, the exposed portions of the sacrificial layers 53D and 53C in the regions 62 and 60 are removed by using the photoresist 56 as a mask and using the underlying dielectric layers 52D and 52C as etching stop layers. In the resulting structure, the dielectric layer 52C is exposed in the regions 60, and the dielectric layer 52D is exposed in the regions 62.

Figure 14:
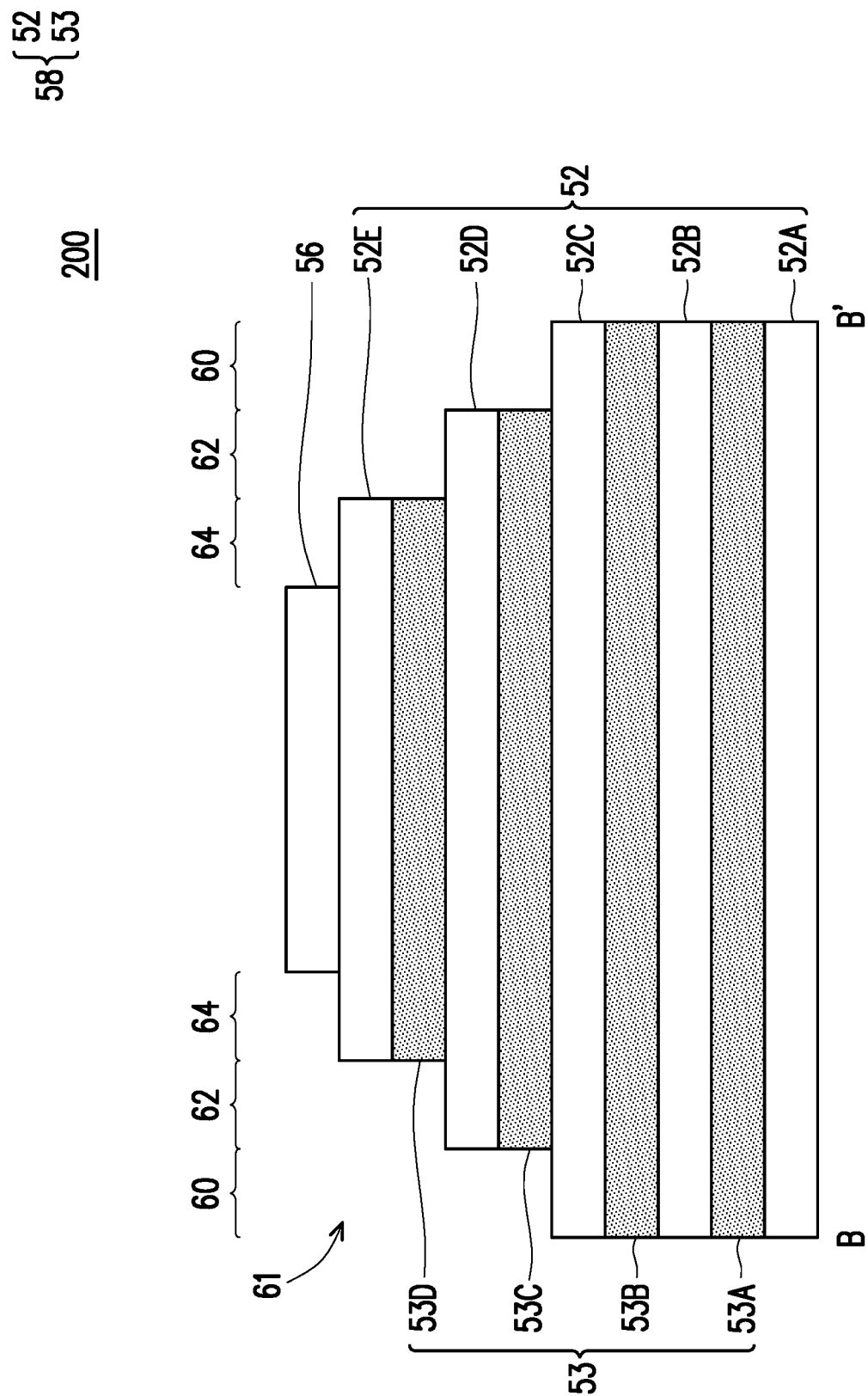

As illustrated in FIG. 14, the photoresist 56 is trimmed to expose additional portions of the multi-layer stack 58. In some embodiments, the photoresist 56 is trimmed by using an acceptable removing technique such as a lateral etching. As a result of the trimming, a width of the photoresist 56 is reduced, and portions the multi-layer stack 58 in the regions 60, the regions 62, and regions 64 may be exposed. For example, top surfaces of the dielectric layer 52C may be exposed in the regions 60; top surfaces of the dielectric layer 52D may be exposed in the regions 62; and top surfaces of the dielectric layer 52E may be exposed in the regions 64.

Figure 15:
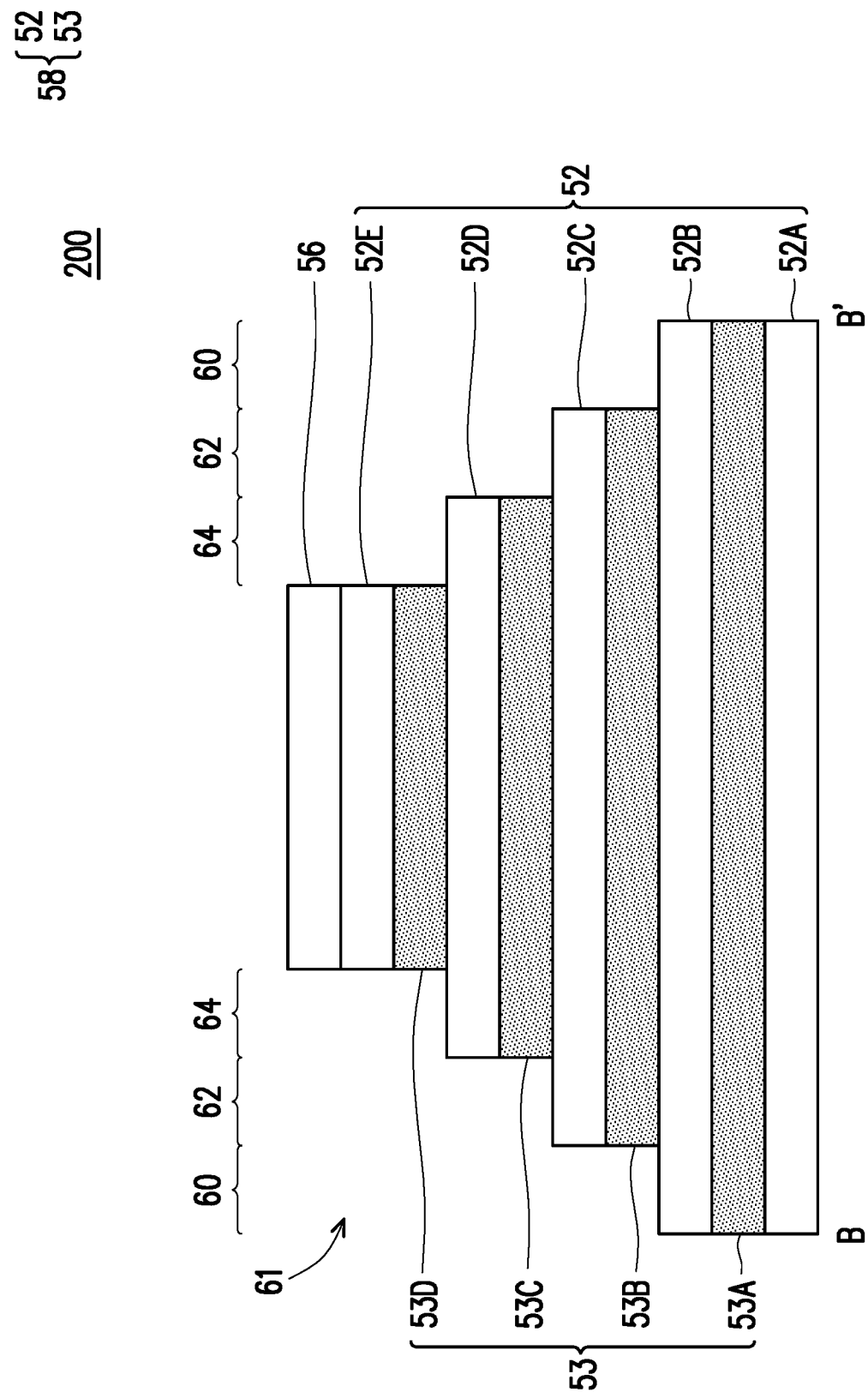

As illustrated in FIG. 15, portions of the dielectric layers 52E, 52D, and 52C and the sacrificial layers 53D, 53C, and 53B in the regions 60, the regions 62, and the regions 64 are removed by acceptable etching processes using the photoresist 56 as a mask. The etching may be any acceptable etching process, such as a dry etch (e.g., RIE, NBE, the like), a wet etch, the like, or a combination thereof. The etching may be anisotropic. The etching may extend the openings 61 further into the multi-layer stack 58. Because the dielectric layers 52C-52E and the sacrificial layers 53B-53D have different material compositions, etchants used to remove exposed portions of these layers may be different. In some embodiments, portions of the dielectric layers 52E, 52D and 52C in the regions 64, 62 and 60 are removed by using the photoresist 56 as a mask and using the underlying sacrificial layers 53D, 53C and 53B as etch stop layers. Thereafter, the exposed portions of the sacrificial layers 53D, 53C and 53B in the regions 64, 62 and 60 are removed by using the photoresist 56 as a mask and using the underlying dielectric layers 52D, 52C and 52B as etching stop layers. In the resulting structure, the dielectric layer 52B is exposed in the regions 60; the dielectric layer 52C is exposed in the regions 62; and the dielectric layer 52D is exposed in the regions 64.

Figure 16:
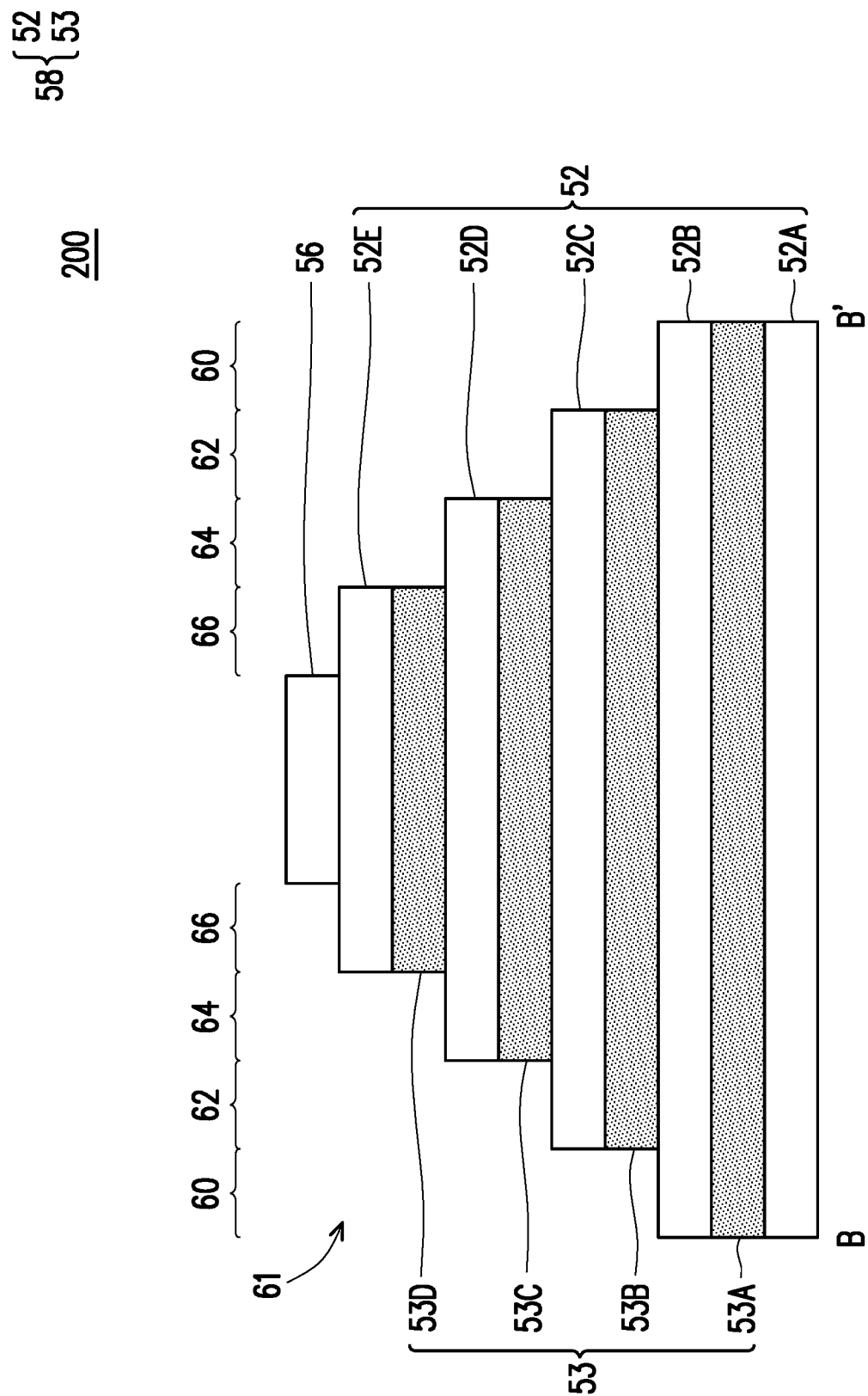

As illustrated in FIG. 16, the photoresist 56 is trimmed to expose additional portions of the multi-layer stack 58. In some embodiments, the photoresist 56 is trimmed by using an acceptable removing technique such as a lateral etching. As a result of the trimming, a width of the photoresist 56 is reduced, and portions the multi-layer stack 58 in the regions 60, the regions 62, the regions 64, and regions 66 may be exposed. For example, top surfaces of the dielectric layer 52B may be exposed in the regions 60; top surfaces of the dielectric layer 52C may be exposed in the regions 62; and top surfaces of the dielectric layer 52D may be exposed in the regions 64; and top surfaces of the dielectric layer 52E may be exposed in the regions 66.

Figure 17:
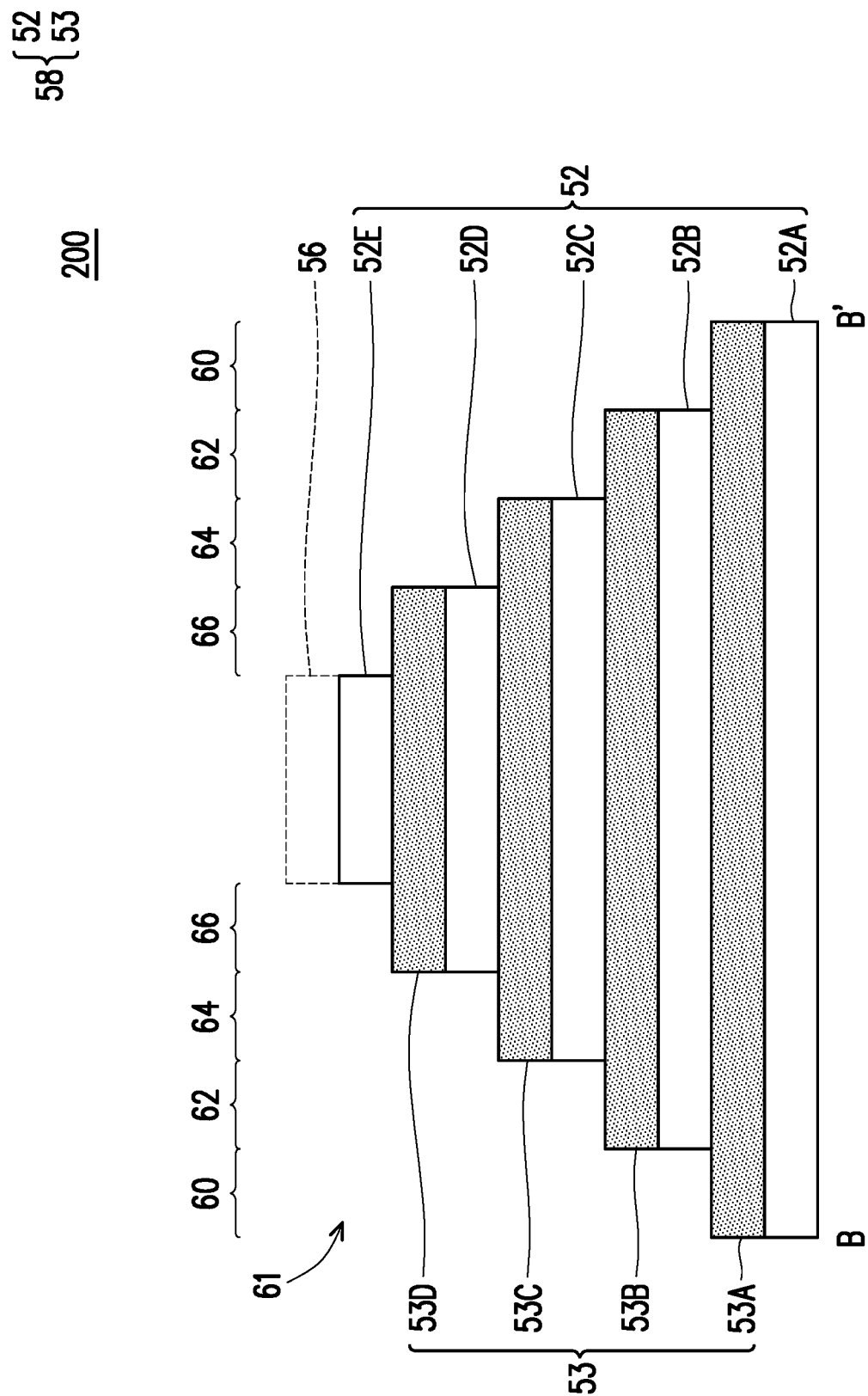
Figure 18A:
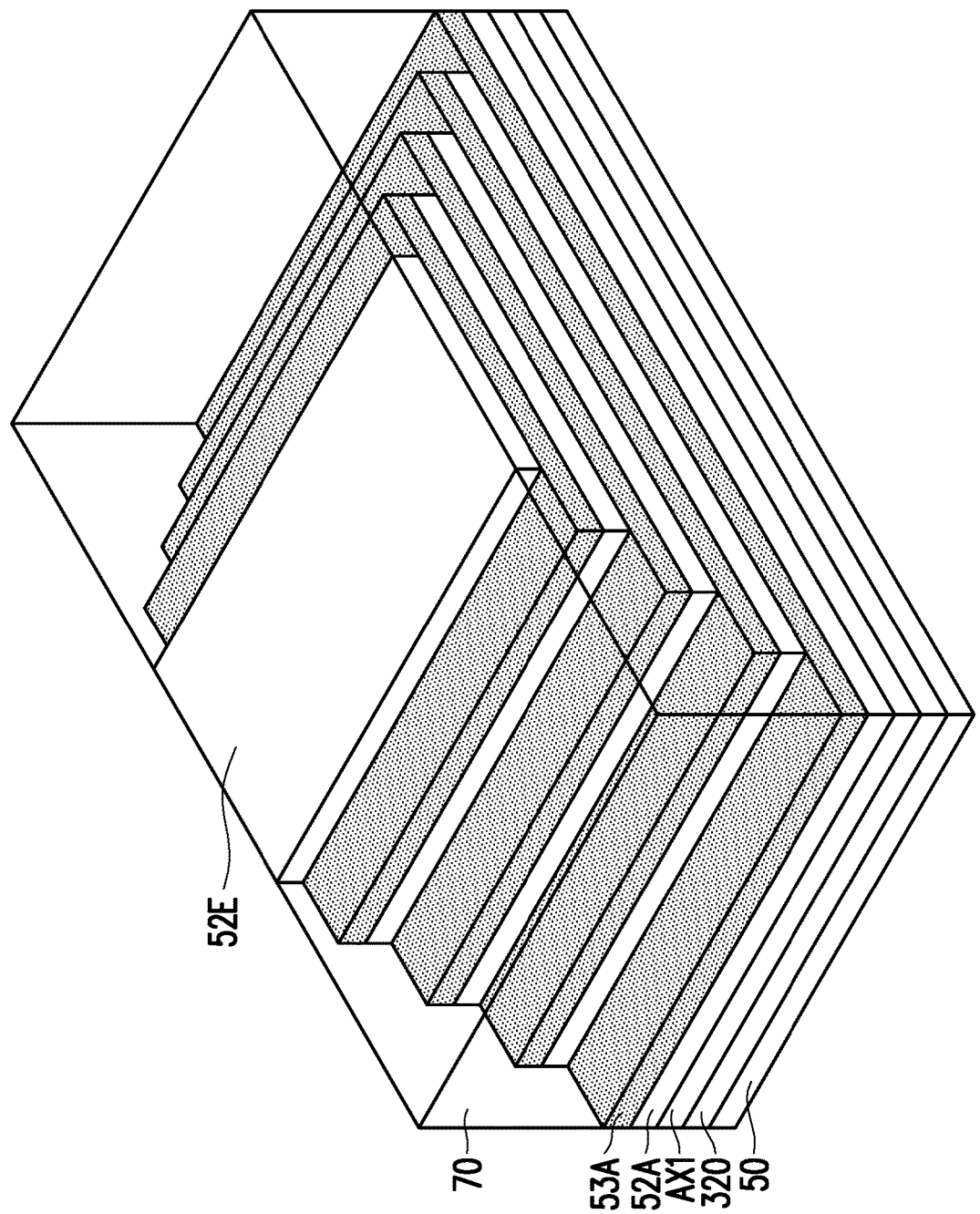

As illustrated in FIG. 17, portions of the dielectric layers 52E, 52D, 52C, and 52B in the regions 60, the regions 62, the regions 64, and the regions 66 are removed by acceptable etching processes using the photoresist 56 as a mask. The etching may be any acceptable etching process, such as a dry etch (e.g., RIE, NBE, the like), a wet etch, the like, or a combination thereof. The etching may be anisotropic. The etching may extend the openings 61 further into the multi-layer stack 58. In some embodiments, portions of the dielectric layers 52E, 52D, 52C and 52B in the regions 66, 64, 62 and 60 are removed by using the photoresist 56 as a mask and using the underlying sacrificial layers 53D, 53C, 53B and 53A as etch stop layers. In the resulting structure, the sacrificial layer 53A is exposed in the regions 60; the sacrificial layer 53B is exposed in the regions 62; the sacrificial layer 53C is exposed in the regions 64; and the sacrificial layer 53D is exposed in the regions 66. Thereafter, the photoresist 56 may be removed by an acceptable ashing or wet strip process.

Figure 18B:
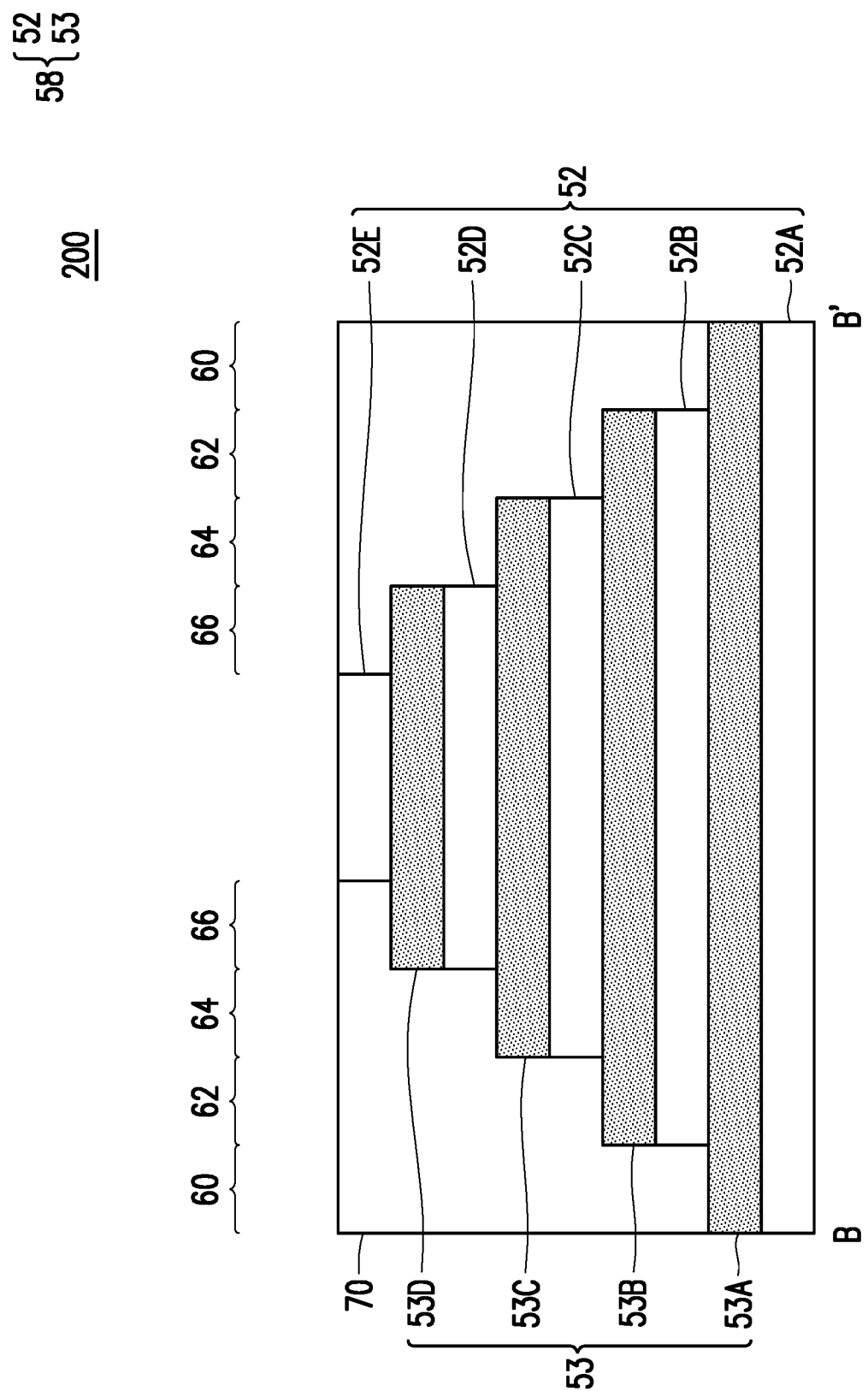

As illustrated in FIGS. 18A and 18B, an inter-metal dielectric (IMD) 70 is deposited over the multi-layer stack 58. The IMD 70 may be formed of a dielectric material, and may be deposited by any suitable method, such as CVD, PECVD, flowable CVD (FCVD), or the like. The dielectric materials may include phospho-silicate glass (PSG), boro-silicate glass (BSG), boron-doped phospho-silicate glass (BPSG), undoped silicate glass (USG), or the like. In some embodiments, the IMD 70 may include an oxide (e.g., silicon oxide or the like), a nitride (e.g., silicon nitride or the like), a combination thereof or the like. Other dielectric materials formed by any acceptable process may be used. The IMD 70 extends along sidewalls of the sacrificial layers 53B-53D and sidewalls of the dielectric layers 52B-52E. Further, the IMD 70 may contact top surfaces of the sacrificial layers 53A-53D and the dielectric layer 52E.

Thereafter, a removal process is applied to the IMD 70 to remove excess dielectric material over the multi-layer stack 58. In some embodiments, the removal process may be a planarization process, such as a chemical mechanical polish (CMP), an etch-back process, combinations thereof, or the like. The planarization process exposes the multi-layer stack 58 such that top surfaces of the multi-layer stack 58 and IMD 70 are leveled after the planarization process is completed.

As shown in FIGS. 18A and 18B, an intermediate and bulk staircase structure is thus formed. The intermediate staircase structure includes alternating layers of sacrificial layers 53 and dielectric layers 52. The sacrificial layers 53 are subsequently replaced with conductive lines 72, which will be described in details in FIGS. 22A and 22B. Lower conductive lines 72 are longer and extend laterally past upper conductive lines 72, and a width of each of the conductive lines 72 increases in a direction towards the substrate 50 (see FIG. 1A).

FIG. 19 through FIG. 22B are various views of intermediate stages in the manufacturing of a memory region of the memory structure 200, in accordance with some embodiments of the disclosure. In FIG. 19 through FIG. 22B, the bulk multi-layer stack 58 (word line stack) is patterned to form trenches 86 therethrough, and sacrificial layers 53 are replaced with conductive materials to define the conductive lines 72. The conductive lines 72 may correspond to word lines in the memory structure 200, and the conductive lines 72 may further provide gate electrodes for the resulting memory cells of the memory structure 200. FIGS. 19, 20, 21B and 22B are illustrated along reference cross-section C-C' illustrated in FIG. 1A. FIGS. 21A and 22A are illustrated in a partial three-dimensional view.

Figure 19:
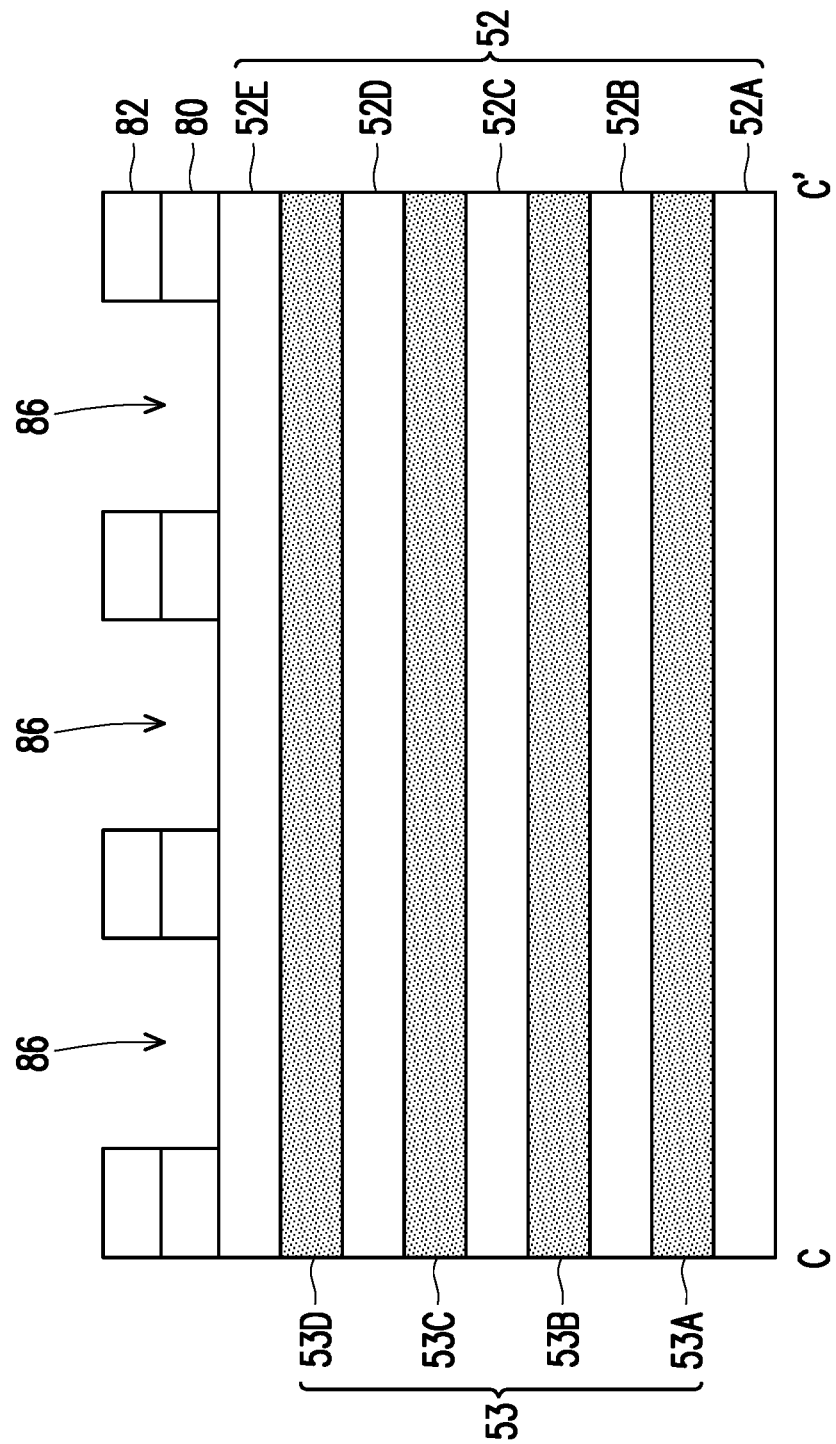

As illustrated in FIG. 19, photoresist patterns 82 and underlying hard mask patterns 80 are formed over the multi-layer stack 58. In some embodiments, a hard mask layer and a photoresist layer are sequentially formed over the multi-layer stack 58. The hard mask layer may include, for example, silicon nitride, silicon oxynitride, or the like, which may be deposited by CVD, PVD, ALD, PECVD, or the like. The photoresist layer is formed by a spin-on technique, for example.

Thereafter, the photoresist layer is patterned to form photoresist patterns 82 and trenches 86 between the photoresist patterns 82. The photoresist layer is patterned by an acceptable photolithography technique, for example. The patterns of the photoresist patterns 82 are then transferred to the hard mask layer to form hard mask patterns 80 by using an acceptable etching process, such as by a dry etch (e.g., RIE, NBE, the like), a wet etch, the like, or a combination thereof. The etching may be anisotropic. Thus, trenches 86 are formed extending through the hard mask layer. Thereafter, the photoresist 82 may be optionally removed by an ashing process, for example.

Figure 20:
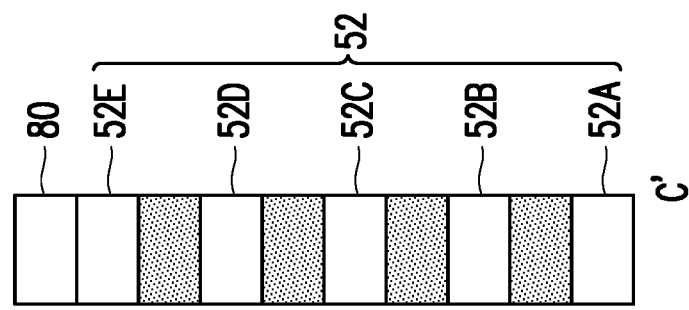
Figure 20:
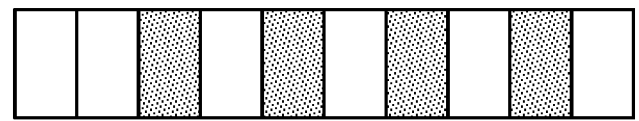
Figure 20:
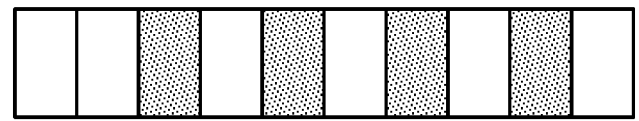
Figure 20:
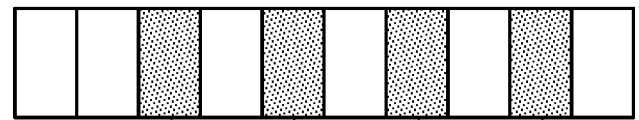
Figure 21A:
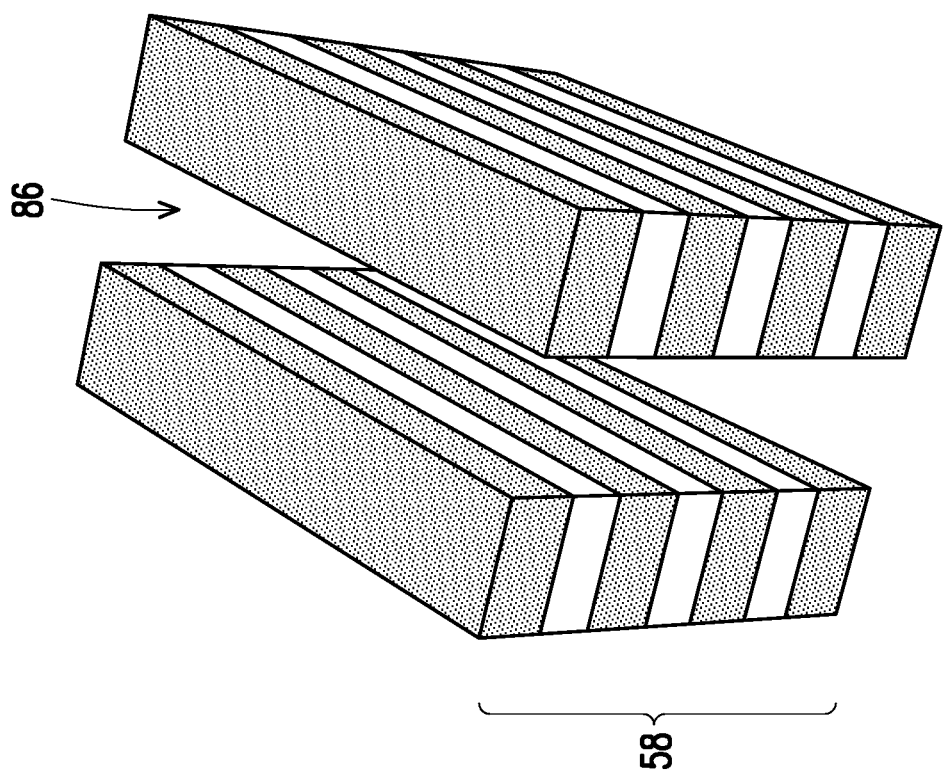
Figure 21B:
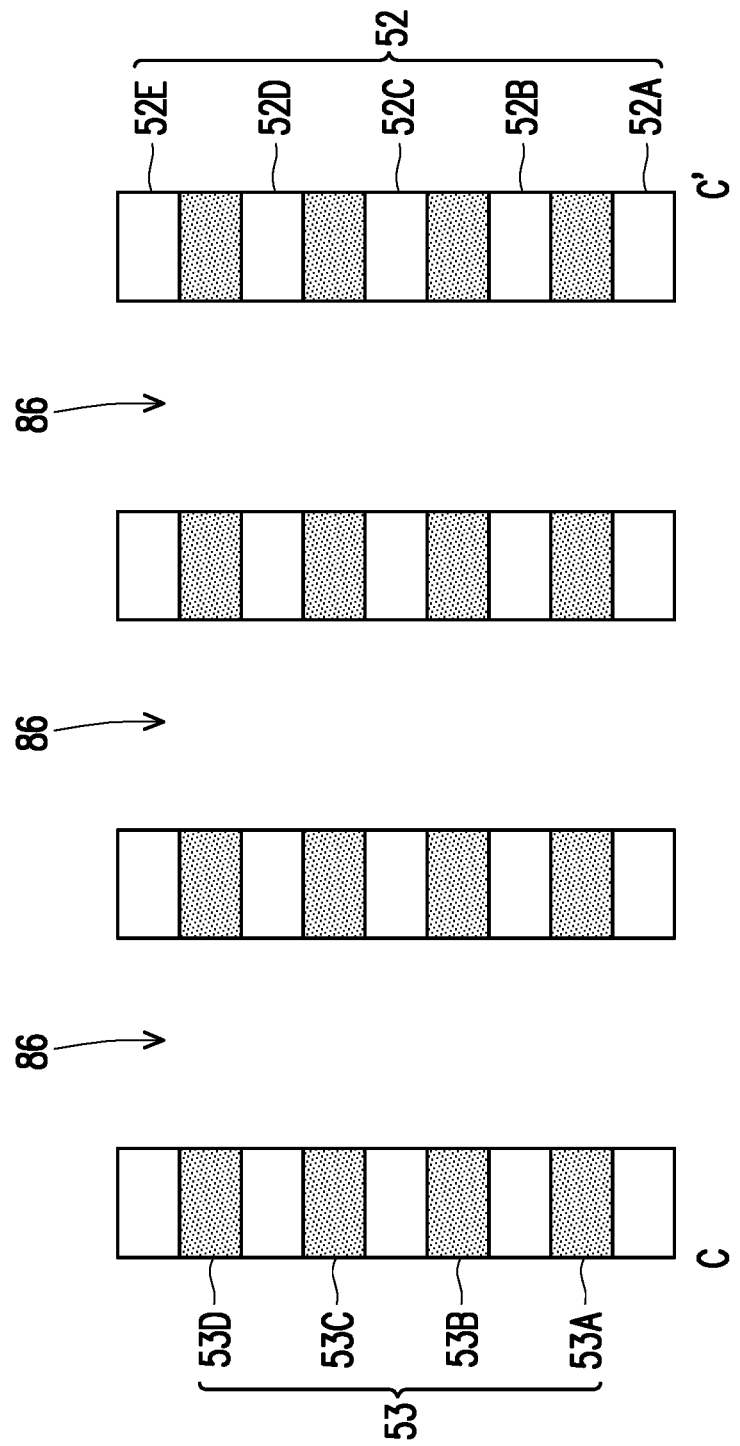

As illustrated in FIGS. 20 to 21B, the patterns of the hard mask patterns 80 are transferred to the multi-layer stack 58 using one or more acceptable etching processes, such as by a dry etch (e.g., RIE, NBE, the like), a wet etch, the like, or a combination thereof. The etching processes may be anisotropic. Thus, the trenches 86 extend through the bulk multi-layer stack 58, and strip-shaped sacrificial layers 53 and strip-shaped dielectric layers 52 are accordingly defined. In some embodiments, the trenches 86 extend through the bulk staircase structure, and strip-shaped staircase structures are accordingly defined. The hard mask patterns 80 may be then removed by an acceptable process, such as a wet etching process, a dry etching process, a planarization process, combinations thereof, or the like.

Figure 22A:
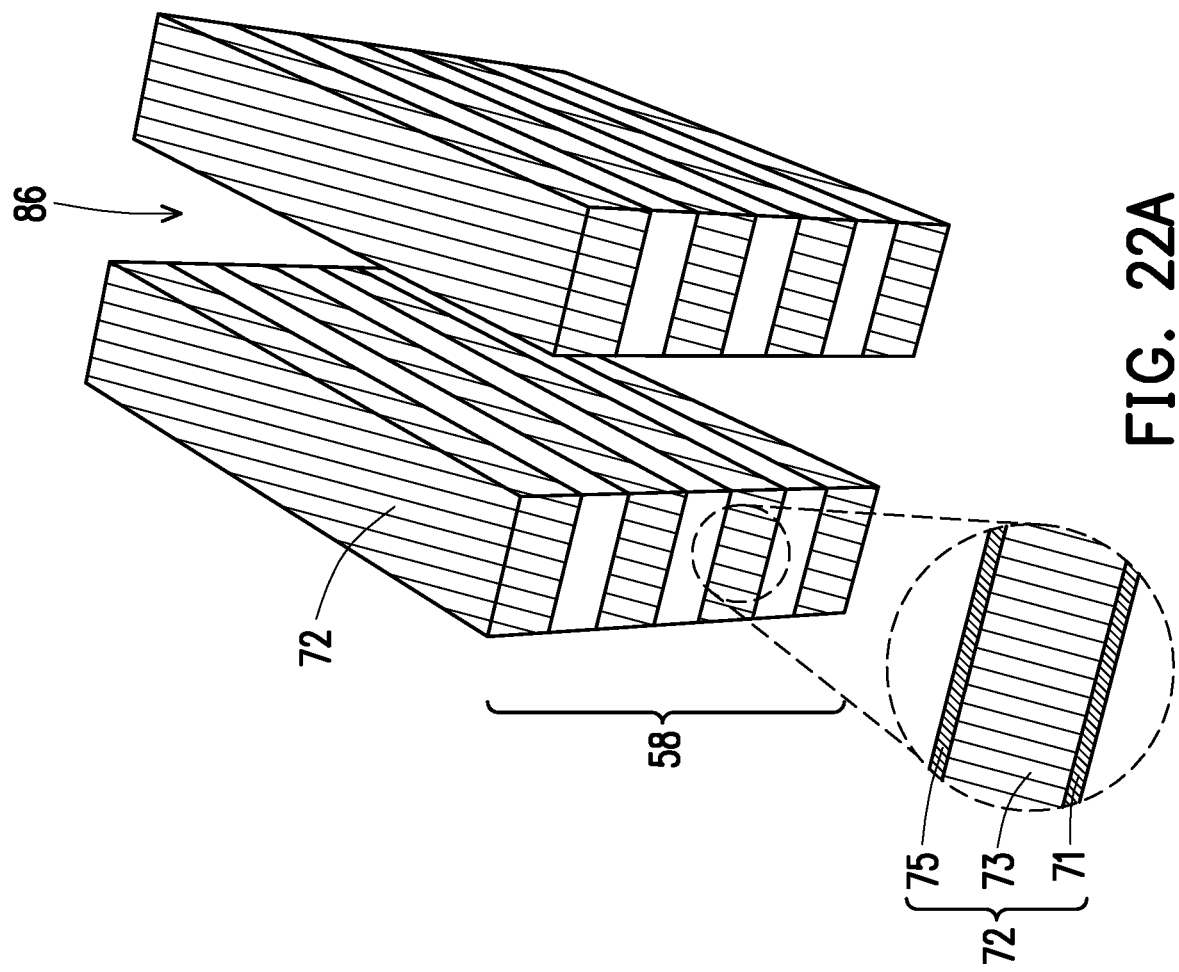
Figure 22B:
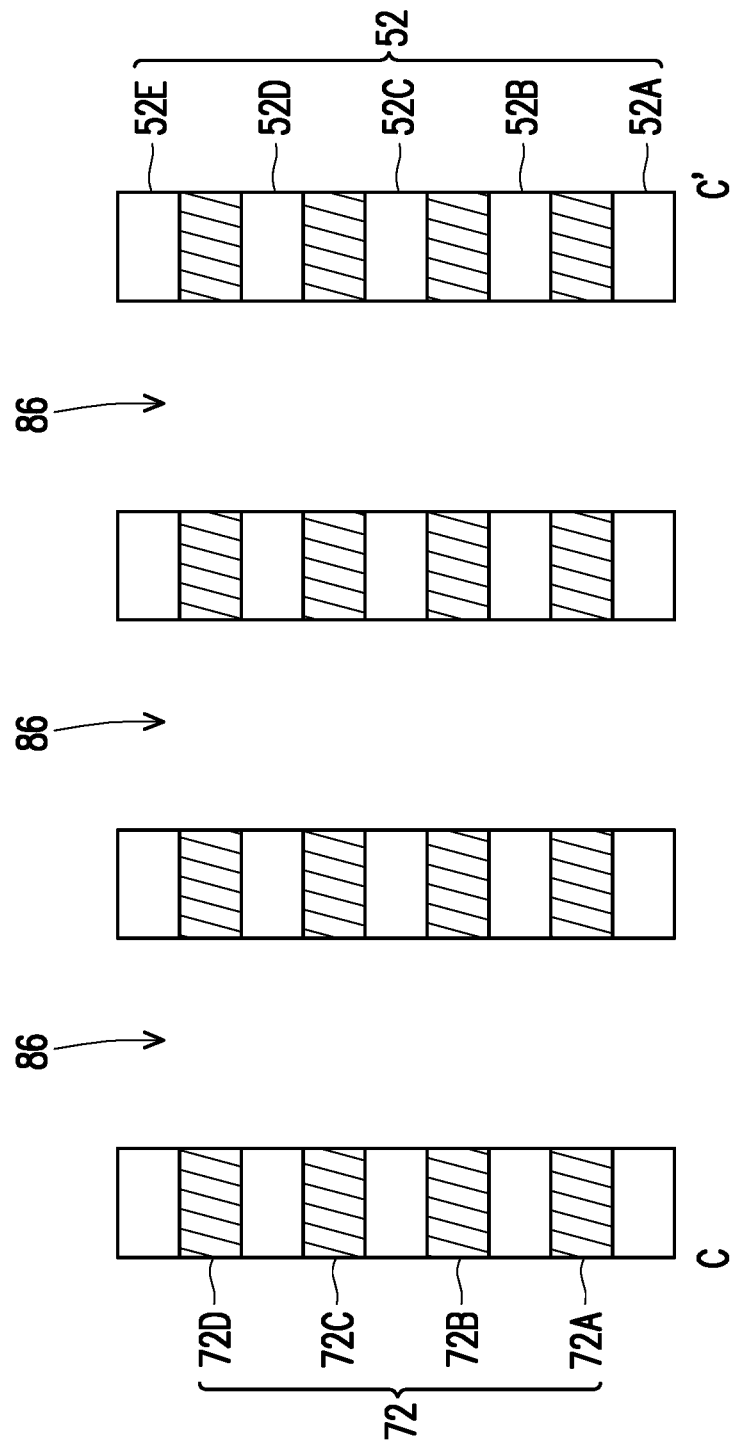

As illustrated in FIGS. 22A and FIG. 22B, the sacrificial layers 53A-53D (collectively referred to as sacrificial layers 53) are replaced with conductive lines 72A-72D (collectively referred to as conductive lines 72). In some embodiments, the sacrificial layers 53 are removed by an acceptable process, such as a wet etching process, a dry etching process or both. Thereafter, conductive lines 72 are filled into the space between two adjacent dielectric layers 52. As shown in the local enlarged view, each conductive line 72 includes two barrier layers 71 and 75 and a metal layer 73 between the barrier layers 71 and 75. In some embodiments, a barrier layer is disposed between the metal layer 73 and the adjacent dielectric layer 52. The barrier layers may prevent the metal layer from diffusion to the adjacent dielectric layers 52. The barrier layers may also provide the function of increasing the adhesion between the metal layer and the adjacent dielectric layers, and may be referred to as glue layers in some examples. In some embodiments, both barrier layers and glue layers with different materials are provided as needed. The barrier layers 71 and 75 are formed of a first conductive material, such as a metal nitride, such as titanium nitride, tantalum nitride, molybdenum nitride, zirconium nitride, hafnium nitride, or the like. The metal layer 73 may are formed of a second conductive material, such as a metal, such as tungsten, ruthenium, molybdenum, cobalt, aluminum, nickel, copper, silver, gold, alloys thereof, or the like. The barrier layers 71, 75 and metal layer 73 may each be formed by an acceptable deposition process such as CVD, PVD, ALD, PECVD, or the like. The barrier layers 71, 75 and the metal layer 73 are further deposited on the sidewalls of the multi-layer stack 58 (word line stack) and fill in the trenches 86. Thereafter, the barrier layers 71, 75 and the metal layer 73 in the trenches 86 are removed by an etching back process. An acceptable etch back process may be performed to remove excess materials from the sidewalls of the dielectric layers 52 and the bottom surfaces of the trenches 86. The acceptable etch back process includes a dry etch (e.g., RIE, NBE, the like), a wet etch, the like, or a combination thereof. The acceptable etch back process may be anisotropic.

In some embodiments, upon the replacement process, the sacrificial layers 53 of the strip-shaped staircase structures are subsequently replaced with conductive lines 72 (see FIG. 1A) in the multi-layer stack 58 (word line stack).

Figure 23A:
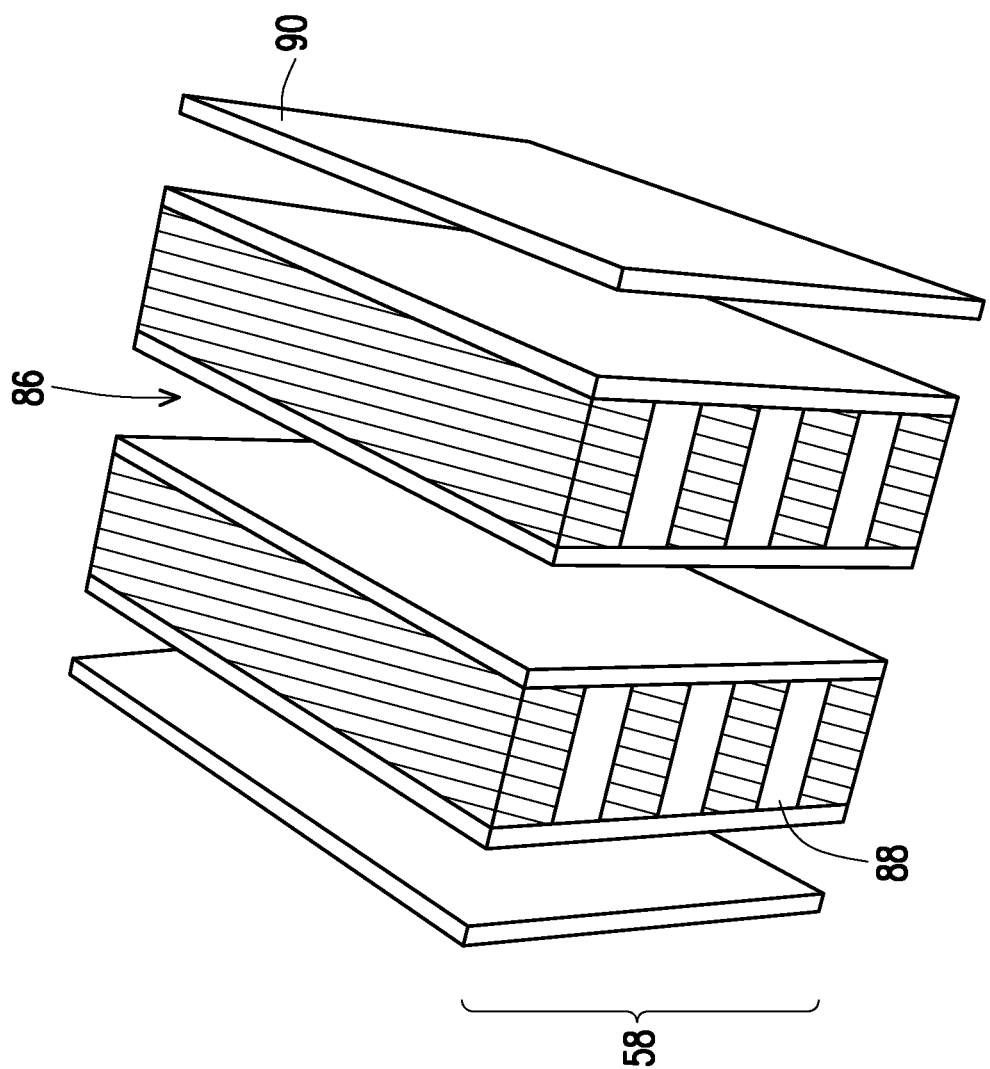

FIG. 23A through FIG. 28B illustrate forming and patterning channel regions for the memory cells 202 (see FIG. 1A) in the trenches 86. FIGS. 23A, 24A and 28A are illustrated in a partial three-dimensional view. In FIGS. 23B, 24B, 25, 26, 227 and 28B cross-sectional views are provided along line C-C' of FIG. 1A. As illustrated in FIG. 23A through FIG. 26, a dielectric layer 90 (ferroelectric layer), a channel material layer 92 (oxide semiconductor layer), and a dielectric material 98A are deposited in the trenches 86.

Figure 23B:
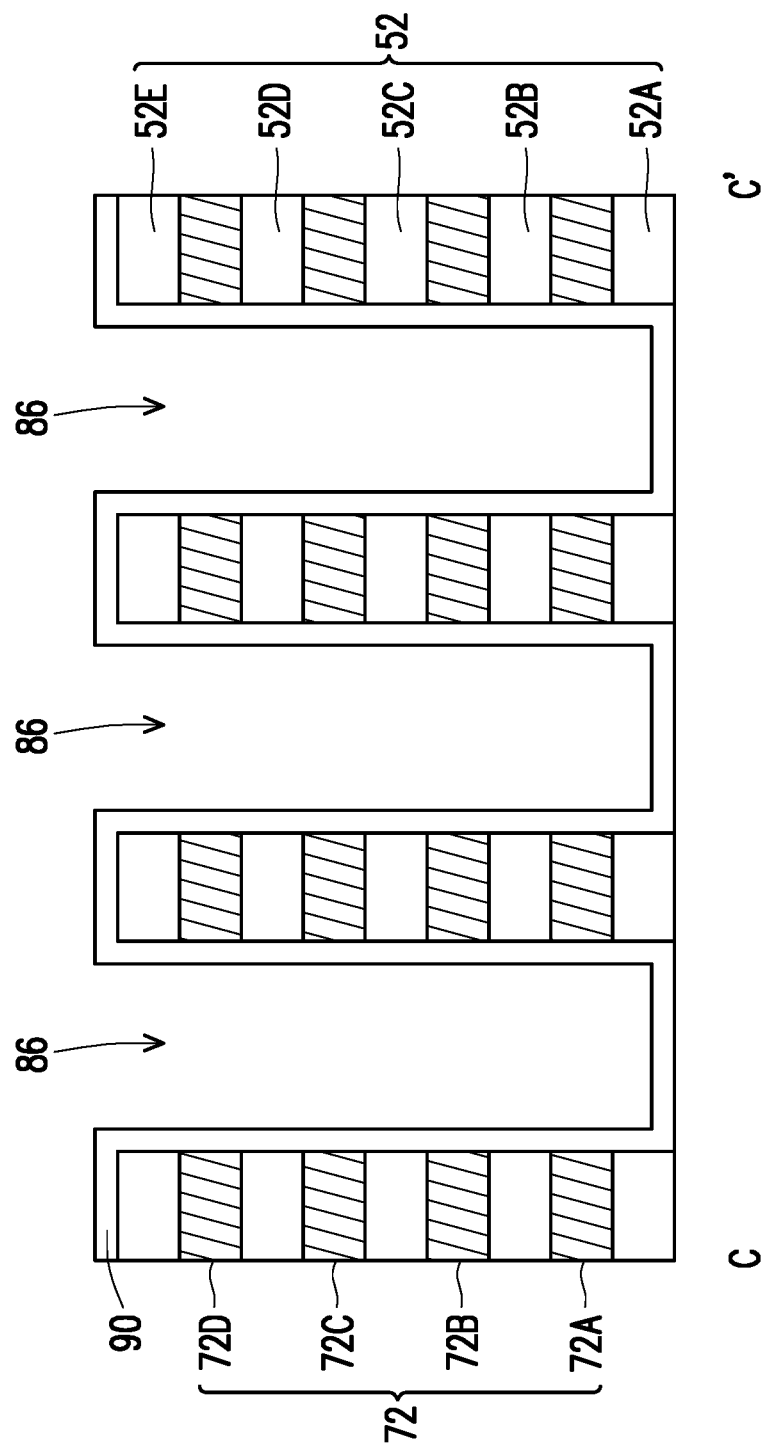

As illustrated in FIG. 23A and FIG. 23B, a dielectric layer 90 (or ferroelectric layer) may be deposited conformally in the trenches 86 along sidewalls of the conductive lines 72, sidewalls of the dielectric layers 52, over top surfaces of the dielectric layer 52E and along the bottom surfaces of the trenches 86. In some embodiments, a dielectric layer 90 (or ferroelectric layer) may be further deposited on the IMD 70 and along the sidewall of each step of the staircase structure in the staircase region. The dielectric layer 90 (or ferroelectric layer) may include materials that are capable of switching between two different polarization directions by applying an appropriate voltage differential across the dielectric layer 90. For example, the dielectric layer 90 includes a high-k dielectric material, such as a hafnium (Hf) based dielectric materials or the like. In some embodiments, the dielectric layer 90 includes hafnium oxide, hafnium zirconium oxide, silicon-doped hafnium oxide, or the like.

n some other embodiments, the dielectric layer 90 may include barium titanium oxide ($BaTiO_3$), lead titanium oxide (PbTiO$_3$), lead zirconium oxide (PbZrO$_3$), lithium niobium oxide (LiNbO$_3$), sodium niobium oxide (NaNbO$_3$), potassium niobium oxide (KNbO$_3$), potassium tantalum oxide (KTaO$_3$), bismuth scandium oxide (BiScO$_3$), bismuth iron oxide (BiFeO$_3$), hafnium erbium oxide (Hf$_{1-x}$Er$_x$O), hafnium lanthanum oxide (Hf$_{1-x}$La$_x$O), hafnium yttrium oxide (Hf$_{1-x}$Y$_x$O), hafnium gadolinium oxide (Hf$_{1-x}$Gd$_x$O), hafnium aluminum oxide (Hf$_{1-x}$Al$_x$O), hafnium zirconium oxide (Hf$_{1-x}$Zr$_x$O, HZO), hafnium titanium oxide (Hf$_{1-x}$Ti$_x$O), hafnium tantalum oxide (Hf$_{1-x}$Ta$_x$O), or the like. In some embodiments, the dielectric layer 90 may include different ferroelectric materials or different types of memory materials. For example, in some embodiments, the dielectric layer 90 is a non-ferroelectric material, such as a multilayer memory structure including a layer of SiN$_x$ between two SiO$_x$ layers (e.g., an ONO structure). In some embodiments, the method of forming the dielectric layer 90 includes performing a suitable deposition technique, such as CVD, PECVD, metal oxide chemical vapor deposition (MOCVD), ALD, remote plasma ALD (RPALD), plasma enhanced ALD (PEALD), molecular beam deposition (MBD) or the like.

In some embodiments, the dielectric layer 90 has a thickness of about 1-20 nm, such as 5-10 nm. Other thickness ranges (e.g., more than 20 nm or 5-15 nm) may be applicable. In some embodiments, the dielectric layer 90 is formed in a fully amorphous state. In alternative embodiments, the dielectric layer 90 is formed in a partially crystalline state; that is, the dielectric layer 90 is formed in a mixed crystalline-amorphous state and having some degree of structural order. In yet alternative embodiments, the dielectric layer 90 is formed in a fully crystalline state. In some embodiments, the dielectric layer 90 is a single layer. In alternative embodiments, the dielectric layer 90 is a multi-layer structure.

In some embodiments, an annealing process is performed to the dielectric layer 90. In some embodiments, upon the annealing process, the dielectric layer 90 is transformed from an amorphous state to a partially or fully crystalline sate. In alternative embodiments, upon the annealing process, the dielectric layer 90 is transformed from a partially crystalline state to a fully crystalline sate.

Figure 24A:
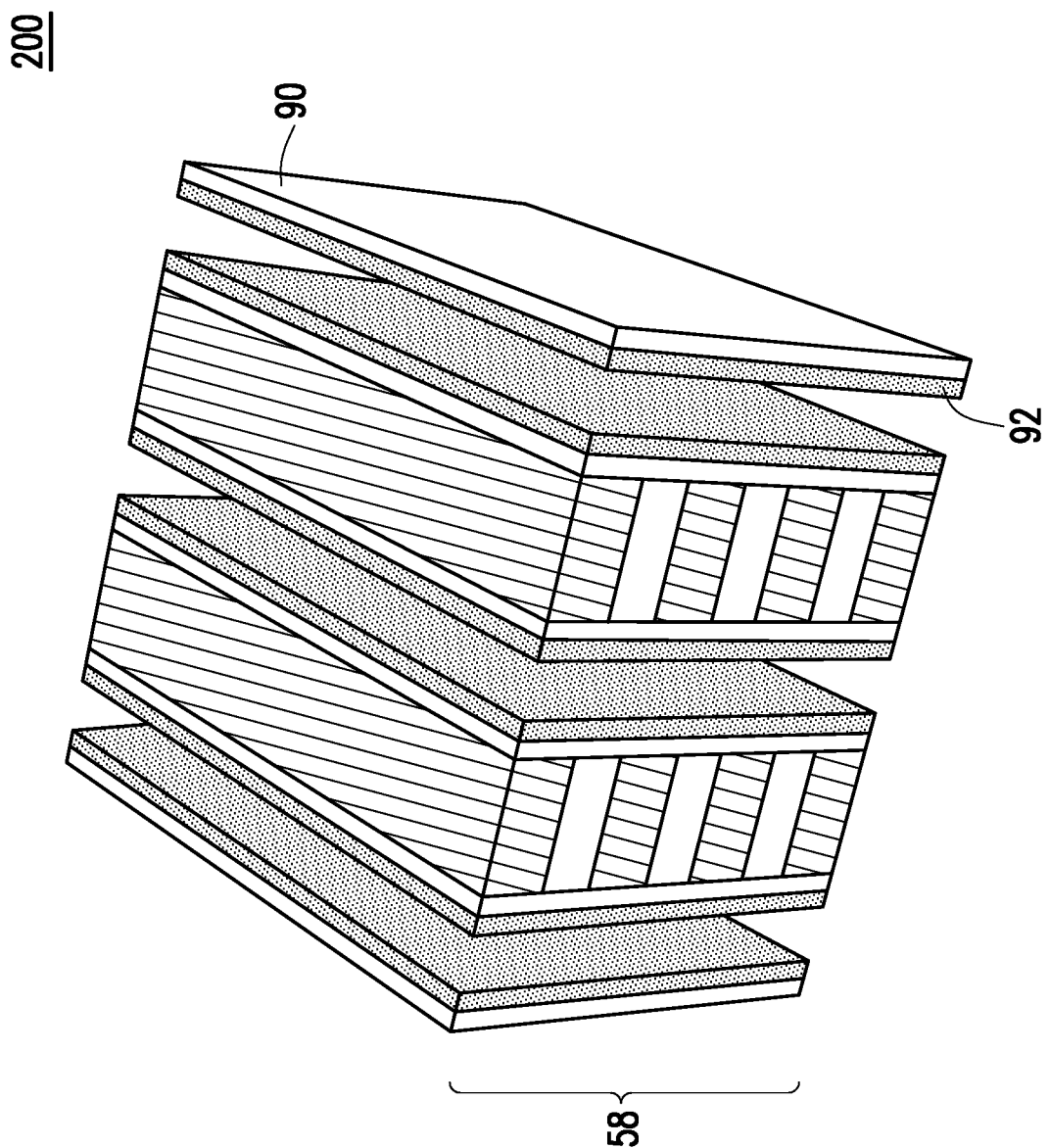
Figure 24B:
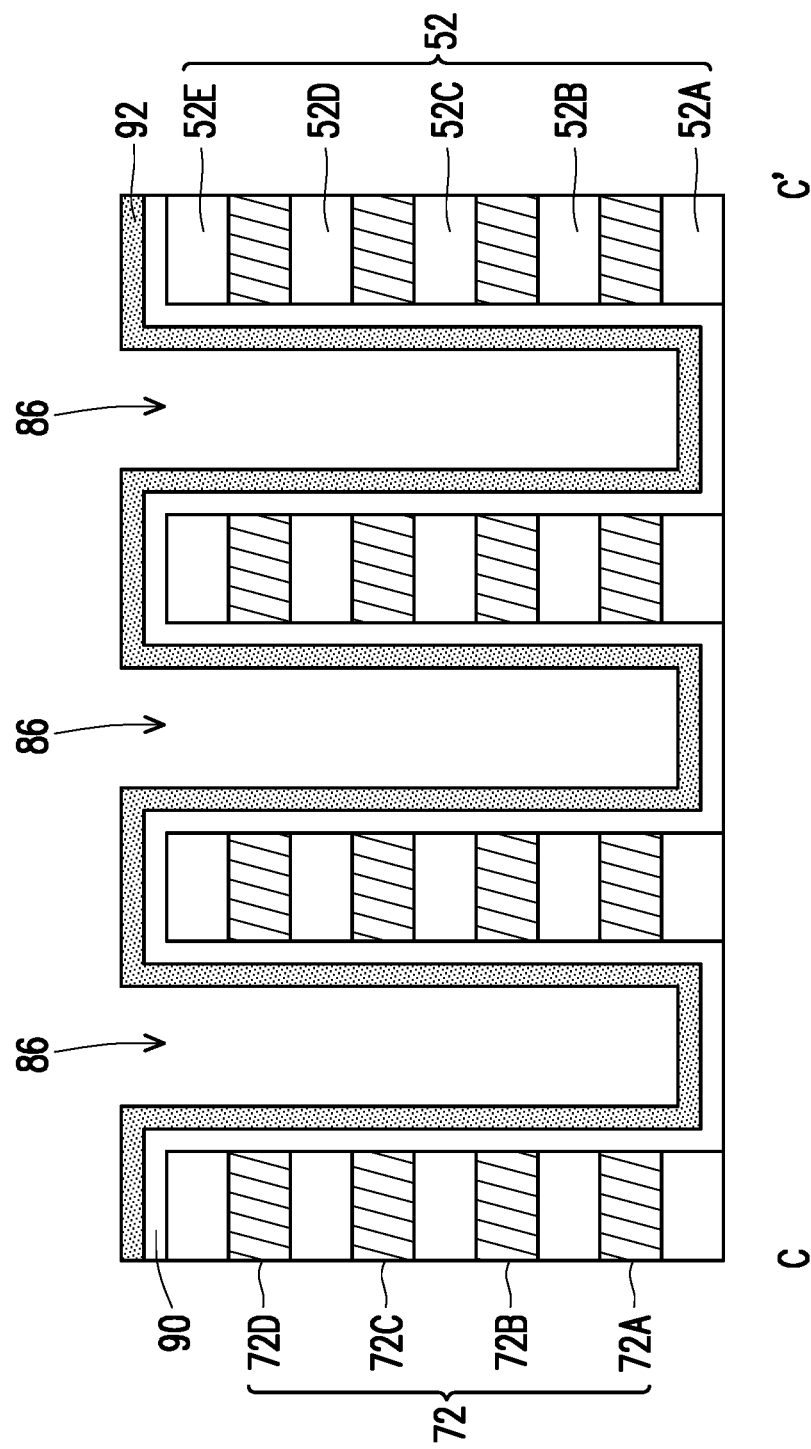

As illustrated in FIG. 24A and FIG. 24B, a channel material layer 92 is conformally deposited in the trenches 86 over the dielectric layer 90. The channel material layer 92 includes materials suitable for providing channel regions for the memory cells 202 (see FIG. 1A). For example, the channel material layer 92 includes oxide semiconductor (OS) such as zinc oxide (ZnO), indium tungsten oxide (InWO), indium gallium zinc oxide (InGaZnO, IGZO), indium zinc oxide (InZnO), indium tin oxide (ITO), combinations thereof, or the like. The channel material layer 92 may be deposited by CVD, PVD, ALD, PECVD, or the like. The channel material layer 92 may extend along sidewalls and bottom surfaces of the trenches 86 over the dielectric layer 90. In some embodiments, the channel material layer 92 may be further deposited on the IMD 70 and along the sidewall of each step of the staircase structure in the staircase region.

Figure 25:
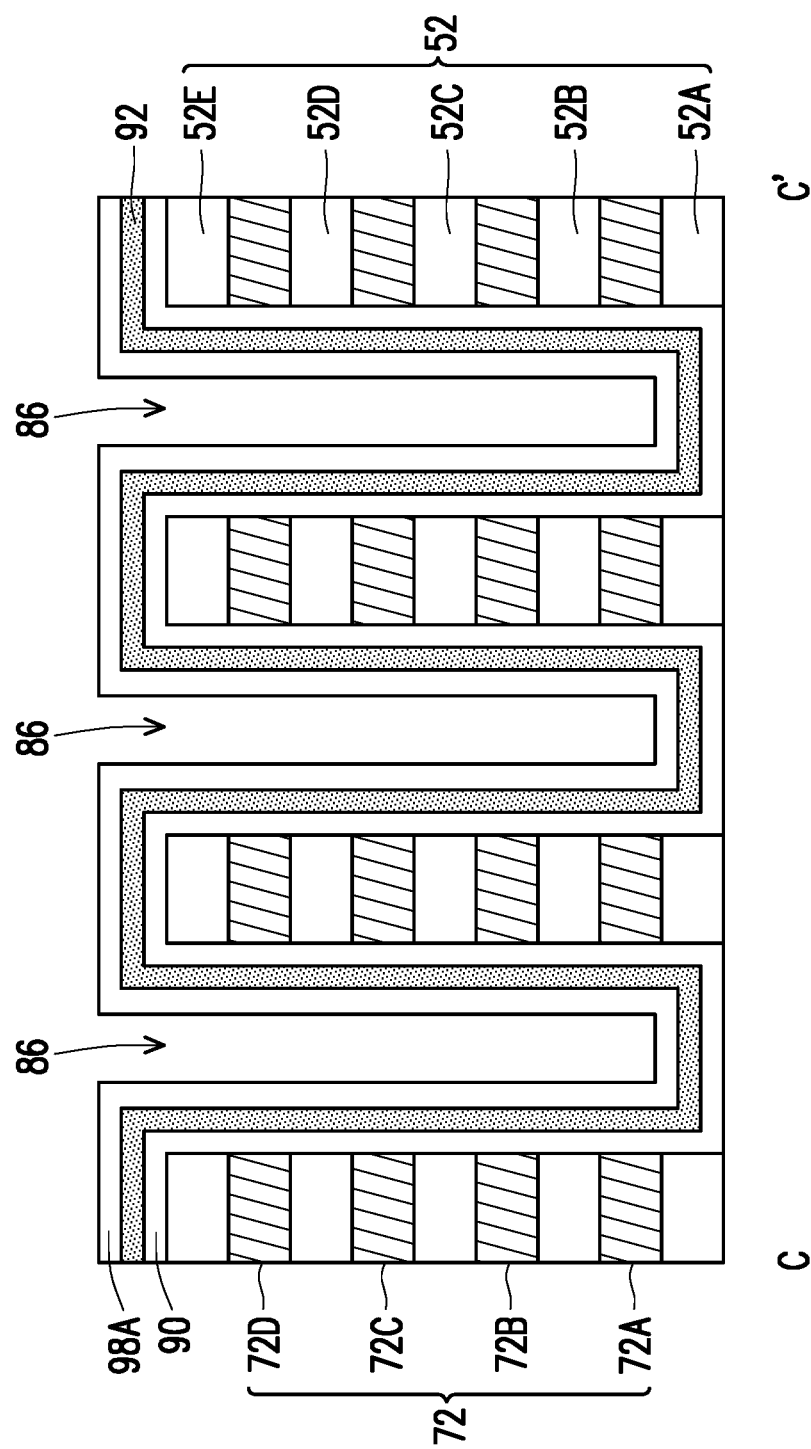

As illustrated in FIG. 25, in a subsequent step, a dielectric material 98A is deposited in the trenches 86 over the channel material layer 92. In some embodiments, the dielectric material 98A includes silicon oxide, silicon nitride, silicon oxynitride, or the like, which may be deposited by CVD, PVD, ALD, PECVD, or the like. The dielectric material 98A may extend along sidewalls and bottom surfaces of the trenches 86 over the channel material layer 92. In some embodiments, the dielectric material 98A is optional and may be omitted as needed.

Figure 26:
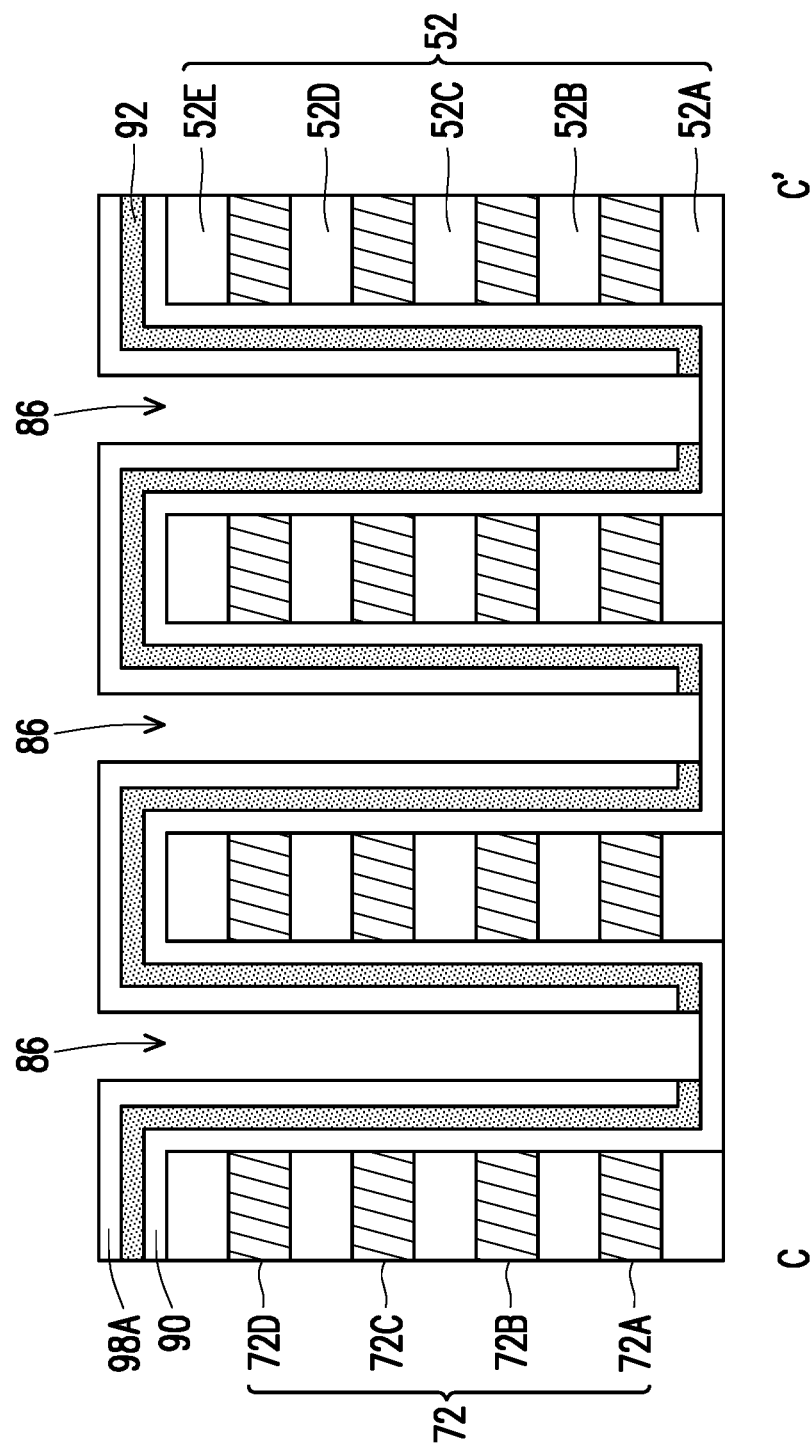

As illustrated in FIG. 26, bottom portions of the dielectric material 98A and the channel material layer 92 are removed in the trenches 86. The removal process includes an acceptable etching process, such as a dry etch (e.g., RIE, NBE, the like), a wet etch, the like, or a combination thereof. The etching may be anisotropic. Accordingly, the remaining dielectric material 98A and the channel material layer 92 may expose portions of the dielectric layer 90 on bottom surfaces of the trenches 86. Thus, portions of the channel material layer 92 on opposing sidewalls of the trenches 86 may be separated from each other, which improves isolation between the memory cells 202 of the memory structure 200 (see FIG. 1A).

Figure 27:
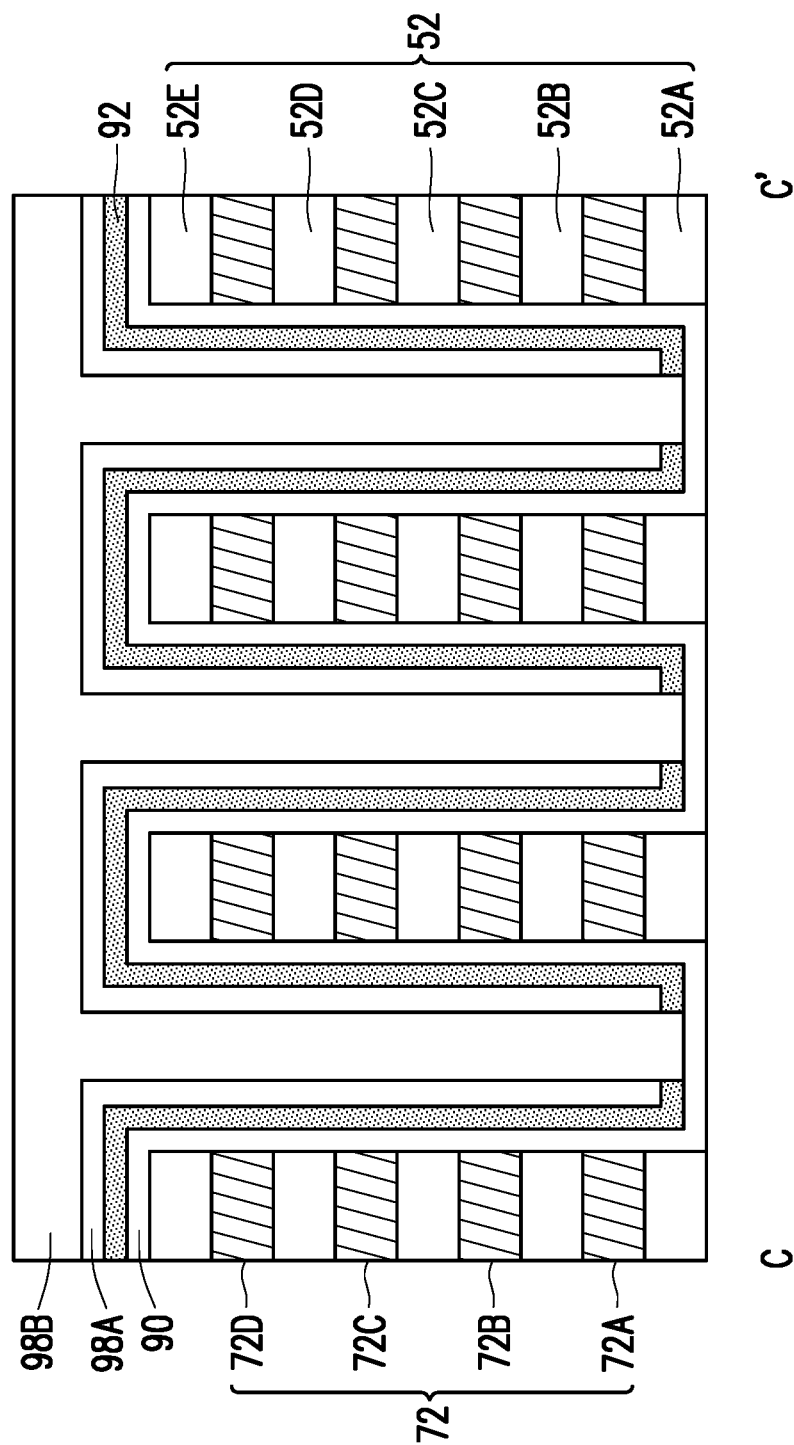

As illustrated in FIG. 27, a dielectric material 98B is deposited to completely fill the trenches 86. The dielectric material 98B may be formed of one or more materials and by processes the same as or similar to those of the dielectric material 98A. In some alternative embodiments, the dielectric material 98B and the dielectric material 98A include different materials.

Figure 28A:
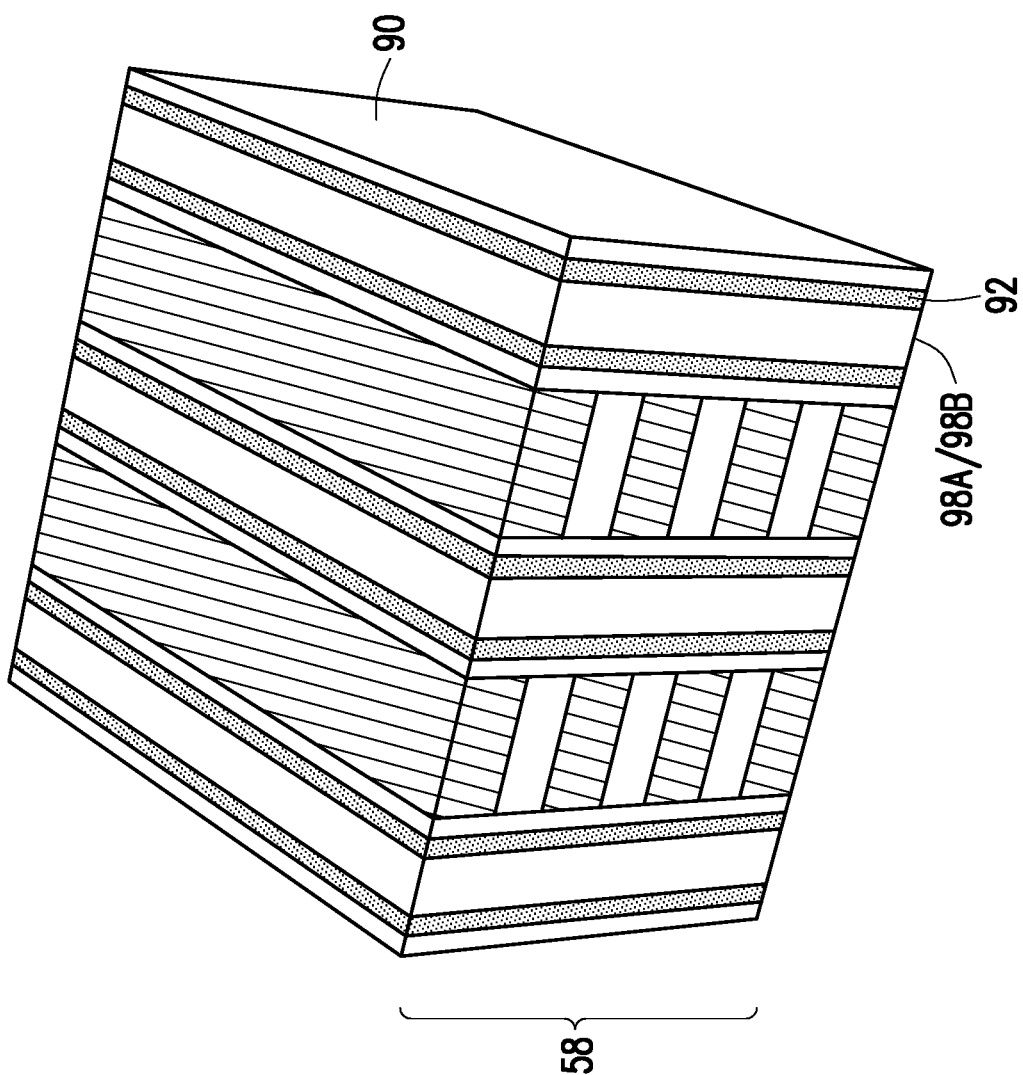
Figure 28B:
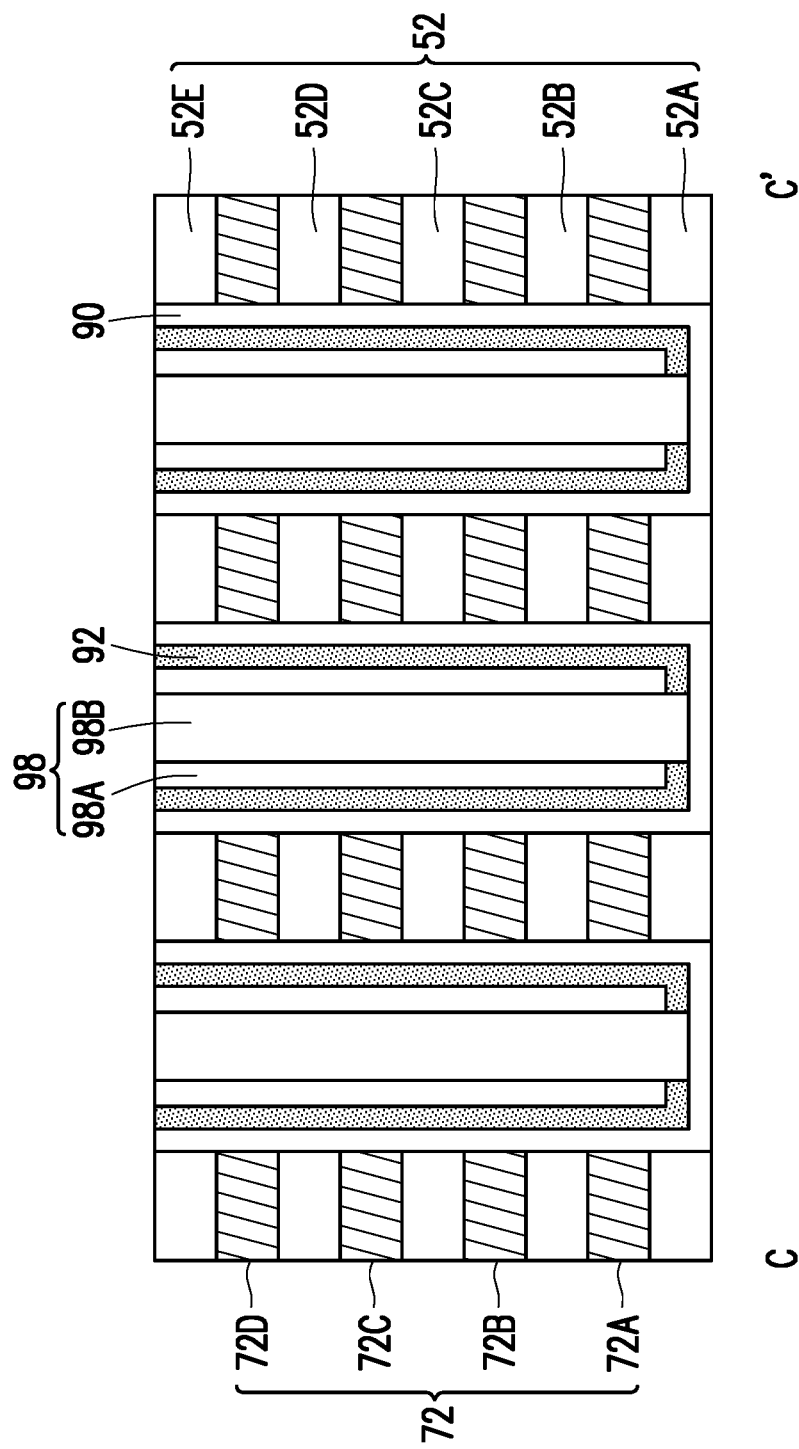

As illustrate in FIG. 28A and FIG. 28B, a removal process is applied to the dielectric materials 98A/98B, the channel material layer 92, and the dielectric layer 90 to remove excess materials over the multi-layer stack 58 (word line stack). In some embodiments, a planarization process such as a CMP, an etch-back process, combinations thereof, or the like may be utilized. The planarization process exposes the multi-layer stack 58 (word line stack) such that top surfaces of the multi-layer stack 58 (e.g., the dielectric layer 52E), the dielectric layer 90, the channel material layer 92, the dielectric materials 98A/98B, and the IMD 70 (in the staircase region) are leveled after the planarization process is completed.

Figure 30A:
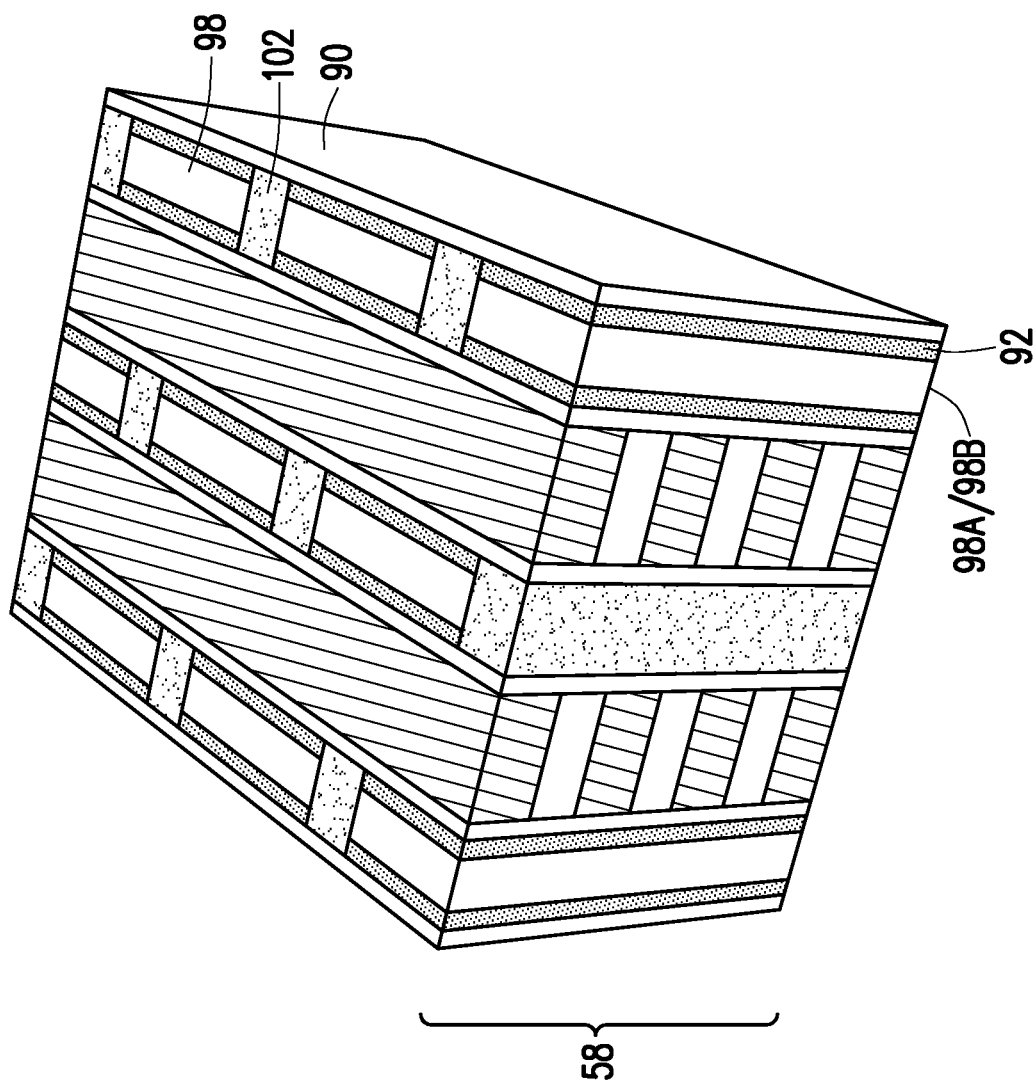
Figure 30B:
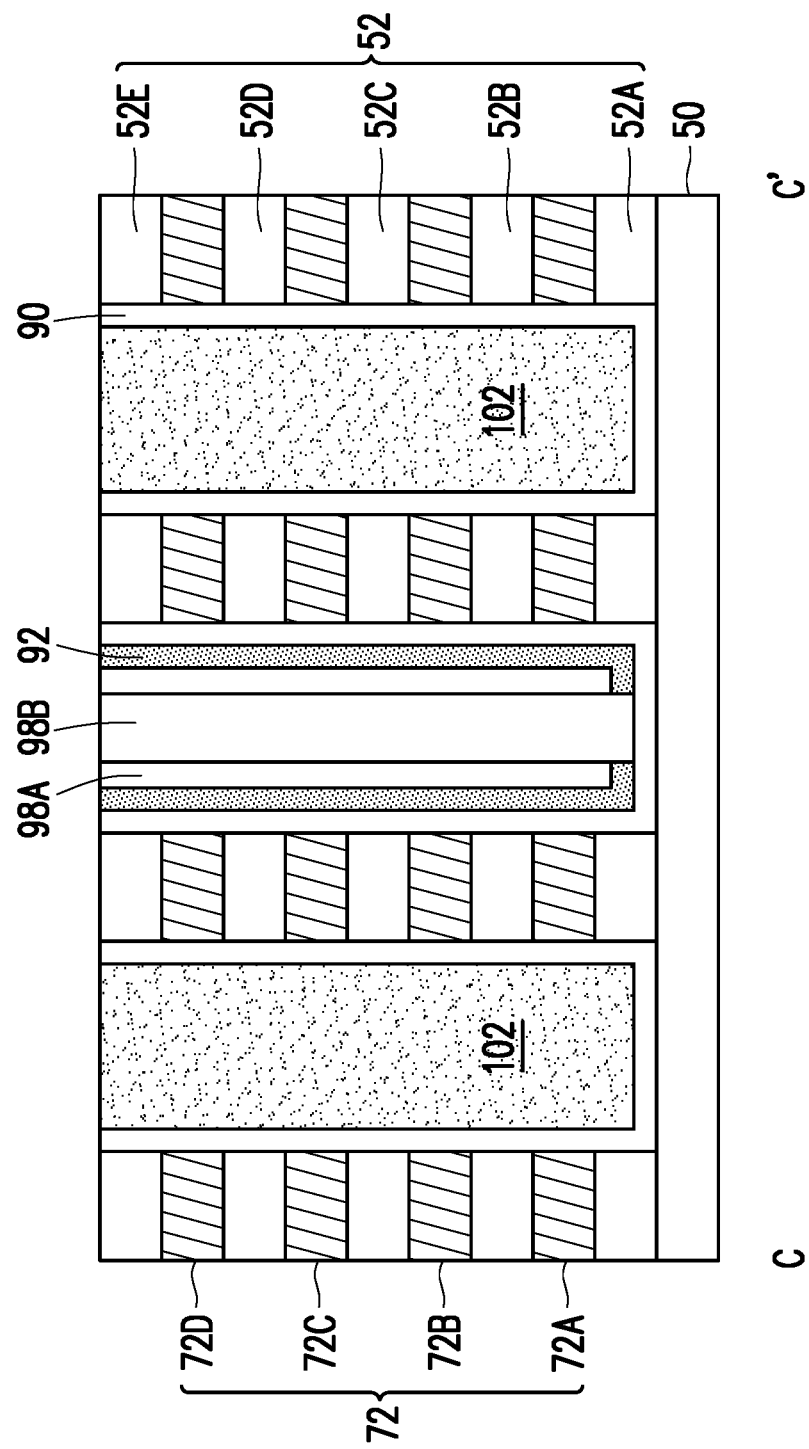
Figure 31A:
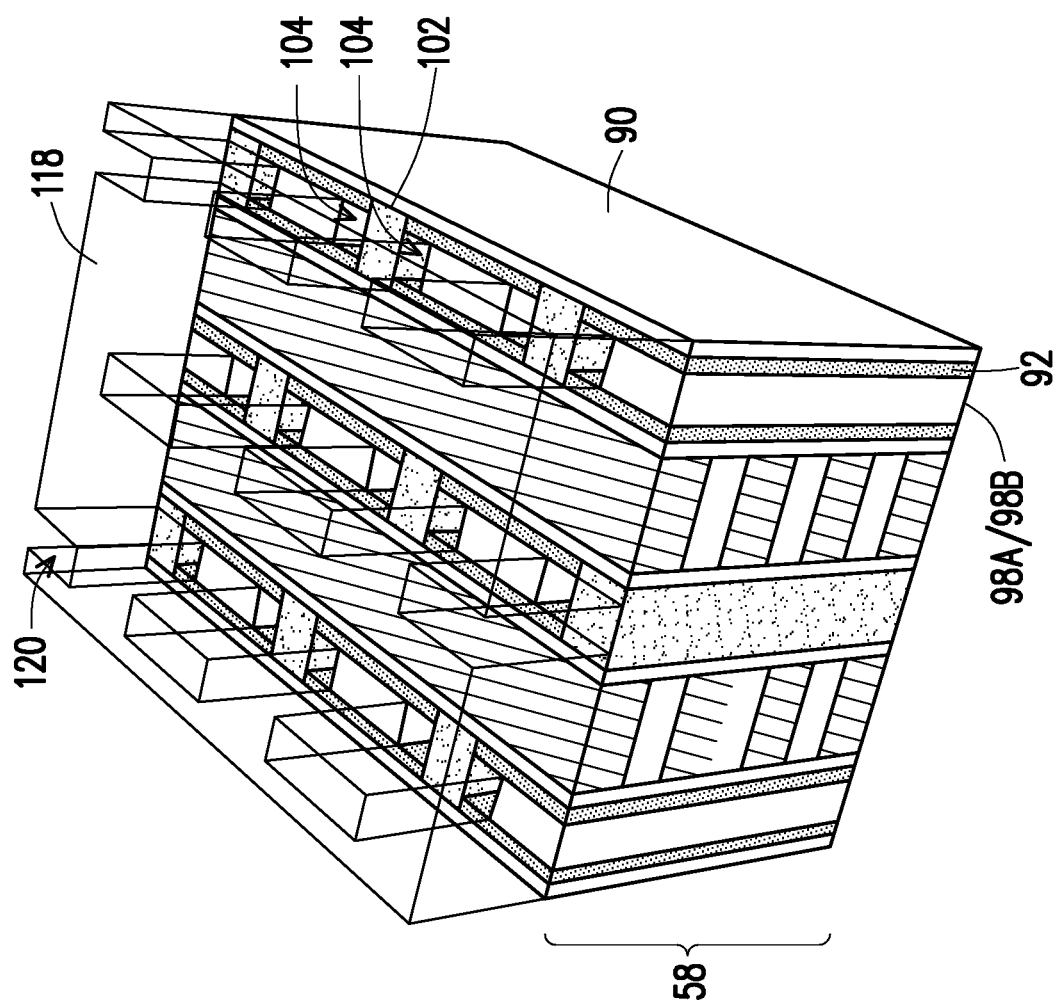
Figure 31B:
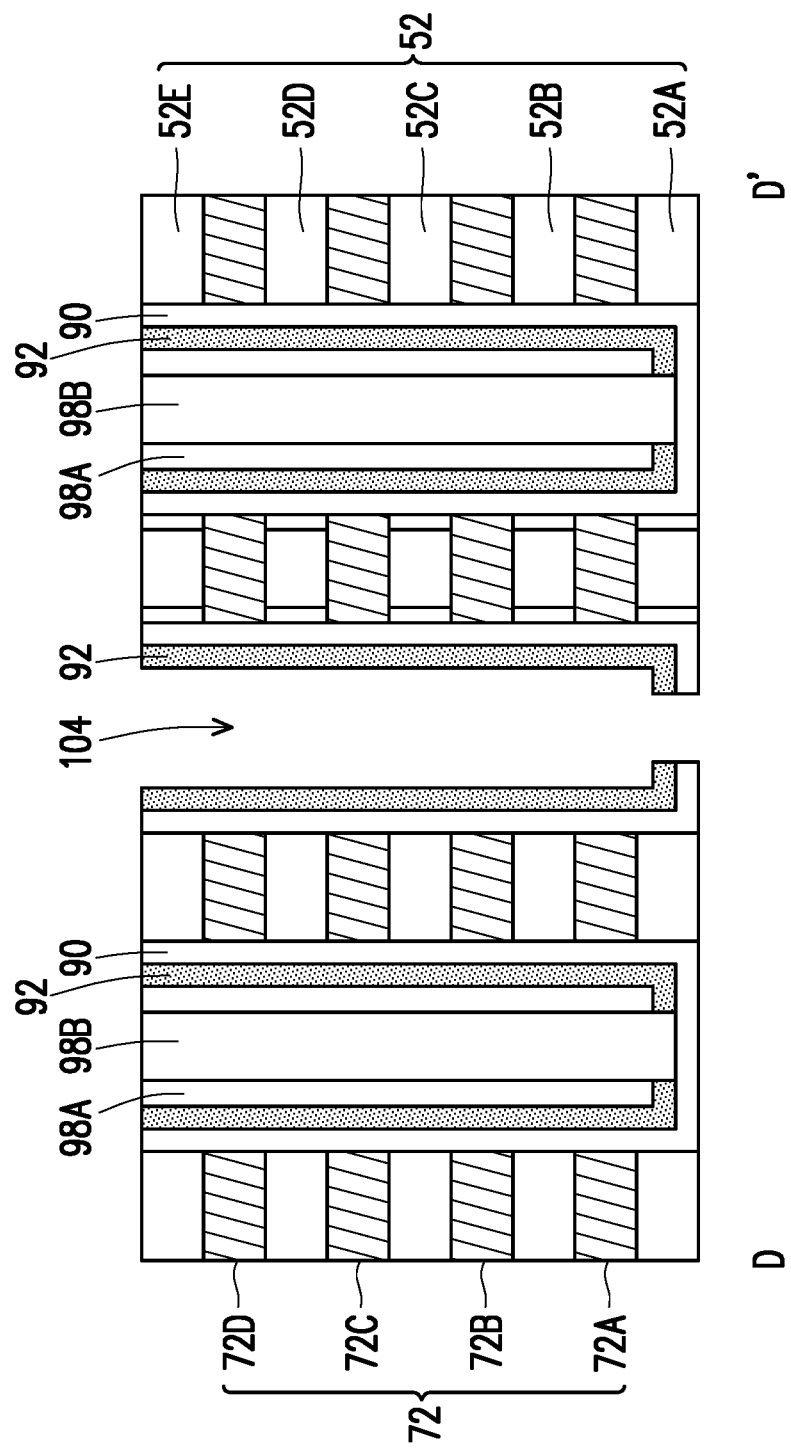
Figure 32A:
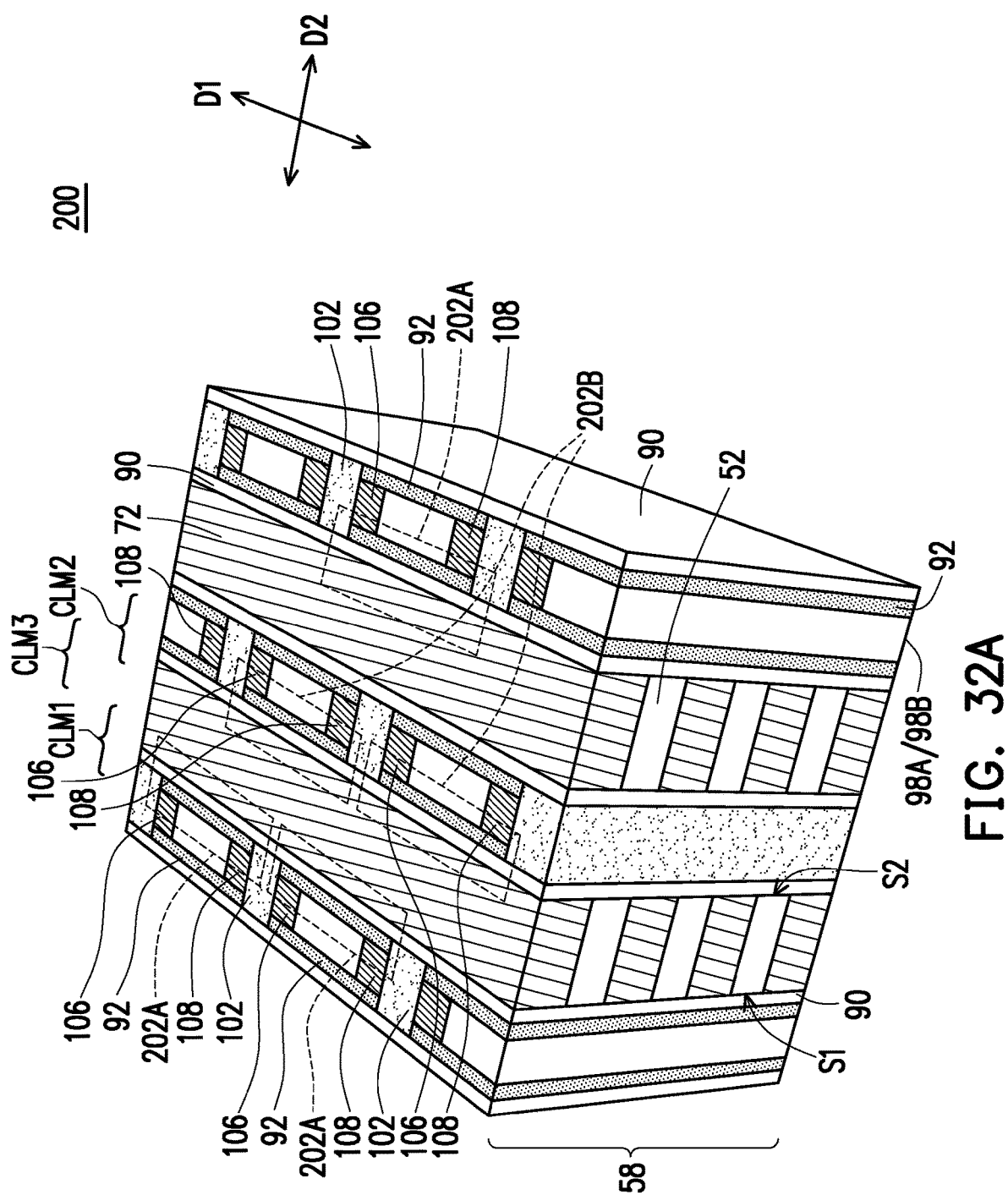
Figure 32B:
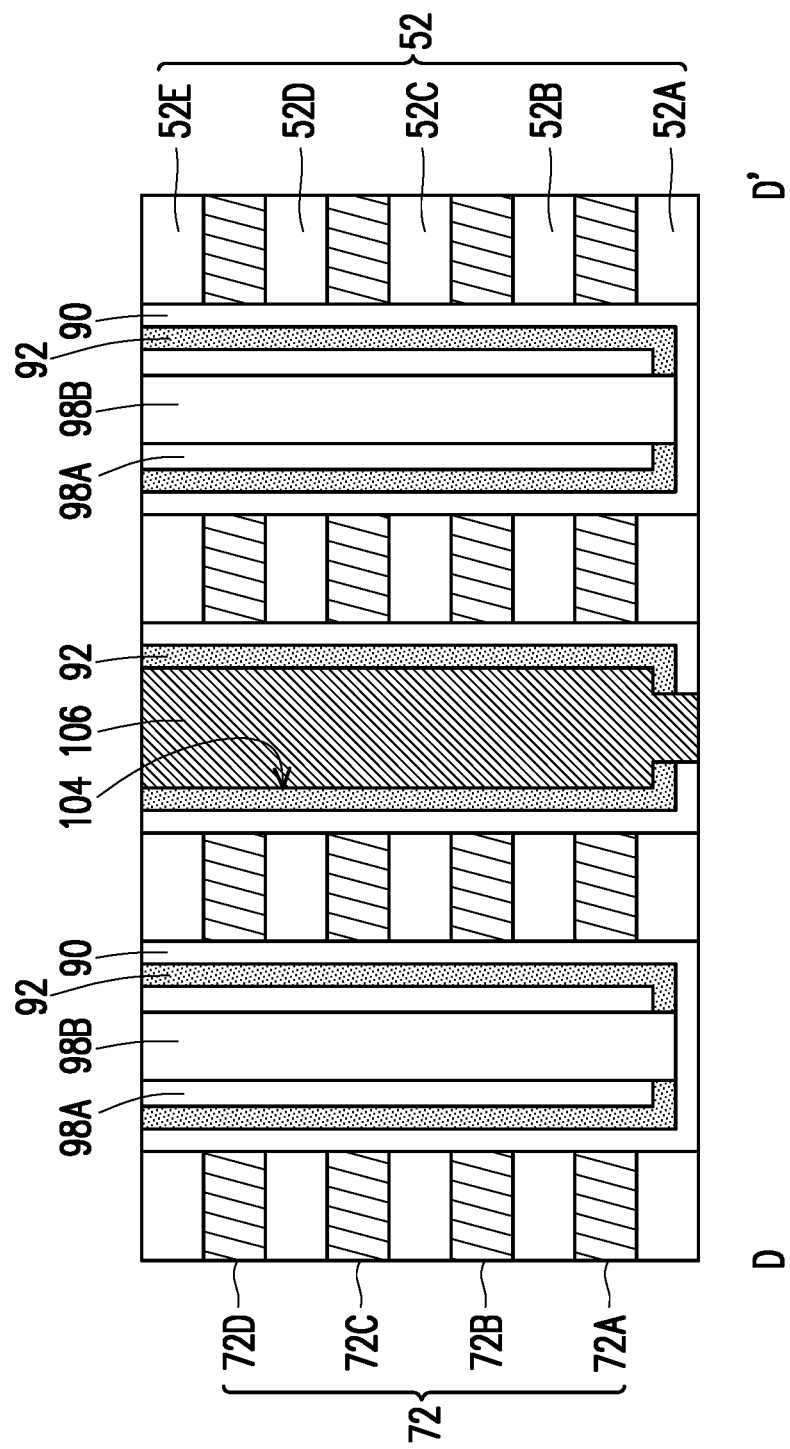
Figure 32C:
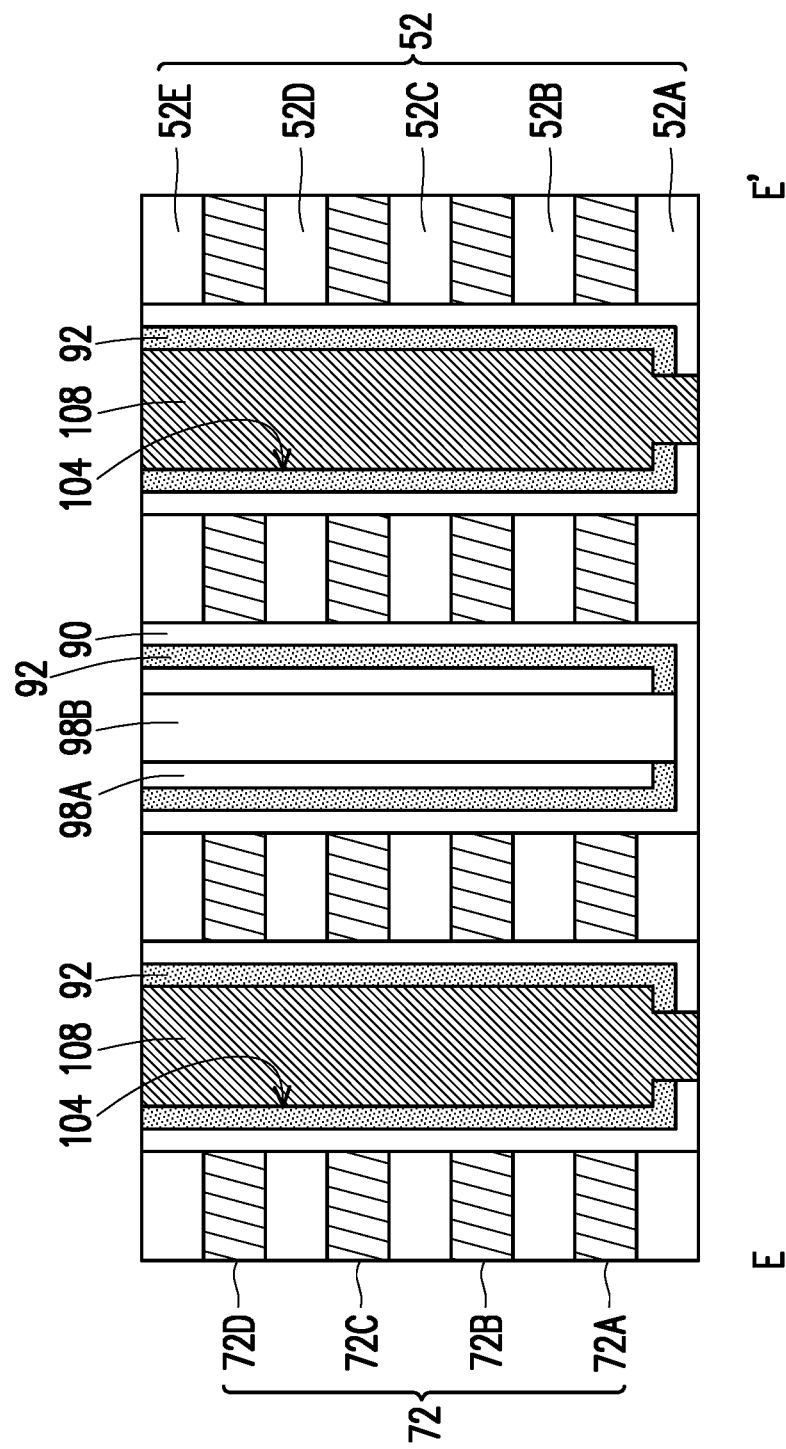

FIG. 29A through FIG. 32C illustrate intermediate steps of manufacturing conductive pillars 106 and 108 (source/drain regions, e.g. first semiconductor regions 106 and second semiconductor regions 108) in the memory structure 200. The conductive pillars 106 and 108 (first and second semiconductor regions 106 and 108) may extend along a direction perpendicular to the conductive lines 72 such that individual cells of the memory structure 200 may be selected for read and write operations. FIGS. 29A, 30A, 31A and 32A are illustrated in a partial three-dimensional view. In FIGS. 29B and 30B, cross-sectional views are provided along line C-C' of FIG. 1A. In FIGS. 31B and 32B, cross-sectional views are provided along line D-D' of FIG. 1A. In FIG. 32C, a cross-sectional view is provided along line E-E' of FIG. 1A.

Figure 29A:
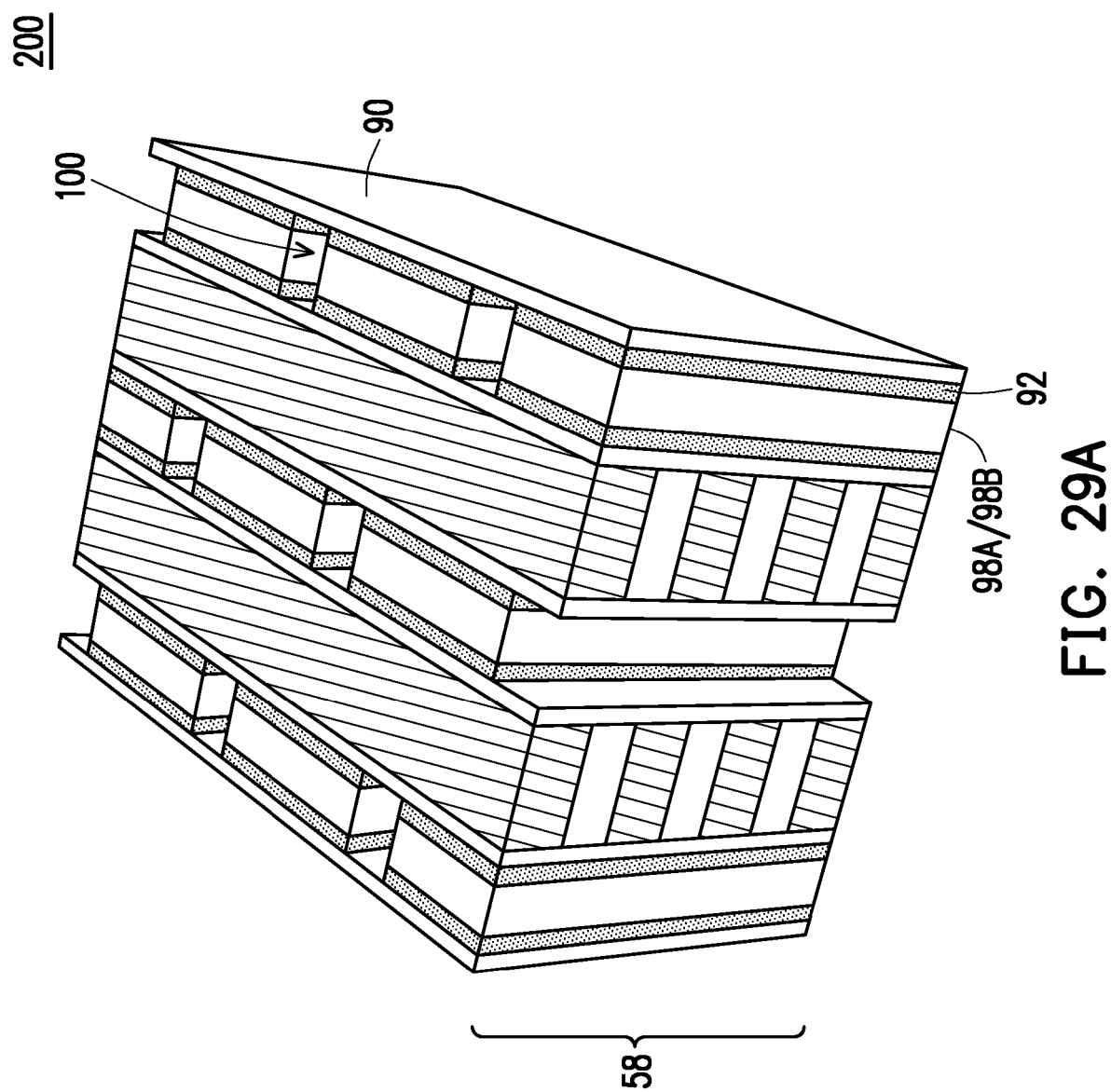
Figure 29B:
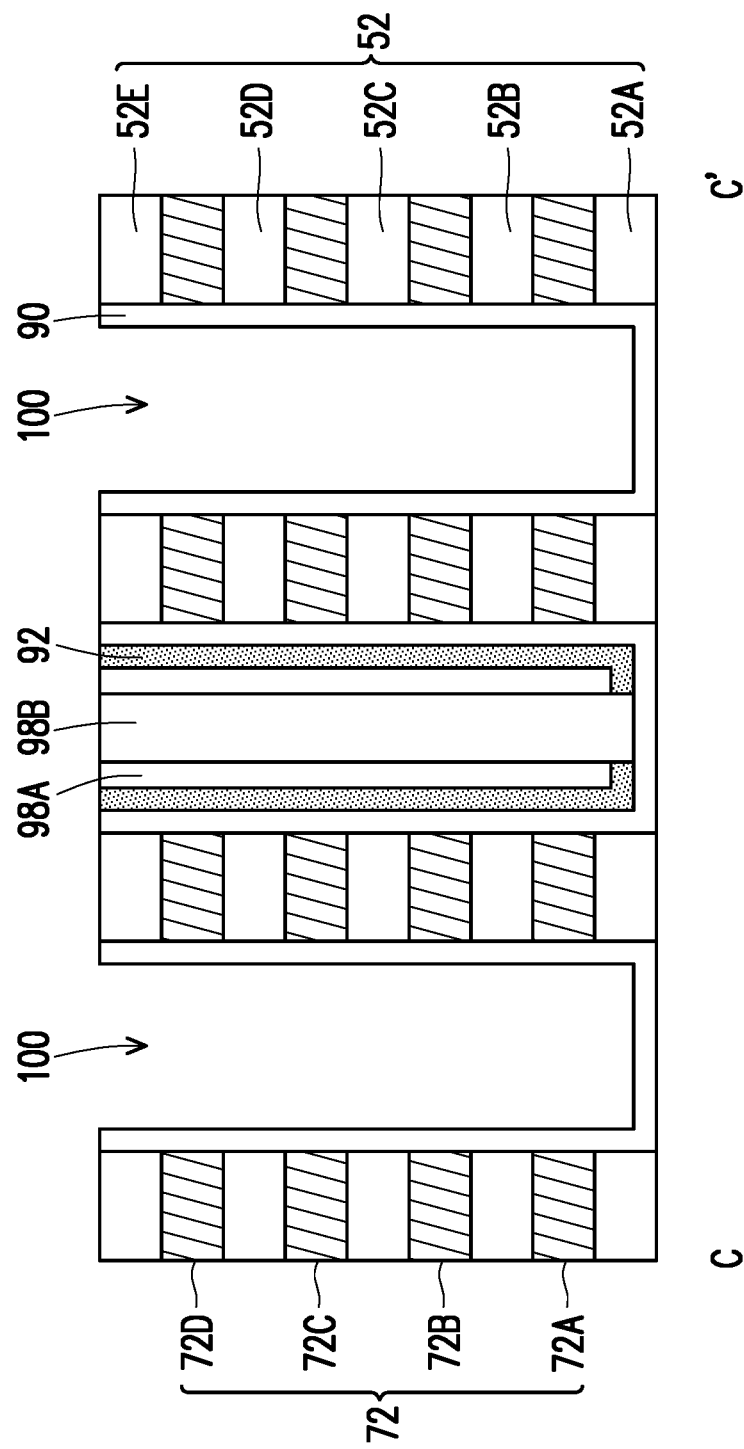

As illustrated in FIGS. 29A and 29B, trenches 100 are patterned through the channel material layer 92 and the dielectric materials 98A/98B. For example, the dielectric materials 98A/98B are patterned to form dielectric pillars separated by the trenches 100. Patterning the trenches 100 may be performed through a combination of photolithography and etching, for example. The trenches 100 may be disposed between opposing sidewalls of the dielectric layer 90, and the trenches 100 may physically separate adjacent stacks of memory cells in the memory structure 200 (see FIG. 1A).

As illustrated in FIGS. 30A and 30B, isolation pillars 102 are formed in the trenches 100. In some embodiments, an isolation layer is deposited over the multi-stack 58 filling in the trenches 100. The isolation layer may include, for example, silicon oxide, silicon nitride, silicon oxynitride, or the like, which may be deposited by CVD, PVD, ALD, PECVD, or the like. The isolation layer may extend along sidewalls and bottom surfaces of the trenches 100 over the channel material layer 92. After deposition, a planarization process (e.g., a CMP, etch back, or the like) may be performed to remove excess portions of the isolation layer to form the isolation pillars 102. In the resulting structure, top surfaces of the multi-layer stack 58 (e.g., dielectric layer 52E), the dielectric layer 90, the channel material layer 92, and the isolation pillars 102 may be substantially leveled (e.g., within process variations). In some embodiments, the isolation pillars 102 have a staggered arrangement. In some embodiments, materials of the dielectric materials 98A/98B and isolation pillars 102 may be selected so that they may be etched selectively relative to each other. For example, in some embodiments, the dielectric materials 98A/98B include oxide and the isolation pillars 102 include nitride. In some embodiments, the dielectric materials 98A/98B (or dielectric pillars) include nitride and the isolation pillars 102 include oxide. Other materials are also possible.

As illustrated in FIG. 31A and FIG. 31B, trenches 104 are defined for the subsequently formed conductive pillars 106 and 108 (the first and second semiconductor regions 106 and 108). For example, the dielectric materials 98A/98B (or dielectric pillars) are further patterned to define the trenches 104. The trenches 104 are formed by patterning the dielectric materials 98A/98B (or dielectric pillars) with a combination of photolithography and etching, for example. In some embodiments, as shown in FIG. 31A, a photoresist 118 is formed over the multi-layer stack 58, the dielectric materials 98A/98B, the isolation pillars 102, the channel material layer 92, and the dielectric layer 90. In some embodiments, the photoresist 118 is patterned by an acceptable photolithography technique to define openings 120. Each of the openings 120 may expose the corresponding isolation pillar 102 and two separate regions of the dielectric materials 98A/98B beside the isolation pillar 102. In this way, each of the openings 120 may define a pattern of a conductive pillar 106 and an adjacent conductive pillar 108 that are separated by the isolation pillars 102.

Subsequently, portions of the dielectric materials 98A/98B (or dielectric pillars) exposed by the openings 120 may be removed by an acceptable etching process, such as by a dry etch (e.g., RIE, NBE, the like), a wet etch, the like, or a combination thereof. The etching may be anisotropic. The etching process may use an etchant that etches the dielectric materials 98A/98B without significantly etching the isolation pillars 102. As a result, even though the openings 120 expose the isolation pillars 102, the isolation pillars 102 may not be significantly removed. Patterns of the trenches 104 may correspond to the conductive pillars 106 and 108 (see FIG. 32A to FIG. 32C). After the trenches 104 are patterned, the photoresist 118 may be removed by ashing, for example.

As illustrated in FIG. 32A to FIG. 32C, the trenches 104 are filled with a conductive material to form the conductive pillars 106 and 108 (the first and second semiconductor regions 106 and 108). The conductive material may include copper, titanium, titanium nitride, tantalum, tantalum nitride, tungsten, ruthenium, aluminum, combinations thereof, or the like, which may be formed using, for example, CVD, ALD, PVD, PECVD, or the like. After the conductive material is deposited, a planarization (e.g., a CMP, etch back, or the like) may be performed to remove excess portions of the conductive material, thereby forming the conductive pillars 106 and 108. In the resulting structure, top surfaces of the multi-layer stack 58 (e.g., the dielectric layer 52E), the dielectric layer 90, the channel material layer 92, the conductive pillars 106, and the conductive pillars 108 may be substantially leveled (e.g., within process variations). In some embodiments, the conductive pillars 106 (first semiconductor region 106) correspond to and are electrically connected to the bit line array AX1 in the memory structure 200, and the conductive pillars 108 (second semiconductor region 108) correspond to and are electrically connected to the source line array formed in subsequent steps.

Thus, stacked memory cells 202 may be formed in the memory structure 200, as shown in FIG. 32A. Each memory cell 202 includes a gate electrode (e.g., a portion of a corresponding conductive line 72), a gate dielectric (e.g., a portion of a corresponding dielectric layer 90), a channel region (e.g., a portion of a corresponding channel material layer 92), and source/drain pillars (e.g., portions of corresponding conductive pillars 106 and 108). The isolation pillars 102 isolates adjacent memory cells 202 in a same column and at a same vertical level. The memory cells 202 may be disposed in an array of vertically stacked rows and columns.

As illustrated in FIG. 32A, in some embodiments, the formed memory structure 200 (or active array) includes a word line stack 58 having a first surface S1 and a second surface S2 opposite to the first surface S1. The conductive pillars 106 and 108 (first and second semiconductor regions) are alternately arranged along the first surface S1 of the word line stack 58 and spaced apart from one another in the first direction D1. Similarly, the conductive pillars 106 and 108 (first and second semiconductor regions) are alternately arranged along the second surface S2 of the word line stack 58, and spaced apart from one another in the first direction D1. In some embodiments, the conductive pillars 106 and 108 (first and second semiconductor regions) on the first surface S1 are arranged to be staggered widthwise in a second direction D2 from the conductive pillars 106 and 108 (first and second semiconductor regions) on the second surface D2, wherein the second direction D2 being perpendicular to the first direction D1. Furthermore, the bit line array AX1 disposed below the word line stack 58 may be connected to the conductive pillars 106 (first semiconductor regions) on the first surface S1 and the second surface S2 of the word line stack 58. For examples, the first set of vias BLV1 are connected to the conductive pillars 106 (first semiconductor regions) on the first surface S1 of the word line stack 58, while the second set of vias BLV2 are connected to the conductive pillars 106 (first semiconductor regions) on the second surface S2 of the word line stack 58.

As further illustrated in FIG. 32A, in some embodiments, the memory cells 202 may be stacked up to form first sets of stacked memory cells 202A and second sets of stacked memory cells 202B. In some embodiments, the first sets of stacked memory cells 202A are arranged along a first column CLM1 in an active array of the memory structure 200, and the second sets of stacked memory cells 202B are arranged along a second column CLM2 in an active array of the memory structure 200. The second column CLM2 being parallel to the first column CLM1. Each of the first sets of stacked memory cells 202A includes conductive pillars 106 and 108 (first and second conductive pillars), a dielectric pillar (e.g., dielectric materials 98A/98B) disposed in between the conductive pillar 106 and the conductive pillar 108, and channel material layers 92 located aside the dielectric pillar (98A/98B) and the conductive pillars 106 and 108. Similarly, each of the second sets of stacked memory 202B includes conductive pillars 106 and 108 (third and fourth conductive pillars), a dielectric pillar (e.g., dielectric materials 98A/98B) disposed in between the conductive pillar 106 and the conductive pillar 108, and channel material layers 92 located aside the dielectric pillar (98A/98B) and the conductive pillars 106 and 108. In some embodiments, the conductive pillars 106 and 108 (third and fourth conductive pillars) in the second sets of stacked memory cells 202B are misaligned with the conductive pillars 106 and 108 (first and second conductive pillars) in the first sets of stacked memory cells 202A.

Furthermore, in some embodiments, a word line stack 58 (including dielectric layers 52 and conductive lines 72) is arranged along a third column CLM3 in the active array between the first column CLM1 and the second column CLM2, and disposed in between the first sets of stacked memory cells 202A and the second sets of stacked memory cells 202B. In certain embodiments, the word line stack 58 is shared between the first sets of stacked memory cells 202A and the second sets of stacked memory cells 202B.

Figure 39A:
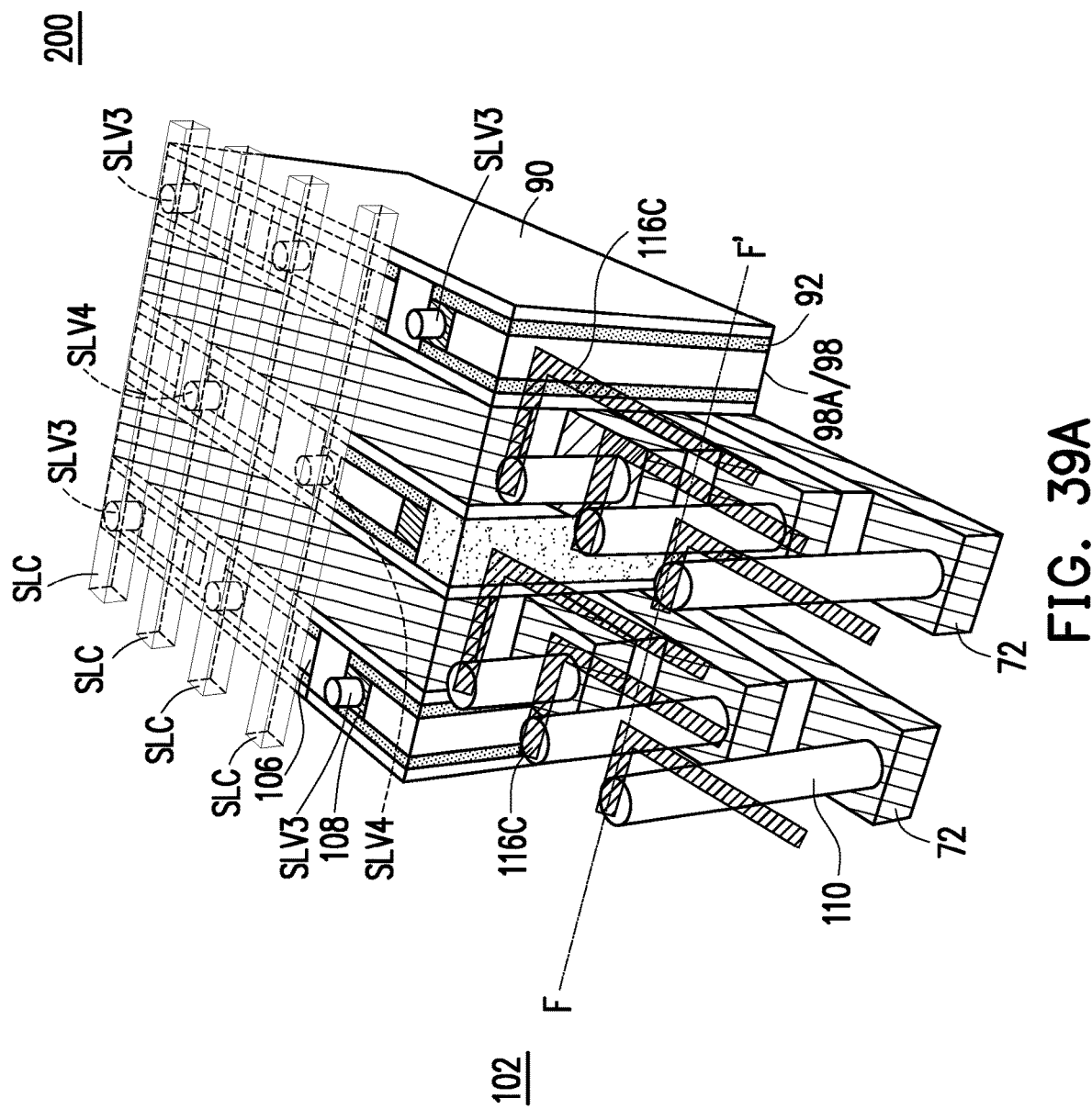
Figure 39B:
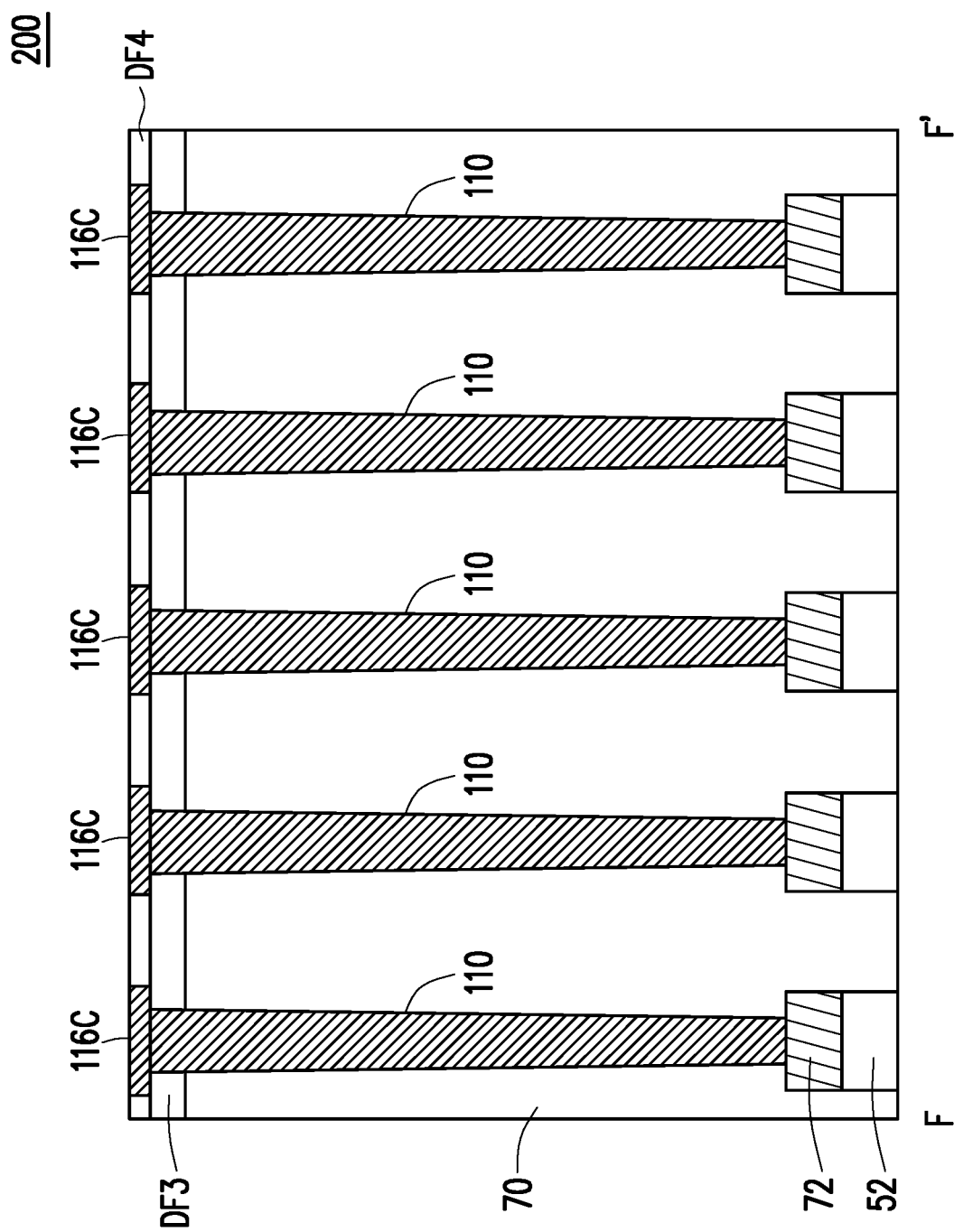
Figure 39C:
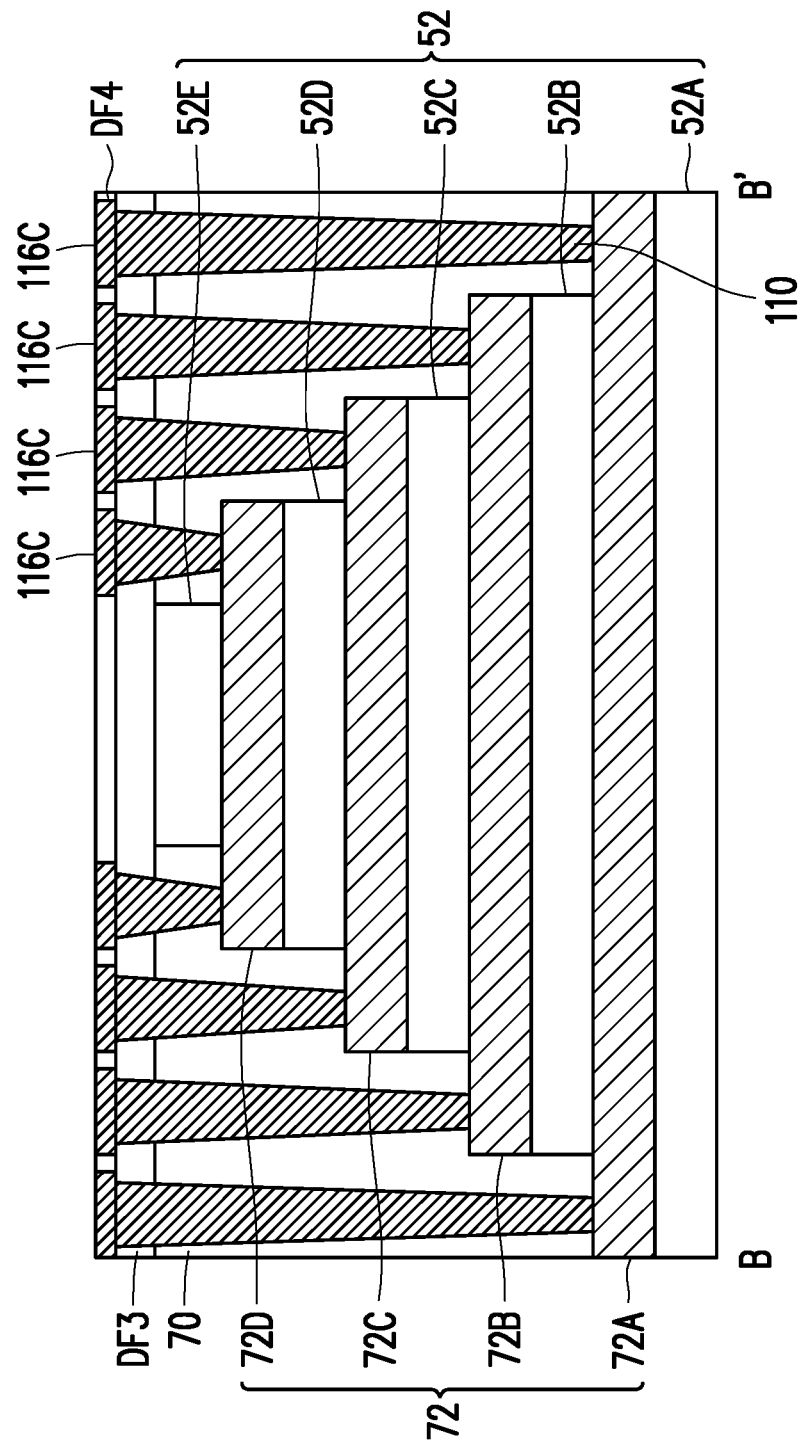

As illustrated in FIG. 33A to FIG. 39C, a source line array AX2 is formed on top surfaces of the multi-layer stack 58 (e.g., the dielectric layer 52E), the dielectric layer 90, the channel material layer 92, the conductive pillars 106, and the conductive pillars 108 and the IMD 70 (in the staircase region). FIG. 33A, FIG. 34, FIG. 35A, FIG. 36A, FIG. 37 and FIG. 38A illustrate cross-sectional views of the memory structure 200 along line E-E' of FIG. 1A. FIG. 33B, FIG. 35B, FIG. 36B, FIG. 38B illustrate top-down views of the memory structure 200 at various stages. FIG. 39A illustrates a perspective view of the memory structure 200; FIG. 39B illustrates a cross-sectional view of the memory structure 200 along line F-F' of FIG. 39A; FIG. 39C illustrates a cross-sectional view of the memory structure 200 along line B-B' of FIG. 1A.

Figure 33A:
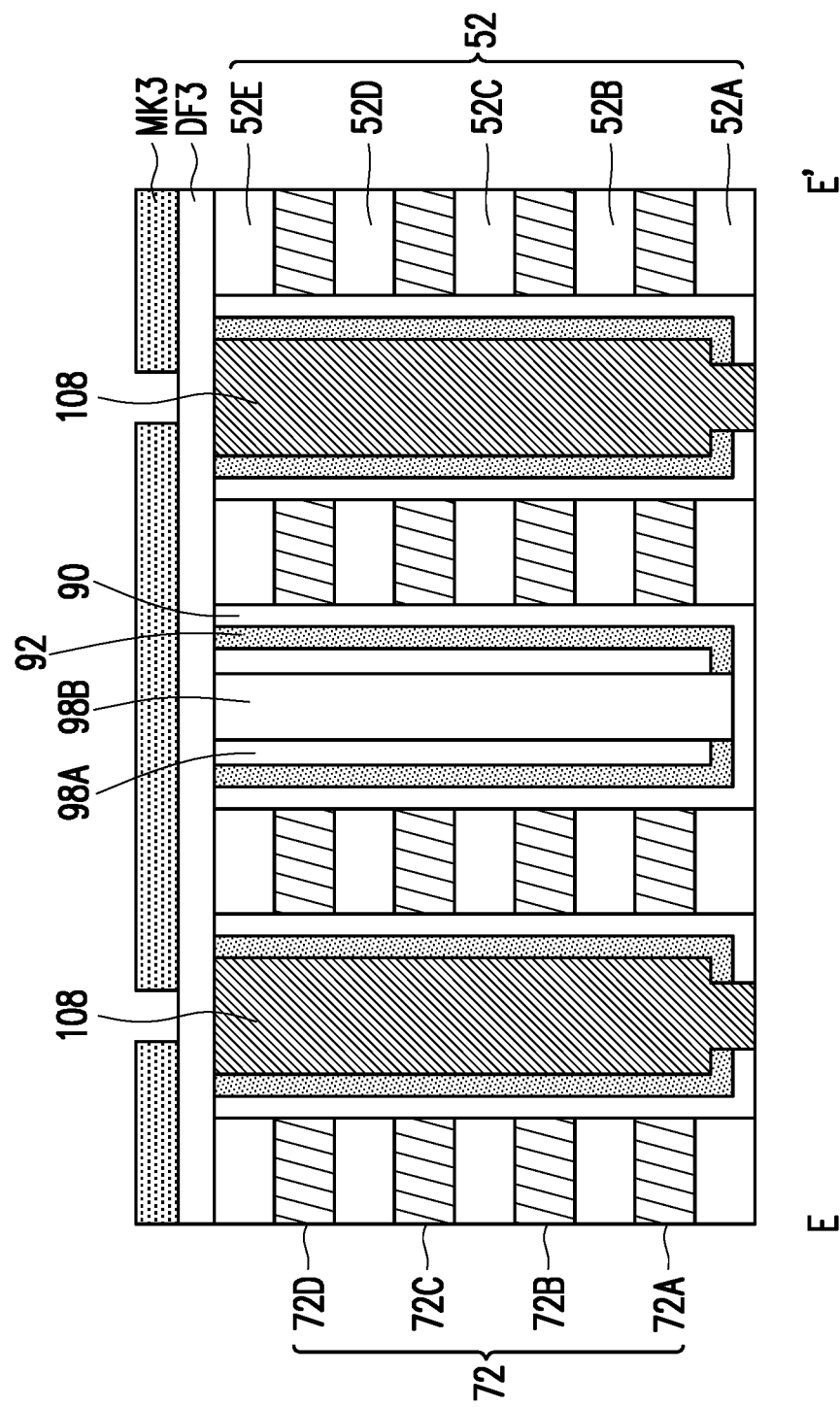
Figure 33B:
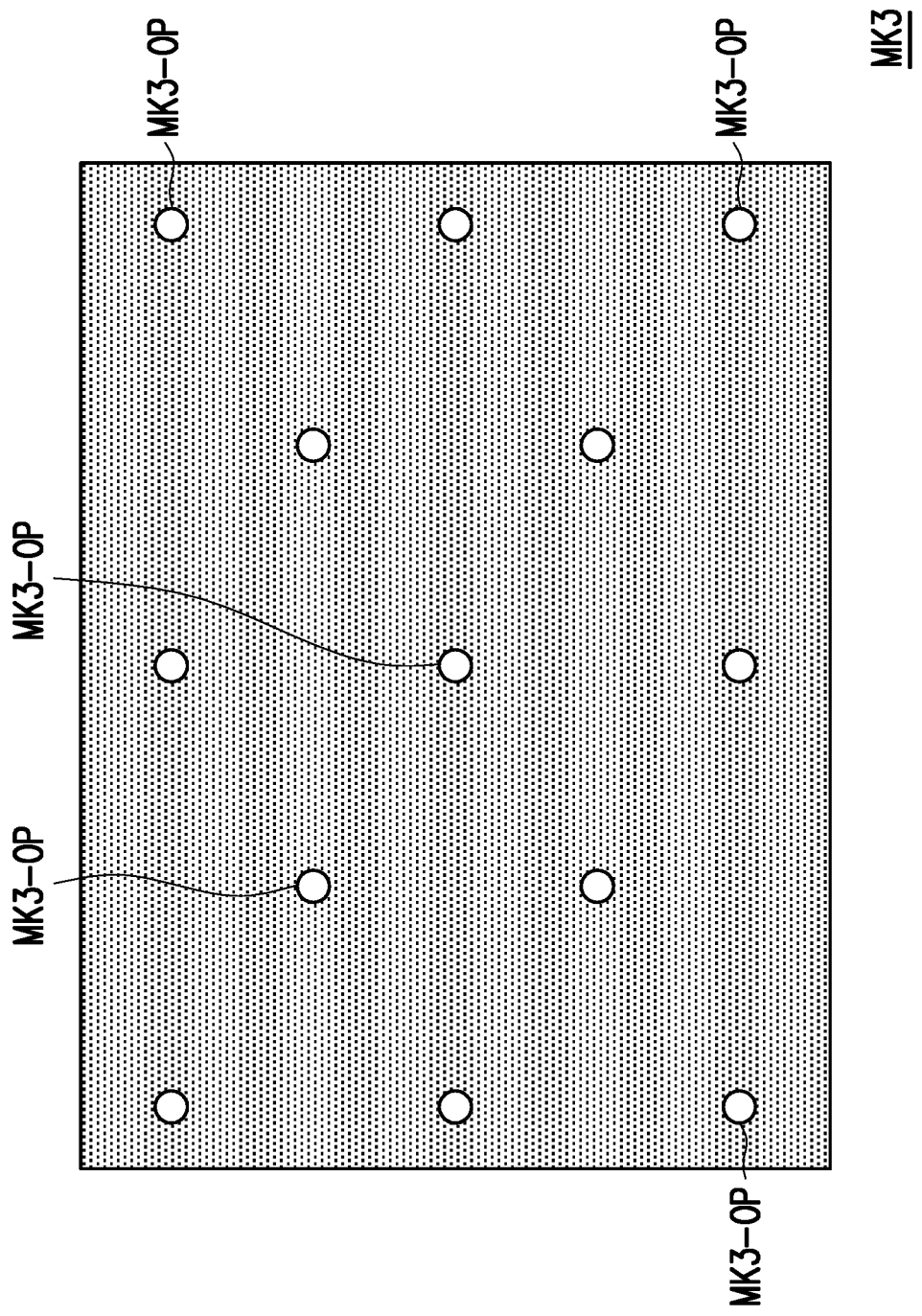

As illustrated in FIG. 33A, a third dielectric film DF3 is formed over the multi-layer stack 58 (word line stack) and over the conductive pillars 106 and 108. The third dielectric film DF3 may be deposited by any suitable method, such as CVD, PEVCD, FCVD, or the like. In some embodiments, the third dielectric film DF3 may be formed of materials such as phospho-silicate glass (PSG), boro-silicate glass (BSG), boron-doped phospho-silicate glass (BPSG), undoped silicate glass (USG), or the like. In some embodiments, the third dielectric film DF3 may include an oxide (e.g., silicon oxide or the like), a nitride (e.g., silicon nitride or the like), a combination thereof or the like. Other dielectric materials formed by any acceptable process may be used.

After forming the third dielectric film DF3, a third mask MK3 is formed thereon. For example, from a top view of the third mask MK3 illustrated in FIG. 33B, the third mask MK3 includes a plurality of via openings MK3-OP. The third mask MK3 is arranged on the third dielectric film DF3 so that the via openings MK3-OP reveals a portion of the third dielectric film DF3. In some embodiments, the third mask MK3 includes a positive photo-resist or a negative photo-resist.

Figure 34:
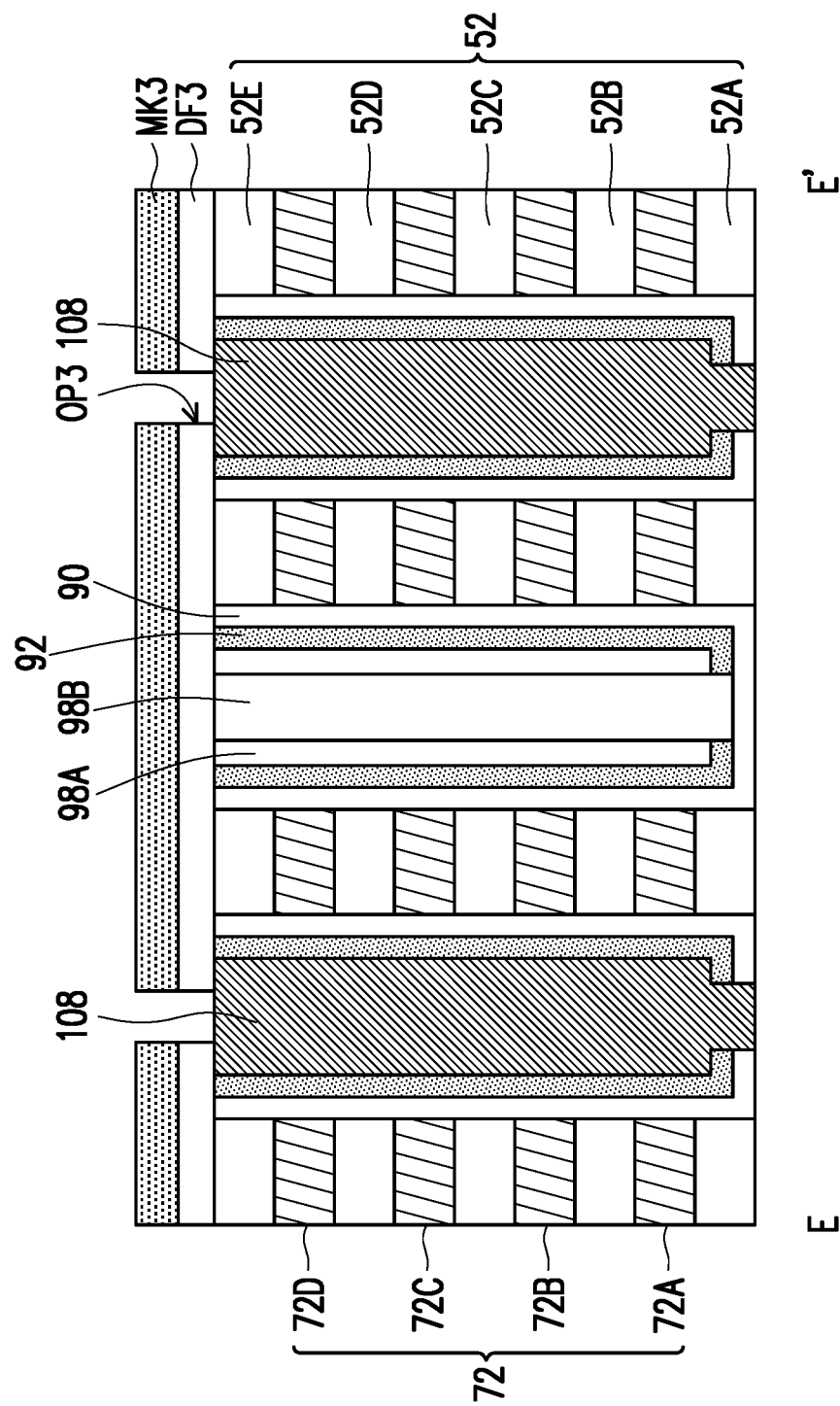

Referring to FIG. 34, in a subsequent step, the third dielectric film DF3 is patterned using the third mask MK3 to form third openings OP3 in the third dielectric film DF3. For example, portions of the third dielectric film DF3 not covered by the third mask MK3 are removed through acceptable etching process. Thereafter, referring to FIG. 35A and FIG. 35B, a third set of vias SLV3 and a fourth set of vias SLV4 (collectively referred as source line vias) are formed in the third openings OP3 to fill up the third openings OP3. In some embodiments, the third set of vias SLV3 and fourth set of vias SLV4 are electrically connected to and in physical contact with the conductive pillars 108 (the second semiconductor region). Furthermore, the third dielectric film DF3 (top dielectric film) is surrounding the third set of vias SLV3 and the fourth set of vias SLV4, and covering and contacting a top surface of the conductive pillars 106 (the first semiconductor region) in each of the first sets of stacked memory cells 202A and the second sets of stacked memory cells 202B.

Figure 35A:
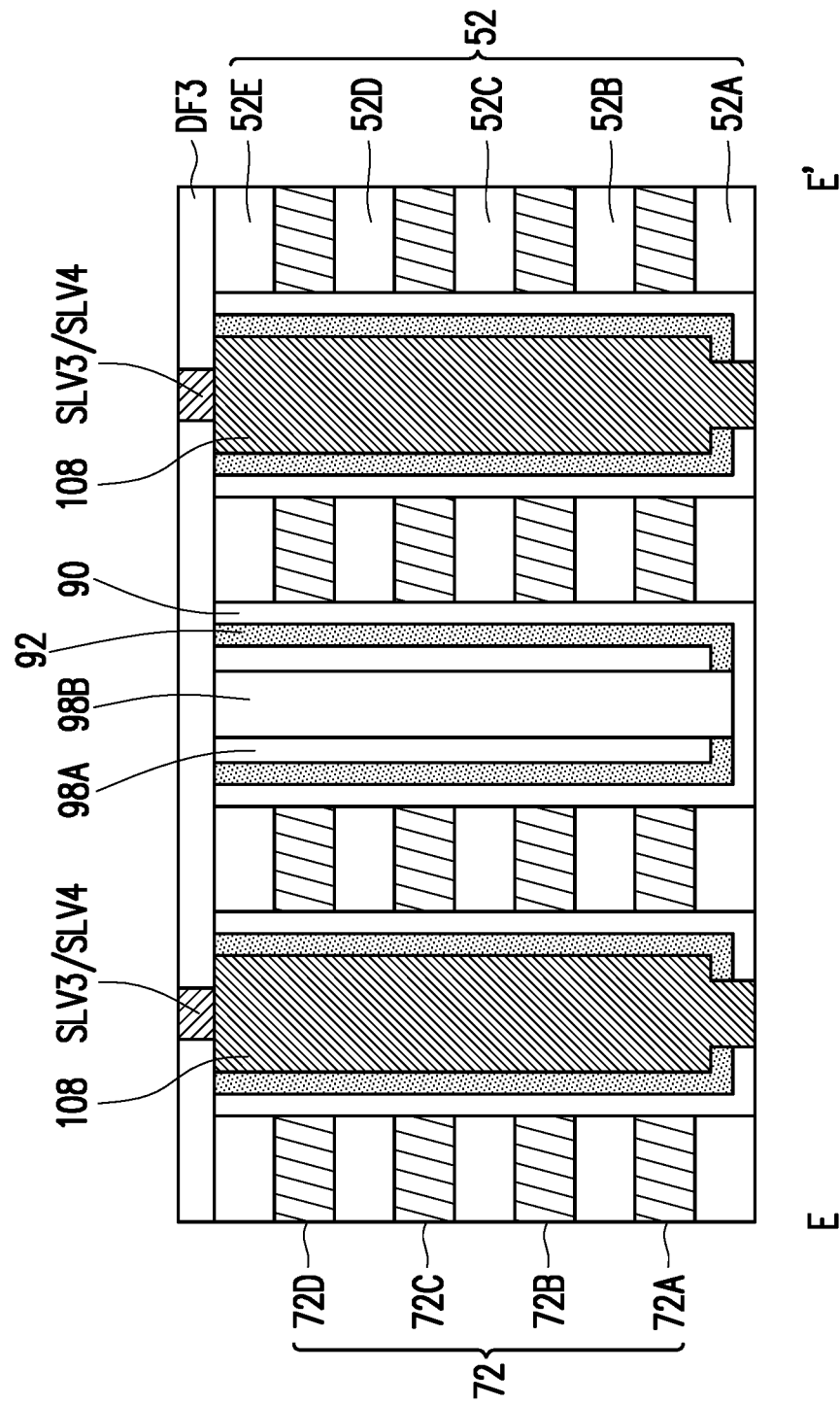
Figure 35B:
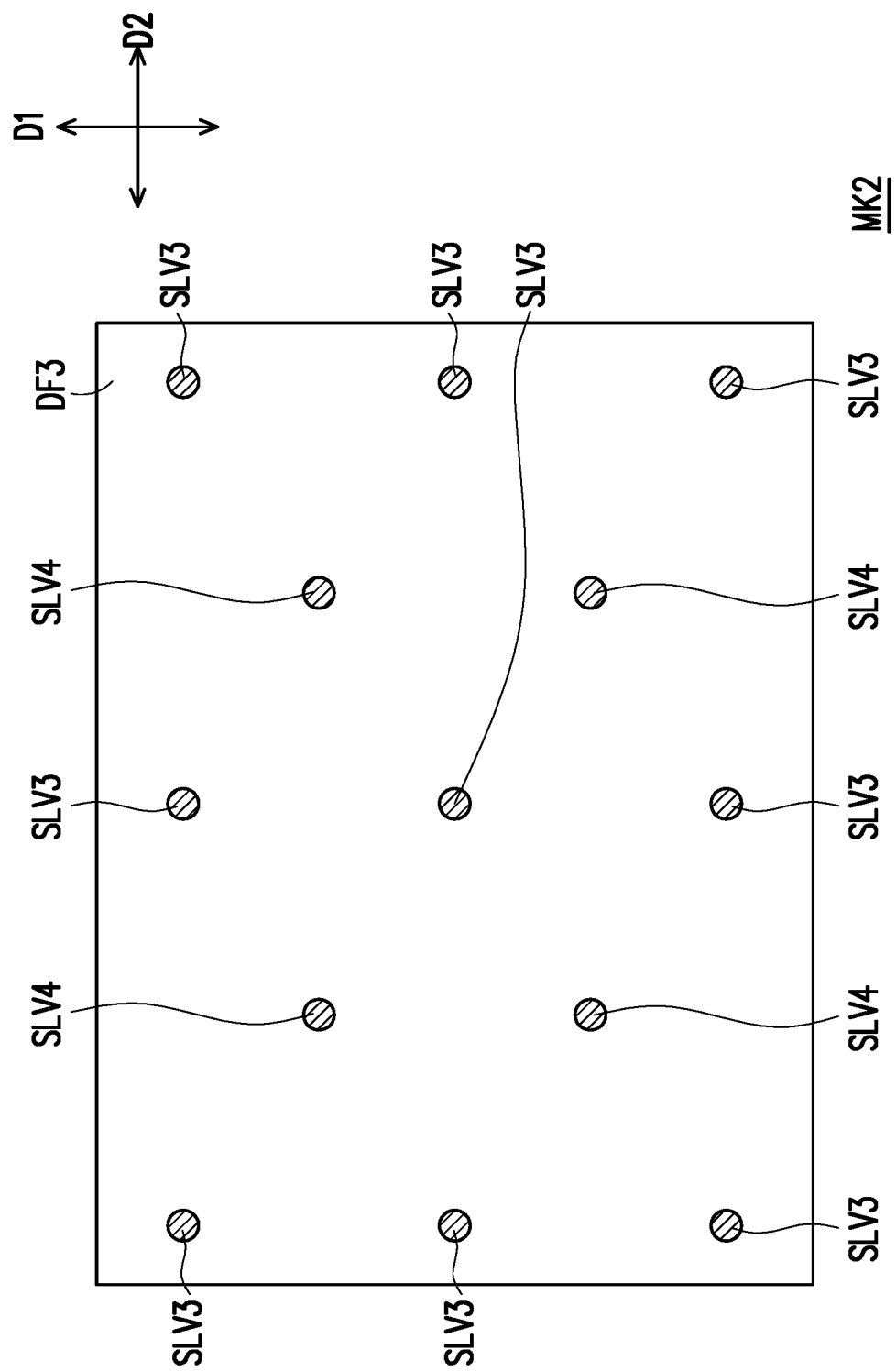

As further illustrated in FIG. 35B, the third set of vias SLV3 are arranged on the word line stack 58 and spaced apart from one another along the second direction D2. Furthermore, the third set of vias SLV3 may be arranged in columns and spaced apart from one another along the first direction D1. In a similar way, the fourth set of vias SLV4 are arranged on the word line stack 58 and spaced apart from one another along the second direction D2. Furthermore, the fourth set of vias SLV4 may be arranged in columns and spaced apart from one another along the first direction D1. In the illustrated embodiment, the third set of vias SLV3 are staggered widthwise in the second direction DL2 from the fourth set of vias SLV4. In other words, the third set of vias SLV3 and the fourth set of vias SLV4 do not overlap one another in the second direction D2, or the third set of vias SLV3 are misaligned with the fourth set of vias SLV4. In some embodiments, the third set of vias SLV3 are connected to the conductive pillars 108 (the second semiconductor regions) on the first surface S1 of the word line stack 58 (as defined in FIG. 32A), and non-overlapped with the first set of vias BLV1 and the second set of vias BLV2 in a build-up direction of the memory structure 200. Similarly, the fourth set of vias SLV4 are connected to the conductive pillars 108 (the second semiconductor regions) on the second surface of the word line stack 58, and non-overlapped with the first set of vias BLV1 and the second set of vias BLV2 in the build-up direction of the memory structure 200.

Figure 36A:
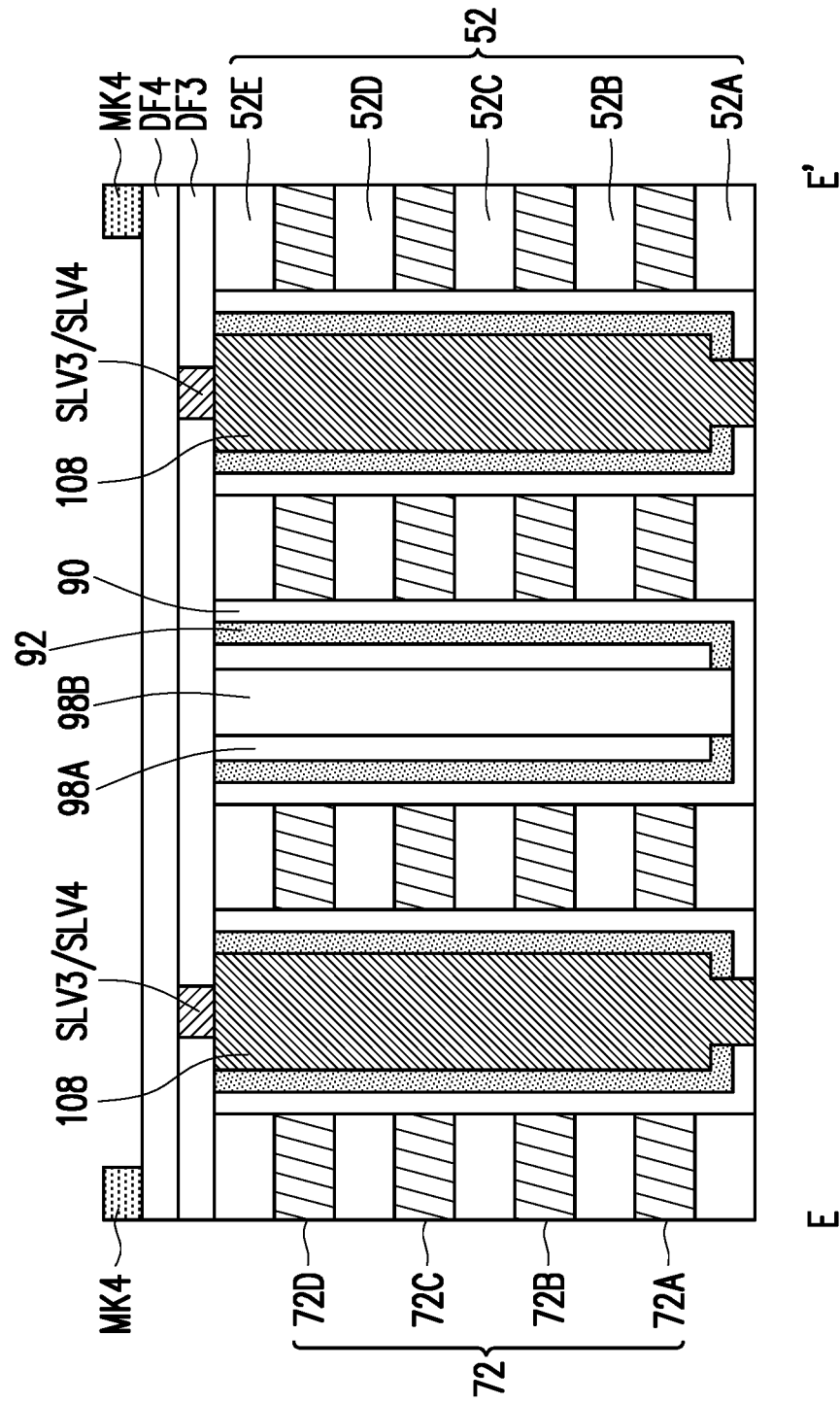
Figure 36B:
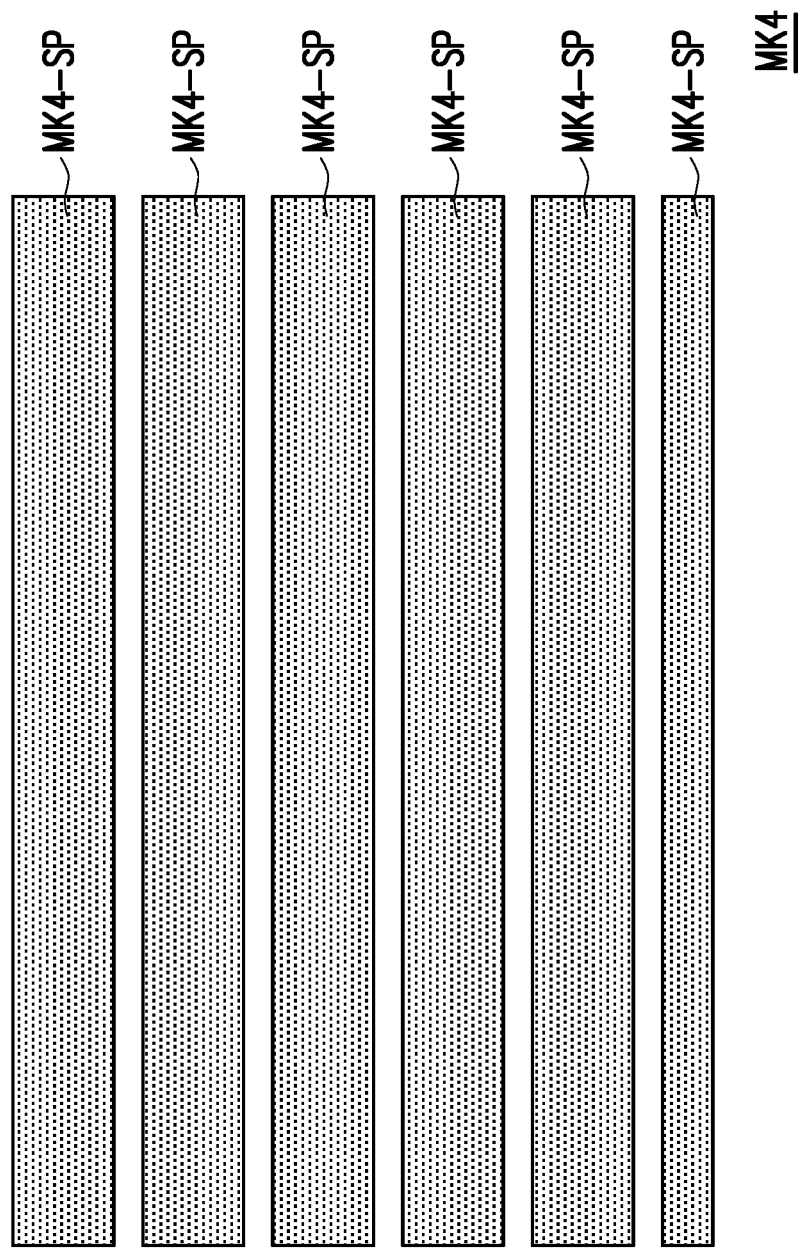

Referring to FIG. 36A, after forming the third set of vias SLV3 and the fourth set of vias SLV4, a fourth dielectric film DF4 is formed over the third dielectric film DF3 and over the third set of vias SLV3 and the fourth set of vias SLV4. The fourth dielectric film DF4 may be deposited by any suitable method, such as CVD, PEVCD, FCVD, or the like. In some embodiments, the fourth dielectric film DF4 may be formed of materials such as phospho-silicate glass (PSG), boro-silicate glass (BSG), boron-doped phospho-silicate glass (BPSG), undoped silicate glass (USG), or the like. In some embodiments, the fourth dielectric film DF4 may include an oxide (e.g., silicon oxide or the like), a nitride (e.g., silicon nitride or the like), a combination thereof or the like. Other dielectric materials formed by any acceptable process may be used.

After forming the fourth dielectric film DF4, a fourth mask MK4 is formed thereon. For example, from a top view of the fourth mask MK4 illustrated in FIG. 36B, the fourth mask MK4 includes a plurality of stripe patterns MK4-SP spaced apart from one another. The stripe patterns MK4-SP are arranged on the fourth dielectric film DF4 so that a portion of the fourth dielectric film DF4 is revealed or exposed. In some alternative embodiments, the fourth mask MK4 include other patterns, which may be adjusted based on the routing designs of the source line array AX2. In some embodiments, the fourth mask MK1 includes a positive photo-resist or a negative photo-resist.

Figure 37:
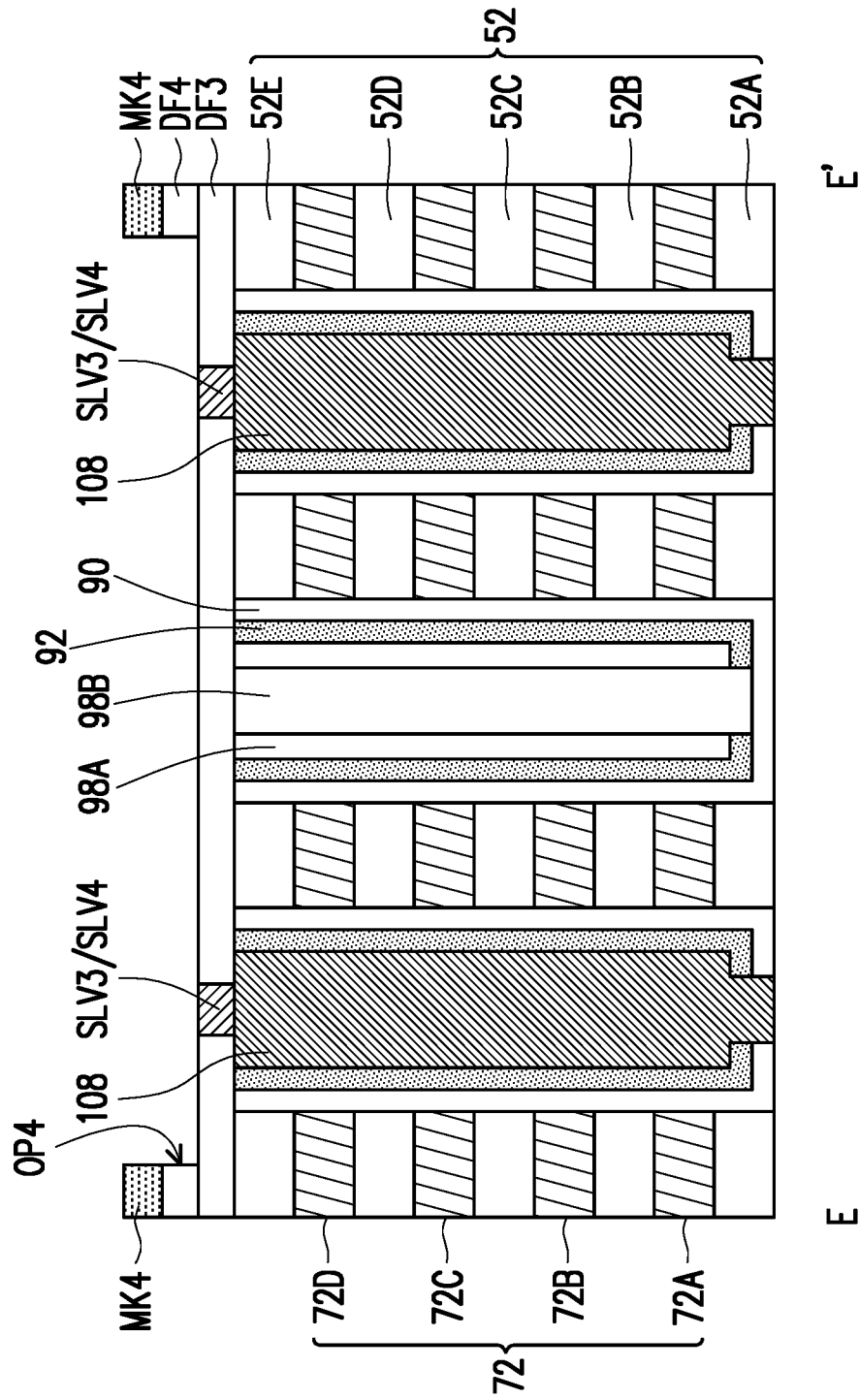
Figure 38A:
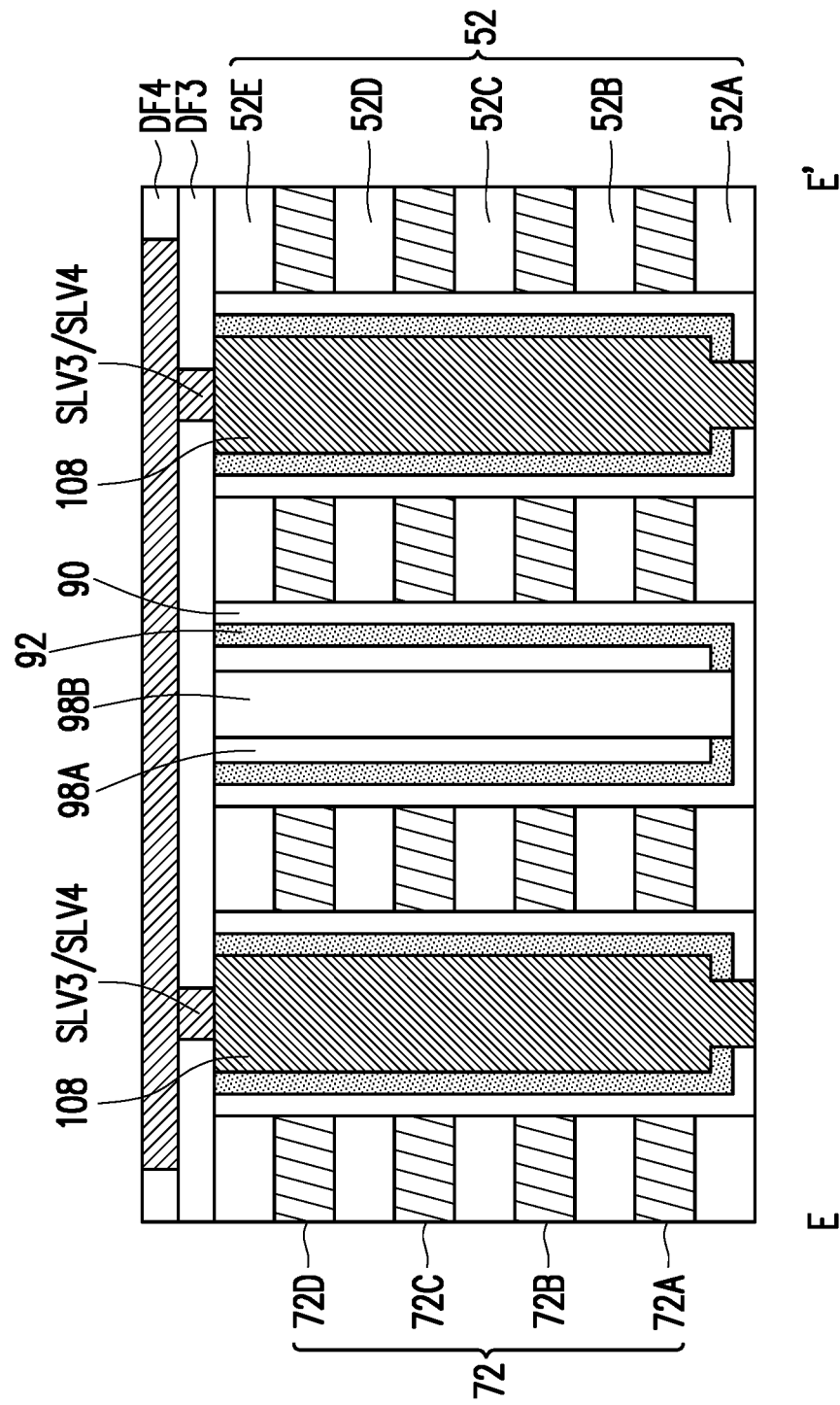

Referring to FIG. 37, in a subsequent step, the fourth dielectric film DF4 is patterned using the first mask MK1 to form fourth openings OP4 in the fourth dielectric film DF4. For example, portions of the fourth dielectric film DF4 not covered by the fourth mask MK4 are removed through acceptable etching process. Thereafter, referring to FIG. 38A and FIG. 38B, a plurality of source line conductive layers SLC is formed in the fourth openings OP4 to fill up the fourth openings OP4. For example, the source line conductive layers SLC are formed to be parallel to one another (FIG. 38B), but the disclosure is not limited thereto. In some embodiments, after the source line conductive layers SLC are deposited, a planarization process, such as a chemical mechanical polish (CMP), an etch-back process, combinations thereof, or the like may be performed. The planarization process is performed so that top surfaces of the source line conductive layers SLC are planar with a top surface of the fourth dielectric film DF4. Up to here, a source line array AX2 is formed over the multi-layer stack 58 (or word line stack) and on the conductive pillars 106 and 108 (first and second semiconductor regions 106 and 108).

Referring to FIG. 39A to FIG. 39C, in the staircase region, conductive contacts 110 are made on the conductive lines 72, whereby the conductive contacts 110 are further connected to the conductive lines 116C. In some embodiments, the staircase shape of the conductive lines 72 may provide a surface on each of the conductive lines 72 for the conductive contacts 110 to land on. For example, as shown in FIG. 39B and FIG. 39C, the conductive contacts 110 may extend through the third dielectric film DF3 and the IMD 70 to electrically connect conductive lines 116C to the conductive lines 72 and the underlying active devices on the substrate.

In some embodiments, forming the contacts 110 may include patterning openings in the third dielectric film DF3 and IMD 70 to expose portions of the conductive lines 72 using a combination of photolithography and etching, for example. A liner (not shown), such as a diffusion barrier layer, an adhesion layer, or the like, and a conductive material are formed in the openings. The liner may include titanium, titanium nitride, tantalum, tantalum nitride, or the like. The conductive material may include copper, a copper alloy, silver, gold, tungsten, cobalt, aluminum, nickel, or the like. A planarization process, such as a CMP, may be performed to remove excess material from the surface of the third dielectric film DF3. The remaining liner and conductive material form the contacts 110 in the openings. The conductive line 116C may connect the memory structure to an underlying/overlying circuitry (e.g., control circuitry) and/or signal, power, and ground lines in the semiconductor die. Other conductive contacts or vias may be formed through the third dielectric film DF3 and the fourth dielectric film of the source line array AX2 to electrically connect the source line array AX2 to the underlying active devices on the substrate. In alternate embodiments, routing and/or power lines to and from the memory structure may be provided by an interconnect structure formed over the memory structure 200 in addition to or in lieu of the interconnect structure 320 (FIG. 2). Accordingly, the memory structure 200 may be completed.

Figure 40:
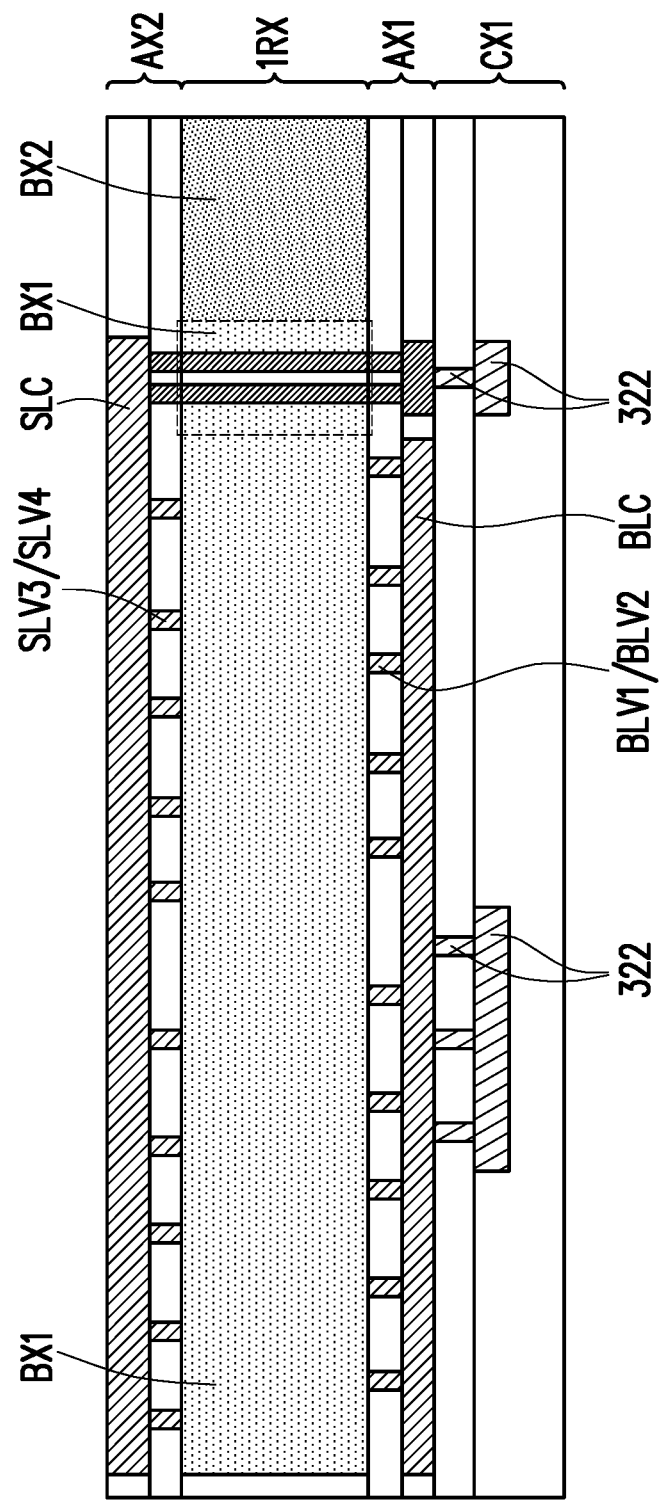

FIG. 40 is a simplified sectional view of the memory structure 200 according to some exemplary embodiments of the present disclosure. As illustrated in FIG. 40, the memory structure 200 includes an intermediate region 1RX having an active array BX1 (or memory array) and a dummy array BX2. For example, the active array BX1 includes the multi-layer stack 58 (or word line stack), the first sets of stacked memory cells 202A and the second sets of stacked memory cells 202B as illustrated in FIG. 32A. The active array BX1 is electrically connected to the bit line array AX1 below and connected to the source line array AX2 above. In some embodiments, the dummy array BX2 includes the same structure made from the same fabrication process as with the structure of the active array BX1. However, the dummy array BX2 is electrically floating. That is, the dummy array BX2 is not connected to the bit line array AX1 below and the source line array AX2 above.

As further illustrated in FIG. 40, both of the bit line array AX1 and the source line array AX2 are electrically connected to the CMOS circuitry CX1 shown in FIG. 2. For example, the bit line array AX1 is directly connected to the conductive features 322 of the interconnect structure 320. Furthermore, the source line array AX2 is electrically connected to the CMOS circuitry CX1 through vias or connection structures that passes through a periphery (dielectrics or polymers) of the active array BX1, and through vias or connection structures that passes through the bit line array AX1. In other words, the vias or connections of the bit line array AX1 and the source line array AX2 will not extend to a region overlapping the dummy array BX2.

In the above-mentioned embodiments, the memory structure includes a bit line array disposed below the word line stack, and a source line array disposed above the word line stack. The conductive pillars (first and second semiconductor regions) located on two opposing surfaces of the word line stack are designed to be staggered from one another. As such, when the connections of the bit line array and the connections of the source line array are made to contact the conductive pillars (first and second semiconductor regions), the routing/connections of the source line array and the bit line array becomes relatively simplified. For example, the number of photomasks required to form the conductive layers of the bit line array and the source line array is reduced. Overall, a simplified process flow may be achieved, and the fabrication cost may be further reduced.

In accordance with some embodiments of the present disclosure, a memory structure includes a word line stack, first semiconductor regions and second semiconductor regions, a bit line array and a source line array. The word line stack has a first surface and a second surface opposite to the first surface. The first semiconductor regions and second semiconductor regions are alternately arranged along the first surface of the word line stack and spaced apart from one another in a first direction, and are alternately arranged along the second surface of the word line stack and spaced apart from one another in the first direction, wherein the first semiconductor regions and second semiconductor regions on the first surface are arranged to be staggered widthwise in a second direction from the first semiconductor regions and second semiconductor regions on the second surface, and the second direction being perpendicular to the first direction. The bit line array is disposed below the word line stack and connected to the first semiconductor regions on the first surface and the second surface of the word line stack. The source line array is disposed above the word line stack and connected to the second semiconductor regions on the first surface and the second surface of the word line stack.

In accordance with some other embodiments of the present disclosure, a memory structure includes first sets of stacked memory cells, second sets of stacked memory cells and a word line stack. The first sets of stacked memory cells are arranged along a first column in an active array of the memory structure. Each of the first sets of stacked memory cells includes a first conductive pillar and a second conductive pillar, a dielectric pillar and channel material layers. The dielectric pillar is disposed in between the first conductive pillar and the second conductive pillar. The channel material layers are located aside the first conductive pillar, the second conductive pillar and the dielectric pillar. The second sets of stacked memory cells are arranged along a second column in the active array of the memory structure. The second column is parallel to the first column. Each of the second sets of stacked memory cells includes, a third conductive pillar and a fourth conductive pillar, a second dielectric pillar and second channel materials. The third conductive pillar and the fourth conductive pillar are misaligned with the first conductive pillar and the second conductive pillar in the first sets of stacked memory cells. The second dielectric pillar disposed in between the third conductive pillar and the fourth conductive pillar. The second channel materials are located aside the third conductive pillar, the fourth conductive pillar and the second dielectric pillar. The word line stack is arranged along a third column in the active array between the first column and the second column, and disposed in between the first sets of stacked memory cells and the second sets of stacked memory cell.

In accordance with some embodiments of the present disclosure, a method of fabricating a memory structure is described. The method includes the following steps. A CMOS circuitry is formed over a semiconductor substrate. A bit line array is formed to be electrically connected to the CMOS circuitry. A memory array is formed over the bit line array, wherein the memory array is formed by forming a word line stack, and forming first and second sets of stacked memory cells. The word line stack is formed on the bit line array, wherein the word line stack has a first side surface and a second side surface opposite to the first side surface. The first sets of sacked memory cells are formed along the first side surface. The second sets of stacked memory cells are formed along the second side surface, wherein the second sets of stacked memory cells are staggered from the first sets of stacked memory cells. A source line array is formed over the memory array, wherein the source line array is electrically connected to the CMOS circuitry through connection structures passing through the bit line array.

In accordance with some other embodiments of the present disclosure, a method of fabricating a memory structure is described. The method includes the following steps. A bit line array is formed over a substrate. The bit line array is formed by the following steps. A first dielectric film is formed over the substrate, wherein the first dielectric film includes first openings. Bit line conductive layers are formed in the first openings. A second dielectric film is formed over the first dielectric film and over the bit line conductive layers, wherein the second dielectric film includes second openings. A first set of vias and a second set of vias are formed in the second openings, wherein the first set of vias and the second set of vias are staggered from one another. A plurality of memory cells is formed on the bit line array, wherein the plurality of memory cells comprises first electrode layers and second electrode layers, and the first electrode layers are electrically connected to the bit line array. A source line array is formed over the plurality of memory cells, wherein the source line array is electrically connected to the second electrode layers.

In accordance with yet another embodiment of the present disclosure, a method including the following steps is described. A substrate is provided. A first dielectric film is formed over the substrate, and the first dielectric film is patterned using a first mask. Bit line conductive layers are formed in first openings defined by the first mask. A second dielectric film is formed over the first dielectric film, and the second dielectric film is patterned using a second mask. Bit line vias are formed in second openings defined by the second mask, wherein the bit line vias have a staggered arrangement. A memory array is formed on the second dielectric film and electrically connected to the bit line vias. A third dielectric film is formed on the memory array, and the third dielectric film is patterned using a third mask. Source line vias are formed in third openings defined by the third mask, wherein the source line vias have a staggered arrangement and are electrically connected to the memory array.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a memory structure, comprising:
   forming a CMOS (complementary metal-oxide semiconductor) circuitry over a semiconductor substrate;
   forming a bit line array electrically connected to the CMOS circuitry;
   forming a memory array over the bit line array in a memory region, wherein the memory region has a center section and a peripheral section;
   forming a dummy array aside the peripheral section of the memory region in a dummy region, wherein forming the memory array and the dummy array comprises:
      forming a word line stack in a center section of the memory region on the bit line array and in a dummy region aside the memory region, wherein the word line stack has a first side surface and a second side surface opposite to the first side surface;
      forming first sets of stacked memory cells in the memory region and in the dummy region along the first side surface; and
      forming second sets of stacked memory cells in the memory region and in the dummy region along the second side surface, wherein the second sets of stacked memory cells are staggered from the first sets of stacked memory cells; and
   forming a source line array over the memory array and electrically connected to the memory array, wherein the source line array is electrically connected to the CMOS circuitry through connection structures passing through the peripheral section of the memory region and the bit line array, and wherein the connection structures are sandwiched in between the word line stack in the center section of the memory region and the word line stack in the dummy region.

2. The method according to claim 1, wherein each of the first sets of stacked memory cells and each of the second sets of stacked memory cells are formed with first semiconductor regions and second semiconductor regions, the first semiconductor regions are electrically connected to the bit line array, and the second semiconductor regions are electrically connected to the source line array.

3. The method according to claim 2, further comprising forming isolation pillars in between the first semiconductor regions and the second semiconductor regions, wherein the isolation pillars have a staggered arrangement in the memory array.

4. The method according to claim 1, wherein forming the bit line array comprises:
- forming a first dielectric film over the CMOS circuitry;
- patterning the first dielectric film using a first mask to form first openings in the first dielectric film;
- forming a plurality of bit line conductive layers in the first openings, wherein the plurality of bit line conductive layers is parallel to one another;
- forming a second dielectric film over the first dielectric film and over the plurality of bit line conductive layers;
- patterning the second dielectric film using a second mask to form second openings in the second dielectric film; and
- forming a first set of vias and a second set of vias in the second openings and connected to the plurality of bit line conductive layers, wherein the first set of vias are staggered from the second set of vias.

5. The method according to claim 4, wherein forming the source line array comprises:
- forming a third dielectric film over the memory array;
- patterning the third dielectric film using a third mask to form third openings in the third dielectric film;
- forming a third set of vias and a fourth set of vias in the third opening, wherein the third set of vias are staggered from the fourth set of via;
- forming a fourth dielectric film over the third dielectric film;
- patterning the fourth dielectric film using a fourth mask to form fourth openings in the fourth dielectric film; and
- forming a plurality of source line conductive layers in the fourth opening and connected to the third set of vias and the fourth set of vias, wherein each of the plurality of source line conductive layers are parallel to one another.

6. The method according to claim 5, wherein the third set of vias and the fourth set of vias are non-overlapped with the first set of vias and the second set of vias.

7. The method according to claim 1, wherein the dummy array is electrically floating.

8. The method according to claim 1, wherein the bit line array and the source line array are non-overlapped with the dummy array in the dummy region.

9. A method of forming a memory structure, comprising:
- forming a CMOS (complementary metal-oxide semiconductor) circuitry over a substrate;
- forming a bit line array over the substrate and electrically connected to the CMOS circuitry, wherein forming the bit line array comprises:
  - forming a first dielectric film over the substrate, wherein the first dielectric film includes first openings;
  - forming bit line conductive layers in the first openings;
  - forming a second dielectric film over the first dielectric film and over the bit line conductive layers, wherein the second dielectric film includes second openings; and
  - forming a first set of vias and a second set of vias in the second openings, wherein the first set of vias and the second set of vias are staggered from one another;
- forming a plurality of memory cells in a memory region on the bit line array, and aside a peripheral section of the memory region in a dummy region, wherein the plurality of memory cells comprises first electrode layers and second electrode layers, and the first electrode layers of the plurality of memory cells in the memory region are electrically connected to the bit line array; and
- forming a source line array over the plurality of memory cells in the memory region, wherein the source line array is electrically connected to the second electrode layers, wherein the source line array is electrically connected to the CMOS circuitry through connection structures passing through the peripheral section of the memory region and the bit line array, and wherein the connection structures are sandwiched in between a word line stack in a center section of the memory region and a word line stack in the dummy region.

10. The method according to claim 9, wherein forming the source line array comprises:
- forming a third dielectric film over the plurality of memory cells, wherein the third dielectric film include third openings;
- forming a third set of vias and a fourth set of vias in the third openings, wherein the third set of vias and the fourth set of vias are staggered from one another, and are electrically connected to the second electrode layers;
- forming a fourth dielectric film over the third dielectric film, wherein the fourth dielectric film include fourth openings; and
- forming source line conductive layers in the fourth openings.

11. The method according to claim 10, wherein the formation of the bit line array is completed by using two masks, and the formation of the source line array is completed by using two masks.

12. The method according to claim 10, wherein the third set of vias and the fourth set of vias are non-overlapped with the first set of vias and the second set of vias.

13. The method according to claim 9, wherein forming the plurality of memory cells comprises:
- forming first sets of stacked memory cells including the first electrode layers and the second electrode layers, wherein the first sets of stacked memory cells are arranged along a first column; and
- forming second sets of stacked memory cells including the first electrode layers and the second electrode layers, wherein the second sets of stacked memory cells are arranged along a second column adjacent to the first column, and the first sets of stacked memory cells are staggered from the second sets of stacked memory cells.

14. The method according to claim 13, wherein forming the plurality of memory cells further comprises forming isolation pillars in between the first electrode layers and the second electrode layers of each of the first sets of stacked memory cells and each of the second sets of stacked memory cells.

15. A method, comprising:
- providing a substrate;
- forming a CMOS (complementary metal-oxide semiconductor) circuitry over the substrate;
- forming a bit line array connected to the CMOS circuitry, wherein forming the bit line array comprises:
  - forming a first dielectric film over the substrate, and patterning the first dielectric film using a first mask;
  - forming bit line conductive layers in first openings defined by the first mask;
  - forming a second dielectric film over the first dielectric film, and patterning the second dielectric film using a second mask;
  - forming bit line vias in second openings defined by the second mask, wherein the bit line vias have a staggered arrangement;

forming a memory array on the second dielectric film and electrically connected to the bit line vias in a memory region, wherein the memory region has a center section and a peripheral section;

forming a dummy array aside the peripheral section of the memory region in a dummy region;

forming a source line array over the memory array and electrically connected to the memory array, wherein forming the source line array comprises:
  forming a third dielectric film on the memory array, and patterning the third dielectric film using a third mask; and
  forming source line vias in third openings defined by the third mask, wherein the source line vias have a staggered arrangement and are electrically connected to the memory array, and
  wherein the source line array is electrically connected to the CMOS circuitry through connection structures passing through the peripheral section of the memory region and the bit line array, and wherein the connection structures are sandwiched in between a word line stack of the memory array in the center section of the memory region and a word line stack of the dummy array in the dummy region.

16. The method according to claim 15, wherein forming the source line array further comprises:
  forming a fourth dielectric film over the third dielectric film, and patterning the fourth dielectric film using a fourth mask; and
  forming source line conducive layers in fourth openings defined by the fourth mask.

17. The method according to claim 15, wherein the bit line vias are non-overlapped with the source line vias.

18. The method according to claim 15, wherein forming the memory array comprises:
  forming the word line stack on the second dielectric film, wherein the word line stack has a first side surface and a second side surface opposite to the first side surface; and
  forming source/drain regions on the first side surface and the second side surface, wherein the source/drain regions on the first side surface are staggered from the source/drain regions on the second side surface.

19. The method according to claim 18, further comprising:
  forming channel material layers on the first side surface and the second side surface prior to forming the source/drain regions;
  forming dielectric materials on the channel material layers, and patterning the dielectric materials to form dielectric pillars; and
  wherein the source/drain regions are formed on two sides of the dielectric pillars.

20. The method according to claim 15, further comprising:
  forming an interconnect structure on the substrate prior to forming the first dielectric film, wherein the bit line conductive layers, the bit line vias and the source line vias are electrically connected to the interconnect structure.

* * * * *